(12) United States Patent
Kimoto

(10) Patent No.: US 7,432,727 B2
(45) Date of Patent: Oct. 7, 2008

(54) ELECTRIC SIGNAL CONNECTING DEVICE AND PROBE ASSEMBLY AND PROBING DEVICE USING THE SAME

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 106 days.

(21) Appl. No.: 11/080,601

(22) Filed: Mar. 15, 2005

(65) Prior Publication Data

US 2005/0253607 A1 Nov. 17, 2005

(30) Foreign Application Priority Data

Mar. 16, 2004 (JP) ............................. 2004-117371

(51) Int. Cl.
*G01R 31/02* (2006.01)
(52) U.S. Cl. ..................................... 324/754
(58) Field of Classification Search .................. None
See application file for complete search history.

(56) References Cited

U.S. PATENT DOCUMENTS

| 3,611,128 | A |   | 10/1971 | Nagata |   |
|---|---|---|---|---|---|
| 4,116,523 | A |   | 9/1978 | Coberly et al. |   |
| 5,599,194 | A |   | 2/1997 | Ozawa et al. |   |
| 6,034,534 | A |   | 3/2000 | Kiyota |   |
| 6,184,699 | B1 |   | 2/2001 | Smith et al. |   |
| 6,271,674 | B1 |   | 8/2001 | Hasegawa et al. |   |
| 6,326,688 | B1 | * | 12/2001 | Ochiai | 257/731 |
| 6,330,744 | B1 | * | 12/2001 | Doherty et al. | 29/825 |
| 6,489,795 | B1 | * | 12/2002 | Klele et al. | 324/762 |
| 6,586,955 | B2 | * | 7/2003 | Fjelstad et al. | 324/754 |
| 6,642,731 | B2 | * | 11/2003 | Masuda | 324/757 |
| 6,657,448 | B2 | * | 12/2003 | Hasegawa | 324/762 |
| 6,674,298 | B2 | * | 1/2004 | Felici et al. | 324/762 |
| 6,690,186 | B2 | * | 2/2004 | Fjelstad | 324/762 |
| 6,864,695 | B2 | * | 3/2005 | Kohno et al. | 324/754 |

(Continued)

FOREIGN PATENT DOCUMENTS

EP 0802419 A2 10/1997

OTHER PUBLICATIONS

Faure, "Modular Probe", IBM Technical Disclosure Bulletin, Nov. 1974, vol. 17, No. 6, p. 1634.

(Continued)

*Primary Examiner*—Ha Nguyen
*Assistant Examiner*—Richard Isla-Rodas
(74) *Attorney, Agent, or Firm*—Haynes and Boone, LLP

(57) ABSTRACT

The present invention is for enabling to carry out probing tests en bloc at the same time on electronic devices and semiconductor chips having high-density terminals. For this purpose, the electric signal connecting device includes vertical probes for getting into contact with terminals for electric connection created on electric functional elements to be tested for electric connection, and a resin film supporting the vertical probes, and the vertical probes are planted resiliently deformably in a surface of a resin film in a direction along the film surface, and an end of the vertical probes is brought into contact with terminals of electric functional elements to be tested and another end of the vertical probes is brought into contact with terminals of an electric function testing apparatus so that signals may be transmitted and received between the electric functional elements to be tested and the electric function testing apparatus.

12 Claims, 57 Drawing Sheets

U.S. PATENT DOCUMENTS

| | | |
|---|---|---|
| 7,148,709 B2 * | 12/2006 | Kister ........................ 324/754 |
| 2003/0067315 A1 * | 4/2003 | Kimoto ....................... 324/754 |
| 2005/0253607 A1 | 11/2005 | Kimoto |
| 2007/0063718 A1 * | 3/2007 | Kimoto ....................... 324/754 |
| 2007/0126444 A1 * | 6/2007 | Hosaka et al. .............. 324/754 |
| 2007/0200578 A1 | 8/2007 | Kimoto |
| 2007/0216433 A1 | 9/2007 | Miura et al. |

OTHER PUBLICATIONS

European Search Report issued Mar. 29, 2007 in Application No. EP 05 25 5613.

Paresh H. Patel, Office Action mailed Mar. 31, 2008, 14 pages, in U.S. Appl. No. 11/706,652, U.S. Patent and Trademark Office.

* cited by examiner (b)

ELECTRIC SIGNAL CONNECTING DEVICE AND PROBE ASSEMBLY AND PROBING DEVICE USING THE SAME

BACKGROUND OF INVENTION

1. Field of the Invention

The present invention relates to an electric signal connecting device and a probe assembly for use in checking circuits in a plurality of semiconductor chips formed on a semiconductor wafer in the process of producing LSI and other electronic devices or in checking circuits in liquid crystal and other electronic devices. The present invention is used in the so-called probing test for, for example, measuring the electric conduction of semiconductor chips en bloc by bringing vertical probes into contact with circuit terminals (pads) arranged on the semiconductor chips while they are still in a wafer state.

2. Description of Prior Art

The degree of integration of electronic devices has improved keeping pace with the progress in semiconductor technology, and the area occupied by circuit interconnection in each semiconductor chip formed on a semiconductor wafer keeps on increasing. As a result, the number of circuit terminals (pads) has increased on each semiconductor chip, and in keeping pace therewith the contraction of pad area, and the miniaturization of pad arrangement due to narrowing of pad pitch are progressing. At the same time, chip size packing of loading bare chips in circuit boards without enclosing semiconductor chips into package is becoming the main stream. For this reason, it becomes necessary by all means to check property and determine quality in the wafer state before dividing it into semiconductor chips.

In particular, an issue arising out of the miniaturization of pad arrangement (narrowing of pitch) is that the structure of probe for obtaining electric conductivity by bringing it into contact with the pads of semiconductor chips at the time of electric property tests or circuit test of electronic devices must be matched to the miniaturization of pad arrangement, and various measuring means are used to cope with this progress in miniaturization of pad arrangement.

For example, one of such means is one that makes a probe assembly made by area arranging a plurality of needle probes having a resiliently transforming part resiliently transforming in response to outside forces intervene between the pads of semiconductor chips to be tested and the testing device. As a means of electrically connecting this probe assembly and the test circuit of semiconductor chips, a printed wiring board called "probe card" is used. A past example of such circuit testing technology involving such a probe is, for example, the invention disclosed in the Japanese Patent Disclosure No. 2002-298297 and Japanese Patent Disclosure No. 2003-075503.

Generally in a probe card wherein a needle probe having a cantilever structure consisting of cantilever beams, the tip of probe coming into contact with the pad of semiconductor chips is narrow pitched, but in the base part in contact with the probe card, due to the radially expanding arrangement of the probe from the tip, a coarse pitch could be used and it was possible to fix probes to the circuit terminals of a probe card by soldering and similar connecting means. However, this cantilever structure had a problem of damaging the pads due to shifts in the horizontal direction of the tip that serve as the contact point when it comes into contact with the pad, or resulting in a fall in the measurement yield due to the tip falling off the pad. In addition, there were problems in that only a tip could be measured at a time and that the precision of fixing each probe varied resulting in a difficulty of controlling the contact pressure to a constant level.

In a vertical probe replacing this cantilever structure, in other words, in a vertical probe wherein the probe is fixed vertically to the circuit terminals of probe card, it is necessary that the pad pitch on a semiconductor chip and the circuit terminal pitch on a probe card have the same pitch interval. However, the miniaturization of circuit patterns on a probe card which is a printed wire board is limited by fabrication technology, and therefore, it is difficult for the area occupied by circuit terminals and wiring width to satisfy the requirements matching the pad pitch, and also because of a limit to the pitch interval for soldering, it was impossible to vertically fix a vertical probe to the probe card according to the pad pitch of the semiconductor chip as miniaturization progressed.

Thus, in a probe card the proportion of its plane area being occupied by the area of circuit terminals and the width of circuit interconnection is important and obstructs the narrowing of pitch of circuit terminals. Accordingly, it was decided to adopt the means of maintaining the number of vertical probes by using a multilayered printed wiring board for the probe card, by arranging circuit terminals in a grid, in two lines or zigzag form and by electrically connecting the wiring between layers via through-holes. However, due to a large area represented by these through-holes, the presence of through-holes was an obstacle for narrowing the pitch of arranging circuit terminals. Thus, any attempt to fix vertical probes to a probe card was plagued by the difficulty of narrowing the pitch of circuit terminals and required an advanced technology in soldering and a large number of manual operations leading to high costs of manufacturing. In order to solve these problems, the inventors of the present invention propose a vertical probe assembly and have already proposed a probing device as an electric signal connecting device based on the use of such vertical probe assembly (see the Patent Reference 1 and the Patent Reference 2).

FIG. 1 is a perspective view showing a vertical probe assembly as a past example proposed by the inventors of the present invention. As the perspective view in FIG. 1 shows, this vertical probe assembly 200 already proposed (see, for example, the Patent Reference 1) consists of erecting a plurality of vertical probes 205 between two parallel upper and lower square insulating boards (or insulation films) 201 and 202. The two upper and lower insulating boards 201 and 202 are kept apart at a fixed interval being blocked by a stage in the middle of the vertical probe 205, and the pitch arrangement of vertical probes 205 is made to agree with the pitch arrangement of pads on the semiconductor chips to be tested. The upper and lower tips of each vertical probe 205 protrude slightly the insulating boards 201 and 202 and serve as electric contact terminals 203, and a curved part 204 is created in the intermediate part to provide resiliency against outside force applied on the probe in the vertical direction and to absorb distortions. At the same time, the deformation of the curved part 204 serves as the source of restoring force of spring, and this restoring force of spring turns into contact pressure between the top of the spring force probe and the pad to give electric conductivity. This curved part 204 is created at different vertical positions for each row so that the vertical probes 205 arranged at the right angle may not come into contact each other. And each vertical probe 205 has a square section, and is inserted into square holes created at opposite positions of the upper and lower insulating boards 201 and 202 so that it may move vertically but does not rotate constituting an anti-rotating structure.

A probing device having such a vertical probe assembly (see, for example, the Patent Reference 2) is constituted as shown in the perspective view of FIG. 2. Specifically, above this vertical probe assembly 200. a semiconductor wafer on which a large number of semiconductor chips to be tested not shown have been formed is set on a wafer stage while the chip pads are kept upside down. On the other hand, below the vertical probe assembly 200, a connecting structure 206 is provided to enter into contact with the vertical probe of this probe assembly 200. This connecting structure 206 is connected with a probe card 208 through a flexible flat cable 207. And the wiring on the connecting structure 206 side of the flexible flat cable 207 is wired by the same narrow pitch as the chip pads. And the end of wiring enables the wiring terminals to come into contact en bloc with the vertical probes of the vertical probe assembly 200. And the wiring pitch interval on the probe card 208 side of the flexible flat cable 207 is extended in such a way that the circuit wiring terminals on the probe card 208 may be soldered.

And the wafer stage (not shown) and the vertical probe assembly 200 can be moved in the X-Y-Z-θ direction. And the vertical probe assembly 200, once positioned and brought into contact en bloc with the wiring terminal of a flexible flat cable provided on the connecting structure 206, need not be moved until the end of the wafer test. Here, the connecting structure 206 plays the role of a socket for connecting with vertical probes by fixing the wiring terminal surface of the flexible flat cable 207 facing upward horizontally. As the details of this connecting structure have already been proposed, the description thereof is omitted here.

The wafer stage is moved in this condition, one of the semiconductor chips is positioned on the vertical probe assembly, and respectively a plurality of chip pad and the upper contact terminals of the vertical probe assembly are connected en bloc. This enables to connect electrically narrow pitch semiconductor chips and probe cards, and drastic improvement of functions as probing device contributes greatly to promote higher integration of semiconductor devices.

As described above, probing devices in which a vertical probe assembly proposed already by the inventors of the present invention can measure even semiconductor chips of a narrowed pad pitch of 45 μm for example. Moreover, due to the possibility of automatically assembling probes without resorting to soldering, it is possible to mass produce them at low costs, and due to the possibility of vertically contacting en bloc the chip pads, it is possible to uniformly control contact pressure on all the probes. These are important advantages obtained from them.

Nevertheless, this probing device is not different from others in that a plurality of semiconductor chips formed on a semiconductor wafer are tested successively one after another, and it is necessary to move the wafer stage by one tip for each test. On the other hand, the recent trend in the production of semiconductor wafers is for larger diameter (for example, 300 mm in diameter), and the number of semiconductor chips formed on a semiconductor wafer ranges from several tens to several hundreds representing an increasingly higher density. As a result, the time required to test a piece of semiconductor wafer becomes considerable, and the demand is rising for a probing device provided with multiple array of vertical probe assembly (hereinafter referred to as "multiple array vertical probe assembly") capable of testing simultaneously all the semiconductor chips on a wafer without moving the wafer stage. However, in the case of a wafer on which 200 chips each having 100 pads are formed for example, 100×200=20,000 signal wiring cables will be required for each multiple array vertical probe assembly, and it is difficult to efficiently draw such a number of signal wiring cables from a multiple array vertical probe assembly and connect them to outside testing apparatuses.

On the other hand, if a multiple array vertical probe assembly is to be used for a burn in test, due to a high temperature environment of approximately 12° C. in which it will be placed, the effect of thermal expansion that is not an important issue for testing a chip at a time by a separate row probe assembly will grow in importance, and pitch discrepancy will develop between the pitch of pads formed on a silicon wafer and the pitch of vertical probes planted on insulating board made of a resin film and the like. In particular, as the position of vertical probes moves closer to the perimeter of the wafer, the discrepancy of pitch of vertical probes will be cumulated, grow larger and it will become impossible to probe.

Lately a further higher speed and mass en bloc treatment are required. For example, a probe assembly capable of bringing simultaneously contacts into contact with all the pads on a waver with a diameter of 12 inches (wafer of 300 mm in diameter) and of coping with high frequency. With regards to this requirement for higher speed, the following points will be important:

(1) Reduce electric capacity, and for this purpose reduce the area of the probe for the entirety.

(2) Shorten as much as possible the distance between the test circuit and the pads on a wafer.

(3) Reduce noises resulting from magnetic interference generated by probes and wiring cables.

(4) Long distance between contacts and wiring cables opposite thereto.

With regards to wiring lines between probe assemblies and test circuits, the connection of a large number of wiring lines is required. And as a result of narrowing of pitch, a high arraying accuracy of contacts is also required because contacts and pads face each other over a large area.

With regards to a growing number of wiring lines and narrowing of pitch, for example, the number of contacts in a wafer wherein 600 chips having 200 pads each are formed totals as many as 120,000. It seems possible to solve this number problem by applying a further developed method of the method described in the Japanese Patent Disclosure 2003-075503 to the prior printed wiring board. While the pitch provided by a flat cable is narrow 30 μm pitch, an important issue is how to cope with the wiring of test circuits in view of such narrow pitch contacts. And supposing that a contact force of 5 g is applied on each of the 120,000 contacts, a total force of approximately 600 kg will act on the whole probe assembly. Such a force is likely to create a problem of deformation of mechanical parts.

The present invention is made to satisfy these requirements, and its object is to provide an electric signal connecting device with a multiple array structure of vertical probe assembly wherein the problem of thermal expansion and signal wiring are solved and probe assembly used therein so that a plurality of chips may be subjected en bloc at the same time to a probing test or a burn-in test at the time of testing the property of semiconductor chips and other similar circuits which are now becoming increasingly dense as a result of high integration of electronic devices.

SUMMARY OF THE INVENTION

The present invention includes, as electric signal connecting devices, vertical probes for establishing electric connection by entering into contact with terminals for electric connection created in electric functional elements to be tested and a resin film supporting the vertical probes. The vertical probes are planted resiliently deformably in a surface of the resin film in a direction along the surface of the resin film, an end of the vertical probes is brought into contact with a terminal of the electric functional elements to be tested and another end of the vertical probe is brought into contact with the terminal of an electric function testing device so that signals may be transmitted and received between the electric functional elements to be tested and the electric function testing device.

The present invention includes also, as electric signal connecting devices, a plurality of vertical probes to be brought into contact with a plurality of terminals for electric connection created in the electric functional elements to be tested, and includes, in the electric function testing device for establishing electric connection, respectively a plurality of sets of units in an X direction and of units in a Y direction crossing with the units in the X direction formed by a plurality of ribbon-like resin films having a plurality of vertical probes laid out together, and the plurality of sets of units in the X direction and units in the Y direction are arranged in a grid form on a supporting board to be positioned and fixed there, and the vertical probes positioned at each crossing of the units in the X direction and the units in the Y direction are brought into contact en bloc with all the terminals of the electric functional elements to be tested so that signals may be transmitted and received between the electric functional elements to be tested and the electric function testing device.

The present invention also includes, as a probing device, respectively a plurality of sets of units in the X direction and of units extending in the Y direction consisting of a plurality of ribbon-like resin films having a plurality of vertical probes laid out together in the probing device, wherein vertical probes are brought into contact with the semiconductor chips to be tested formed in a semiconductor wafer to establish electric contact with the testing device through these vertical probes, and the plurality of sets of units in the X direction and units in the Y direction are arranged in a grid form on a supporting board to be positioned and fixed there, and the vertical probes positioned at each crossing of the units in the X direction and the units in the Y direction are brought into contact en bloc with all the pads of semiconductor chips formed in a semiconductor wafer to be tested to carry out probing tests.

In the present invention, all the crossing positions of a plurality of sets of units in the X direction and of units in the Y direction in which the vertical probes are arranged correspond one to one to all the semiconductor chips formed on a semiconductor wafer to be tested, and the array of the vertical probes arranged in each crossing position of the units in the X direction and the units in the Y direction agrees with the array of pads in each semiconductor chip to be tested. In addition, the means of fixing and positioning the units in the X direction and the units in the Y direction exist in a large number depending on the specifications required of the units in the X direction and the units in the Y direction and can be dealt with selectively. However, in the embodiment of the present invention, a plurality of props planted in matrix array on the supporting board are placed as means of positioning the units in the X direction and the units in the Y direction in the X, Y and Z directions.

In the present invention, a pair of vertical probe assembly wherein a plurality of resiliently deformable probing parts, a plurality of electric conducting means and a plurality of wiring parts having resilient terminals are electrically and physically connected on a film-shaped resin surface which is a non-electric conductive material having a plurality of punched holes and notched holes, and are disposed at desired positions while maintaining the functions of the film-shaped resin, the probing part and the wiring part and promoting the dynamic function and mechanical functions of the probing part by their synergic action constitute a unit of production. The ribbon-shaped resin film consists of a ribbon-shaped film in the X direction and a ribbon-shaped film in the Y direction, and a vertical probe having a curved part planted on a copper foil laminated resin film and a wiring pattern linked therewith are formed by etching, and the ribbon-shaped resin film is arranged in such a way that the direction of the curved part of the adjacent vertical probes may be inverse. Unlike in the past when probes and wiring have been processed separately, the present invention adopted integral processing in order to realize an integral structure and to reduce the number of processing and assembly operations. And because of the integral structure, probes and wiring are differentiated in the present invention by a definition that the part subsequent to the point where the pattern is supported by the square bars $8a$ and $8b$ and contact pressure is not applied to the pattern is wiring.

In the present invention, the ribbon-shaped film in the X direction is laid out in such a way that an end of the vertical probe protrudes from the upper end in the longitudinal direction, and the other end trails down passing through the curved part and extends to the end of the ribbon-shaped film along the lower end to form a wiring means. On the other hand, the resin film part has the first opening cut out in such a way that it is surrounded by the curved part, and the second opening cut out at a same interval along the longitudinal direction for allowing a ribbon-shaped film in the Y direction pass through at the right angle. The ribbon-shaped film in the Y direction is laid out in such a way that an end of the vertical probe protrudes from the upper side in the longitudinal direction, and the other end trails down passing through the curved part and extends to the end of the ribbon-shaped film along the lower side to form a wiring means, and is formed in such a way that the length of protrusion of the vertical probe is longer than the length of protrusion of the ribbon-shaped film in the X direction. On the other hand, the resin film part has an opening cut out in such a way that it is surrounded by the curved part. The structure of passing the ribbon-shaped film in the Y direction through the second opening at the right angle is arranged in the lower stage in the arranging method of simply superposing the unit 105 in the X direction and the unit 106 in the Y direction. For example, the top of the unit in the X direction is elongated, and it will be difficult to obtain a good vertical probe form, The opening 1 is in a form composed by a slit through which a coupling member subjected to contact pressure passes through and a slit from which vicinity of the curved part is cut off so that the force by the contact pressure of the vertical probe may act as direct contact force on the curved part without being subjected to complicated vector force from the resin film. The opening in the resin film is not limited to opening 1 and opening 2, and its number, form and array position may be chosen as required in order to obtain good characteristics of the present invention and also to enable simple production.

In the present invention, the ribbon-shaped films in the X and Y directions are designed to absorb displacement in the axis direction of the vertical probe at the time of test by the resilient deformation of the narrow resin film width part formed by the opening opened in such a way that it is surrounded by the curved part and the upper part of the resin film, and when the units in the X direction and the units in the Y direction are arranged in the grid form, the height of the top of the vertical probes respectively protruding from the ribbon-shaped films in the X and Y directions agree. In addition, when the units in the X direction and the units in the Y direction are arranged in the grid form, the units in the Y direction are arranged to penetrate through the units in the X direction.

In the present invention, the wiring cable formed in the ribbon-shaped films in the X and Y directions is folded upward at the end of the ribbon-shaped films, and the top protrudes from the upper side of the ribbon-shaped films to be connecting pins for outside connection, and a plurality of ribbon-shaped films in the X and Y directions constituting respectively the units in the X and Y directions are wired in such a way that the protrusion position of the connecting pins will be successively shifted when they are placed side by side to form a unit. A plurality of connecting pins having the same function of the units in the X direction and the Y direction are concentrated into one for connecting with the outside testing device.

In the present invention, the electric wiring connector is a ribbon-shaped film on both sides of which copper wiring patterns are formed, and this ribbon-shaped film is covered with an insulating film on both sides including the copper wiring patterns. The copper wiring patterns formed on both sides of this ribbon-shaped film are, on the surface side, a plurality of common copper wiring patterns formed in parallel along the longitudinal direction, and are, on the back side, a plurality of copper wiring patterns formed in a direction orthogonal to these common copper wiring patterns. In addition, the copper wiring patterns formed on both sides of the ribbon-shaped film are electrically connected between freely chosen wiring lines at their orthogonal crossing positions through through-holes, and the top of copper wiring patterns crossing at right angle in the longitudinal direction protrude slightly upward from the ribbon-shaped film side to constitute connecting terminals with vertical probes in the individual array probe assembly. And the top of the copper wiring patterns crossing at right angle in the longitudinal direction protrude slightly from both the upper side and the lower side of the ribbon-shaped film to form connecting terminals for coming into contact with vertical probes in the individual probe assembly at both upper and lower sides.

In the present invention, when the ribbon-shaped films are inserted, the surface on the copper wiring pattern side having connecting terminals is arrayed to face the lateral surface of the pedestal, and the copper wiring patterns having connecting terminals formed in this ribbon-shaped film are structured in such a way that a plurality of them constitute a group and a plurality of groups branch from the common copper wiring pattern at an equal pitch. Wiring terminals of the common copper wiring pattern are provided at an end in the longitudinal direction of the ribbon-shaped film so that they may be inserted into the sockets for connecting with outside testing devices. In addition, each group of copper wiring patterns having connecting terminals formed on the ribbon-shaped film is respectively arrayed facing each semiconductor chip multiple arrayed in a semiconductor wafer. And two sheets of the ribbon-shaped films are superposed and the position of connecting terminals therein is slid so that they may be in zigzag and form two lines so that it may be possible to adapt to the zigzag arrangement of chip pads.

The probing device of the present invention is for conducting probing tests of the pads of a plurality of semiconductor chips formed on a semiconductor wafer by bringing respectively vertical probes en bloc at the same time into contact on the same pads and then successively for conducting burn-in tests. At the time of a burn-in test, the thermal expansion of the ribbon-shaped films is contained by means of a grid-shaped positioning bar positioned by a prop, the vertical probes of individual probe assembly and the connecting terminals of ribbon-shaped films are prevented from sliding in their respective position and thus the expansion of the entire multiple array probe assembly is contained. By the adoption of such a control mechanism, it becomes possible to measure semiconductor chips formed in the periphery of a semiconductor wafer at the time of a burn-in test.

According to the present invention, for testing the property of semiconductor chips that become increasingly densely packed with information keeping pace with further rise in the degree of integration of electronic devices, it has become possible to conduct probing tests and burn-in tests en bloc at the same time on a plurality of semiconductor chips formed on a semiconductor wafer. Specifically, a plurality of sets of units in the X direction and units in the Y direction wherein a plurality of ribbon-shaped resin films each having a plurality of vertical probes are laid out are provided, and this plurality of units in the X direction and units in the Y direction are arrayed in the grid shape on the supporting board to be positioned and fixed there. In this way, the vertical probe assembly is constituted with a multiple-array structure.

As a result, it has become possible to contain the sliding of the whole multiple array structure due to thermal expansion, and it has become easily possible to conduct probing tests by bringing the vertical probes arranged at each crossing position of the units in the X direction and the units in the Y direction into contact en bloc with all the pads of the semiconductor chips to be tested formed on a semiconductor wafer without any displacement in position. It is also possible to use the probing device of the present invention in a burn-in test wherein electric stresses are applied to circuits in a high temperature to conduct acceleration tests of semiconductor chips. The use of ribbon-shaped resin films simplifies the drawing of wiring and the connecting terminal structure to outside devices, and consequently it becomes possible to provide probing devices solving the thermal expansion problem and the signal wiring problem.

DESCRIPTION OF THE PREFERRED EMBODIMENTS

Before proceeding to the description of the embodiments of the present invention, an explanation will be given on the current system by which wafer tests representing one of electric function tests in relation to probe cards are being carried out.

Figure 1:
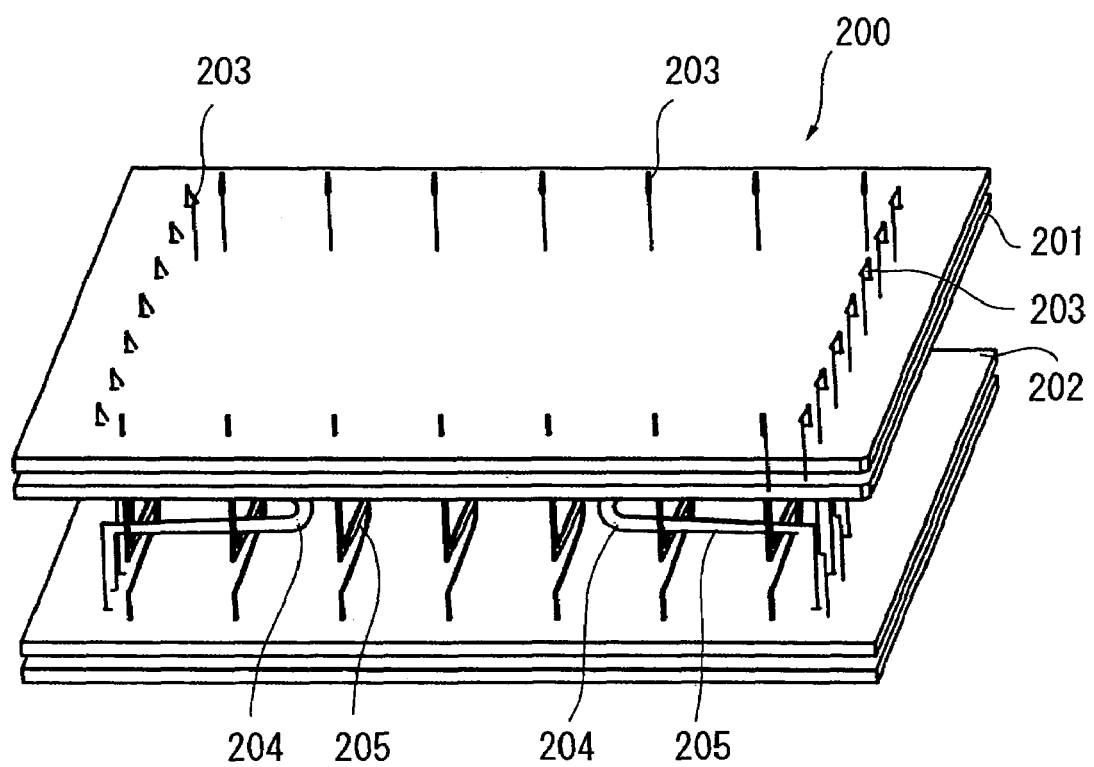
FIG. 1 is a perspective view of a prior vertical probe assembly.
Figure 2:
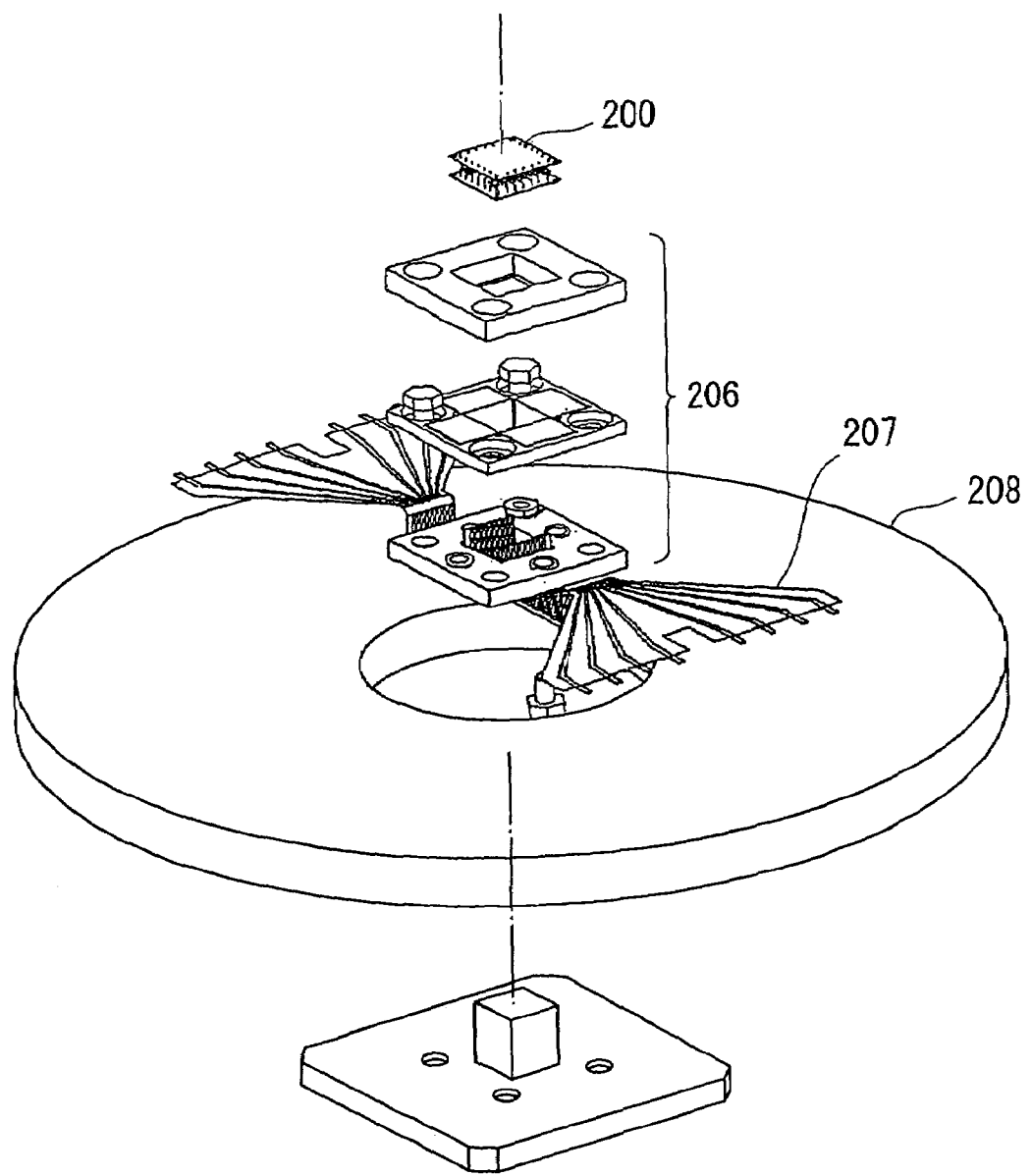
FIG. 2 is a perspective view of a prior probing device.
Figure 3:
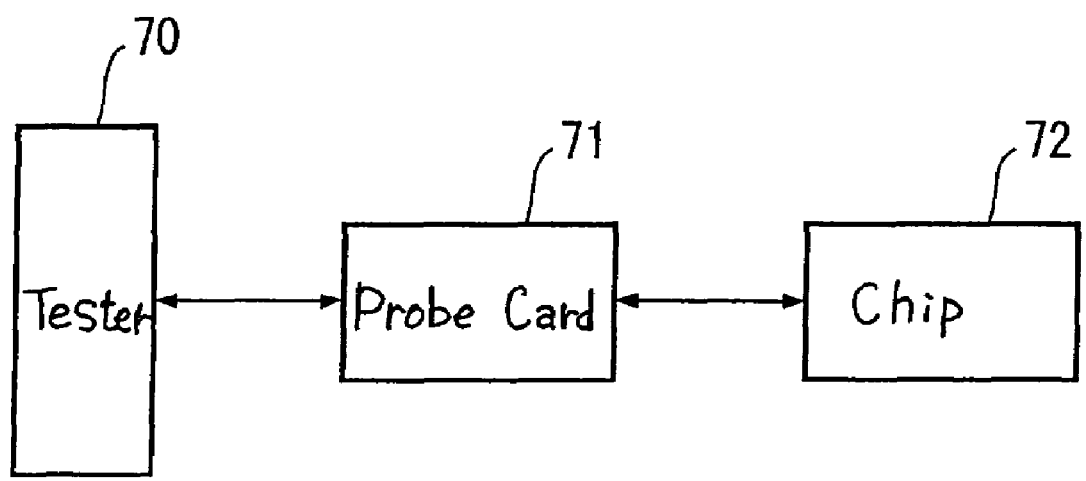
FIG. 3 is a block diagram showing the system structure of a prior electric function testing device.

FIG. 3 is a block diagram showing the current system structure of electric function testing devices (in other words an example of the prior arts) in the field of the present invention. In FIG. 3, the code 70 represents a dedicated tester. Generally the dedicated tester 70 used in the current system is large-sized and expensive. The dedicated tester 70 generates electric signals required in the tests of chip 72 and inputs the same into the chip 72 through a probe card 71. The dedicated tester tests will be conducted based on the signals from the chip 72 corresponding to the inputted signals. The number of signal lines from the dedicated tester 70 up to the probe card 71 is approximately 1,100 even when the number of wiring lines for inputting into the chip 72 is approximately 200, and these approximately 1,100 wiring lines enable to cope with a plurality of pad tests. However, when the number chips 72 has increased very much, for example in the case of coping with 300 chips, the number of wiring lines required will be 60,000 and it will be difficult to send signals by distributing to a large number of chips from approximately 1,100 wiring lines of the dedicated tester. And even if wiring is possible, responses with a large number of wiring lines for high-speed tests will not be effective. Therefore, the current system shown in FIG. 3 can cope with the case of the probes responding at the same time to a limited number of chips.

Figure 4:
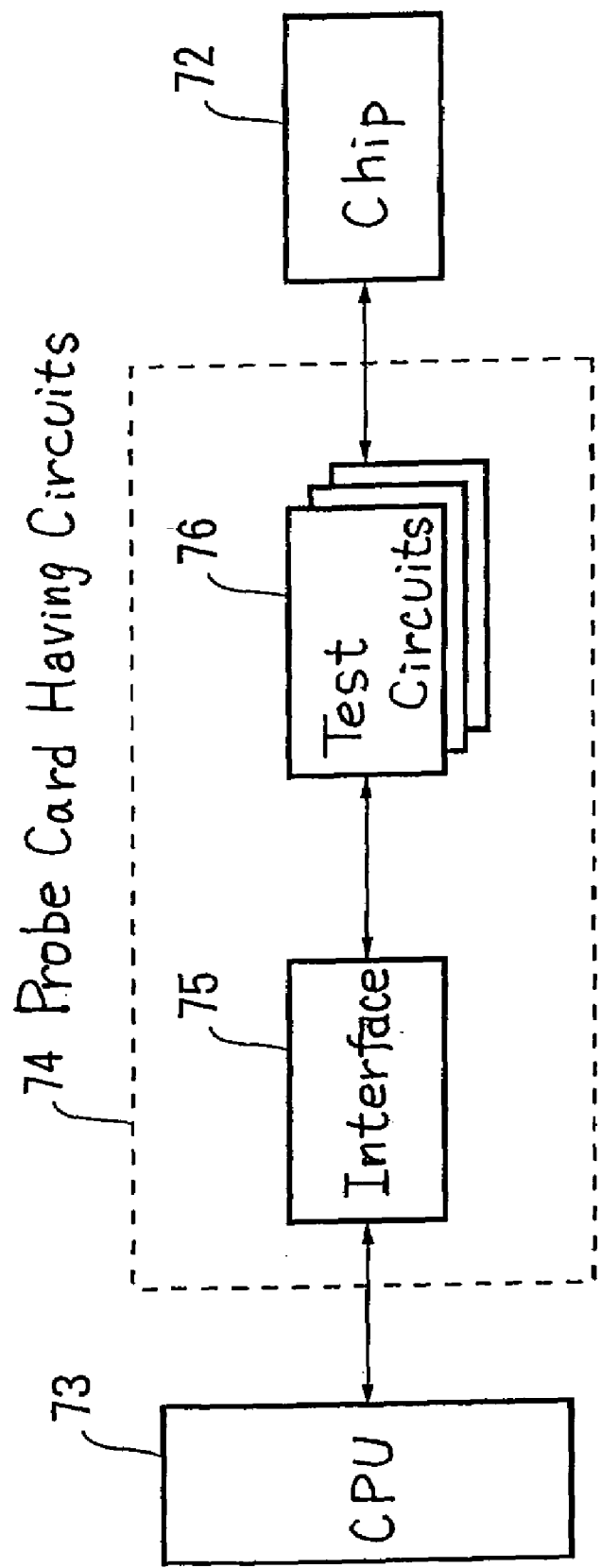
FIG. 4 is a block diagram showing the system structure adapted to multiple wiring and to high speed as a system of the electric function testing device related to the present invention.

FIG. 4 is a block diagram showing a system structure for coping with a large number of wiring lines and for coping with high speed requirement as a system of electric function testing device according to the present invention. In FIG. 4, the code 73 represents a general-purpose computer, for example a PC. The code 74 represents a probe card having a circuit. It is shown by a broken line. The probe card 74 having a circuit consists of an interface 75 and testing circuits 76. The testing circuits 76 are plural and each of them is started for tests of different purposes. This plurality of testing circuits 76 are not limited to the same functions. The code 72 represent a chip. The general-purpose computer sends testing information for each individual wafer to the interface 75. The interface 75 sends test contents to the testing circuits 76. The testing circuits 76 have testing information corresponding to chips, and send required information to the chips at the time of test. And it also receives and evaluates test result information from the chips 72, and sends the information to the general-purpose computer 73 through the interface 75. And the testing circuits 76 are related one-to-one with chips, and the number of pads in each chip 72 and approximately the same number of testing circuits 76 enable wiring lines to connect with the pads in each chip 72.

Embodiment 1

The following is a detailed description of Embodiment 1 of the probing device of the present invention with reference to drawings. The present embodiment 1 is an effective system when it is applied to the current system shown in FIG. 3, and the integration of wiring lines with probes eliminates the necessity of expensive multilayered board and the like of the prior probe card.

Figure 5:
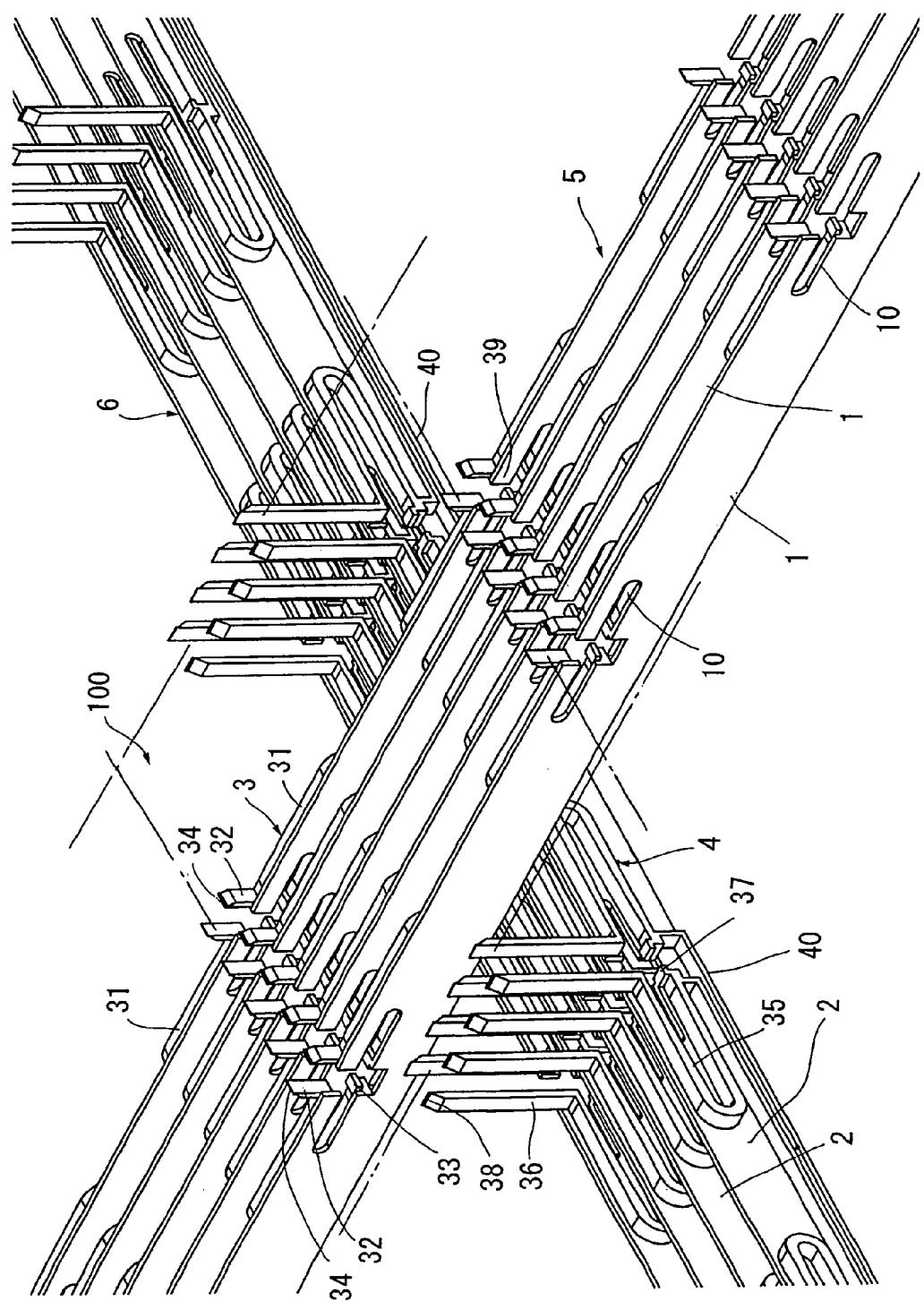
FIG. 5 is a perspective view showing the structure of a multiple array vertical probe assembly related to Embodiment 1 of the present invention.

FIG. 5 is a perspective view showing Embodiment 1 of a multiple array vertical probe assembly according to the present invention. The basic structure of the multiple array vertical probe assembly according to the present Embodiment 1 is made up by combining in the grid form a unit in the X direction 5 formed by arranging in the vertical direction a plurality of ribbon-shaped films in the X direction 1 on which a plurality of vertical probes 3 patterned by etching in the longitudinal direction, and, like this unit in the X direction 5, a unit in the Y direction 6 formed by arranging in the vertical direction a plurality of ribbon-shaped films in the Y direction 2 on which a plurality of vertical probes 4 patterned by etching in the longitudinal direction are formed.

Both the ribbon-shaped film in the X direction 1 and the ribbon-shaped film in the Y direction 2 are formed by a ribbon-shaped or belt-shaped insulating film wherein copper and other conductive foils are laminated. And in the present Embodiment 1, the ribbon-shaped film in the X direction 1 and the ribbon-shaped film in the Y direction 2 have basically the same structure.

The vertical probe 3 of the ribbon-shaped film in the X direction 1 includes a curved part 31 formed to the letter U in the longitudinal direction within the surface of the ribbon-shaped film in the X direction 1, upper supporting legs 32 and lower supporting legs 33 extending outward approximately at the right angle at the end of opening of the curved part 31, and a contact point 34 provided at the top of each supporting leg 32.

And the vertical probe 4 of the ribbon-shaped film in the Y direction 2 includes a curved part 35 formed to the letter U in the longitudinal direction within the surface of the ribbon-shaped film in the Y direction 2, upper supporting legs 36 and lower supporting legs 37 extending outward approximately at the right angle at the end of opening of the curved part 35, and a contact point 38 provided at the top of each supporting leg 36.

And the unit in the X direction 5 and the unit in the Y direction 6 are arranged in a vertical positional relationship with the unit in the X direction 5 being arranged above and the unit in the Y direction 6 being placed below and when seen from above they are arranged to be crossing each other. In such an arrangement, in order to make the height of the contact point 34 of the unit in the X direction 5 to agree with the contact point 38 of the unit in the Y direction 6, the length of the upper supporting legs 36 of the vertical probes 3 is set longer than the length of the upper supporting legs 32 of the vertical probes 4. The difference of length of the upper supporting legs 36 and the upper supporting legs 32 is equal to the difference in level between the unit in the X direction 5 and the unit in the Y direction 6.

In this basic structure, the area of crossing 100 between the unit in the X direction 5 and the unit in the Y direction 6 (the rectangular area enclosed by chain lines with one dot in FIG. 5) represents an area occupied by a semiconductor chip. Taking the area 100 as the center for observation, as a plurality of semiconductor chips can be arranged in succession in the X direction and the Y direction, a plurality of the areas themselves can be arranged in succession in the X direction and the Y direction when the area 100 is taken as the center of observation. The arrangement of contact points 34 and 38 of the vertical probes 3 and 4 in the area 100 corresponds to the chip pads which are terminals on a semiconductor chip. Hereafter, this structure will be the basis of the description of the embodiments of the probing device of the present invention. Incidentally, the copper foil constituting the ribbon-shaped films 1 and 2 is made up of gold foil, silver foil, or beryllium copper and other highly conductive materials, and the ribbon-shaped films 1 and 2 are made of synthetic resins such as polyimide resin, polyvinyl chloride resin and the like.

In the present Embodiment 1, the wiring lines (or signal lines) 39 and 40 for taking out signals inputted from the contact points 34 and 38 extend from the lower supporting part 33 and 37 of the vertical probes 3 and 4. These wiring lines are also formed by etching like the vertical probes 3 and 4. The wiring lines 39 and 40 extend once downward on the surface of the ribbon-shaped films 1 and 2 from the lower supporting parts 33 and 37 of the vertical probes 3 and 4, are bent approximately at the right angle near the lower end of each ribbon-shaped film 1 and 2 (to face in the longitudinal direction of each ribbon-shaped film 1 and 2), extend along each ribbon-shaped film 1 and 2 and head towards the output terminals. The adoption of such a structure enables to gather the output wiring lines of a plurality of vertical probes 3 and 4 near the lower end of each ribbon-shaped film 1 and 2 and to extend them to the output terminals. Thus, it is possible to simplify the structure of the multiple array vertical probe assembly.

Figure 9:
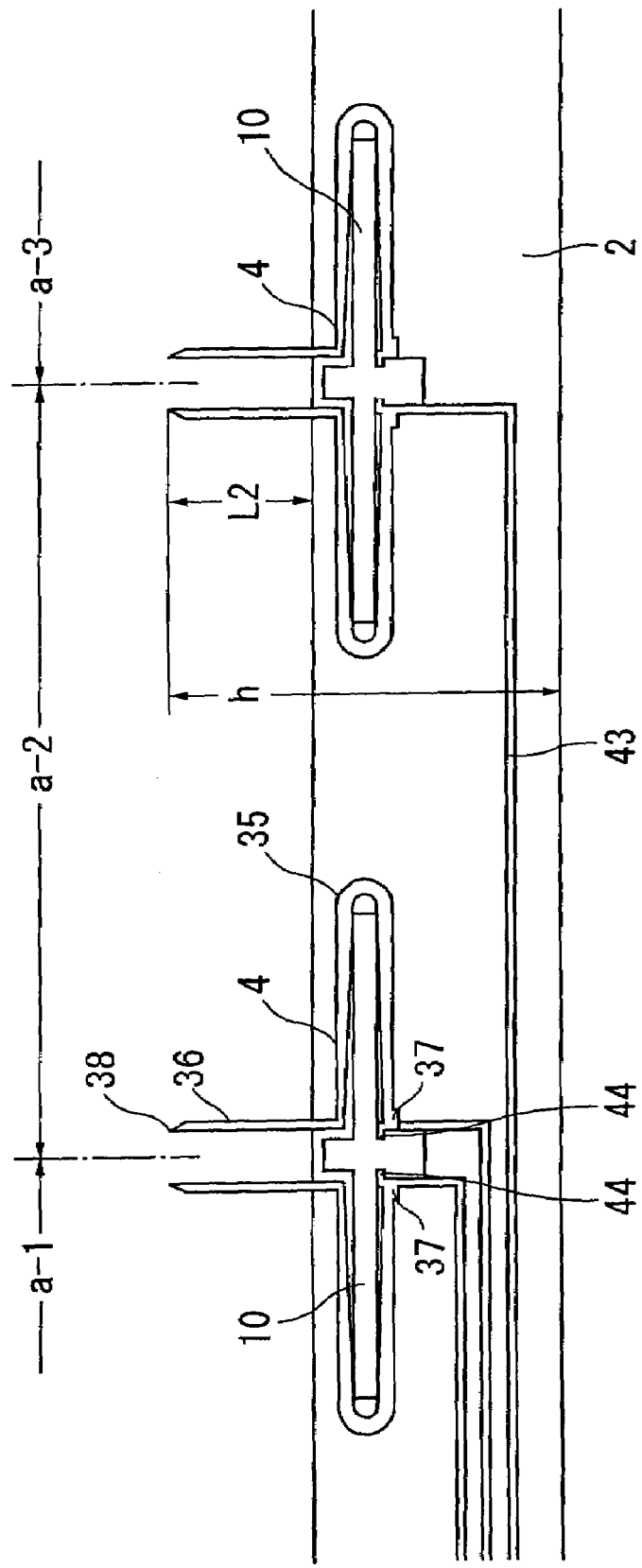
FIG. 9 is a front view showing the ribbon-shaped film in the Y direction according to Embodiment 2 ditto.

The following is a description of the structure of the ribbon-shaped film in the X direction 1 and the ribbon-shaped film in the Y direction 2 with reference to the front view of FIG. 9. FIG. 9 is essentially used for the description of the ribbon-shaped film in the Y direction 2 in Embodiment 2 of the present invention (described later on). However, this is, in Embodiment 1 of the present invention, almost the same as the structure of the ribbon-shaped film in the X direction 1 and the ribbon-shaped film in the Y direction 2 except for some differences, and is used for similar descriptions.

In the ribbon-shaped film in the X direction 1, an opening 10 is created in the part where a pair of vertical probes 3 are facing against each other. The opening 10 is, as shown in FIG. 9, a nearly T-shaped opening created in the boundary part between adjacent units a (for example a-1 and a-2), and it is created by punching the inner side of curved parts 31 facing each other of the vertical probes 3. As a result, the force applied in the arrow S1 direction to the contact points 34 of the vertical probes 3 acts on the whole curved parts 31 of the vertical probes 3 without being subjected to forces in complicated directions from the resin film by the cutting out of this opening 10 and resiliently deforms the vertical probes 3. In other words, when viewed from the other side, as the basic form of the entire ribbon-shaped film in the X direction 1 is belt-shaped, it deforms freely in response to outside forces applied in the vertical direction to its surface, but it does not deform against outside forces applied in the direction along its surface (either in the longitudinal direction or in the width direction).

However, in the present Embodiment 1, vertical probes 3 are planted on the surface of the ribbon-shaped film in the X direction 1, and the inner side of the curved parts 31 of these vertical probes 3 is punched through to create openings 10. Therefore, in the curved parts 31 of the vertical probes 3, the ribbon-shaped film in the X direction 1 can deform in the surface direction (in the width direction of the surface). Incidentally, the ribbon-shaped film in the X direction 1 is designed basically not to deform in the surface direction in any parts other than the curved parts 31 of the vertical probes 3. Furthermore, on the upper side of the opening 10 the film material of the ribbon-shaped film in the X direction 1 expands continuously. And the same thing can be said on the structure of the ribbon-shaped film in the Y direction 2. The structure described above is the structure of the probe assembly and is the basis of the signal detection operation of the probing devices.

Embodiment 2

Figure 6:
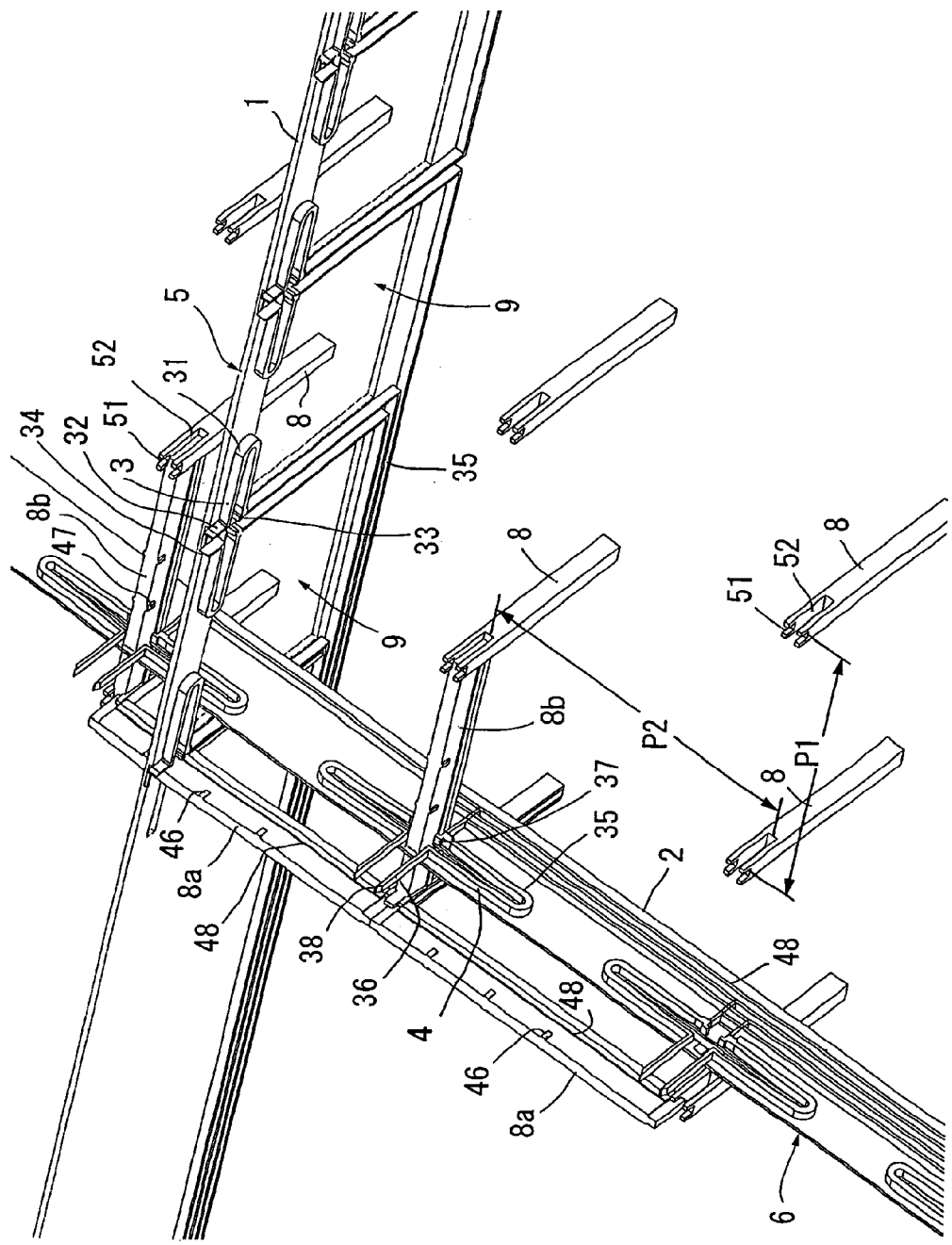
FIG. 6 is a partial perspective view showing the internal structure according to Embodiment 1 ditto.

FIG. 6 is a partial perspective view describing the structure of the probing device according to Embodiment 2 of the present invention. Embodiment 2 of the present invention is characterized in that the acting point of contact pressure and the supporting parts subjected to this contact pressure are in the ending position of the curved parts regardless of the number of arrays of multiple arrays and the number of wiring lines, and a good spring characteristic of probes can be obtained. It is also characterized in that the wiring part is behind the supporting part and is unlikely to be affected by the resiliency property of probes, a sufficient space available for electric wiring can be secured, and wiring pattern forms sufficiently taking into account electric property can be obtained. And the probing device using the multiple array vertical probe assembly of the present Embodiment 2 is not constituted by arranging individual probe assemblies in the matrix pattern as in the past, but as FIG. 6 shows a plurality of vertical probes 3 having a curved part are patterned by etching on a ribbon-shaped insulating film made by laminating copper foils, and this patterned ribbon-shaped film is chosen as the ribbon-shaped film in the X direction 1. Similarly, a plurality of vertical probes 4 are patterned on the ribbon-shaped film, and this patterned ribbon-shaped film is chosen as the ribbon-shaped film in the Y direction 2. Incidentally, the ribbon-shaped films in the X and Y directions 1 and 2 have a plurality of probes and wiring lines on one surface, and the positional relationship that should be arranged on the surface is secured by their respective pattern formation. And the curved parts of adjacent vertical probes facing each other are arranged in the inverse direction so that the arrangement of the contact points of the vertical probes 3 and 4 may correspond with the chip pads on a chip. This arrangement in the inverse direction results in each vertical probe 3 and 4 corresponding to a chip in the wafer being positioned in the area projected for the chip.

A plurality of ribbon-shaped films in the X direction 1 are arranged together to constitute a unit in the X direction 5, a plurality of ribbon-shaped films in the Y direction 2 are arranged together to constitute a unit in the Y direction 6, and this unit in the X direction 5 and the unit in the Y direction 6 are combined in the grid shape to constitute a multiple array vertical probe assembly. Furthermore, this assembly is fixed on a plurality of props 8 planted on the supporting board (not shown) to constitute a probing device.

And unlike the prior art wherein an individual probe assembly corresponded with a chip on the wafer, in the present invention the arrangement of vertical probes 3 and 4 at each crossing position when the units in the X direction and the units in the Y direction are combined corresponds to the pad pitch of a chip. And when the units in the X and Y directions 5 and 6 are combined, the thickness of resin films is reconciled in advance, or is adjusted through spacers, or they are precisely positioned by means of indented indices 8c and 8d on the perimeter of square bars 8a and 8b so that the pitch of the vertical probes 3 and 4 may coincide with the pad pitch of semiconductor chips. The method of arranging closely a plurality of indices 8c and 8d of the present invention for positioning will be described separately.

Figure 7:
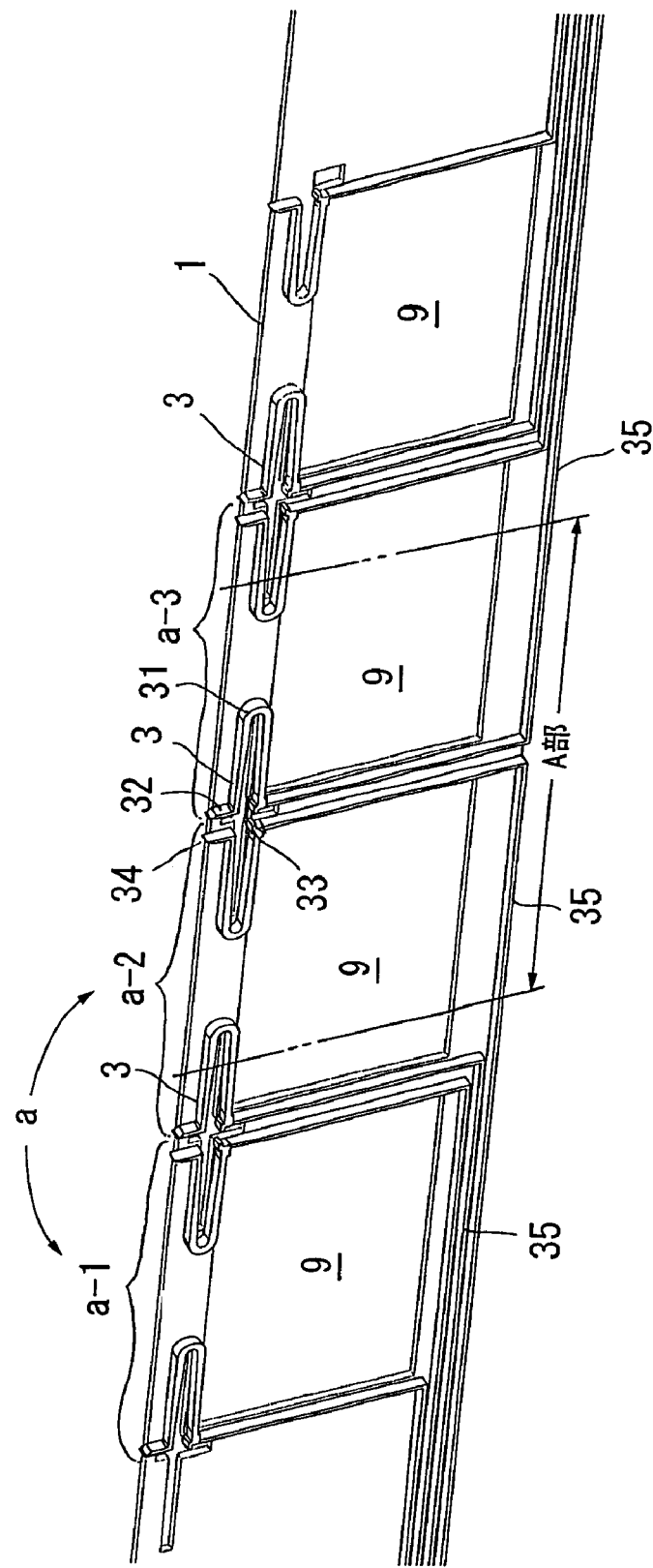
FIG. 7 is a perspective view showing the ribbon-shaped film in the X direction according to Embodiment 2 ditto.
Figure 8:
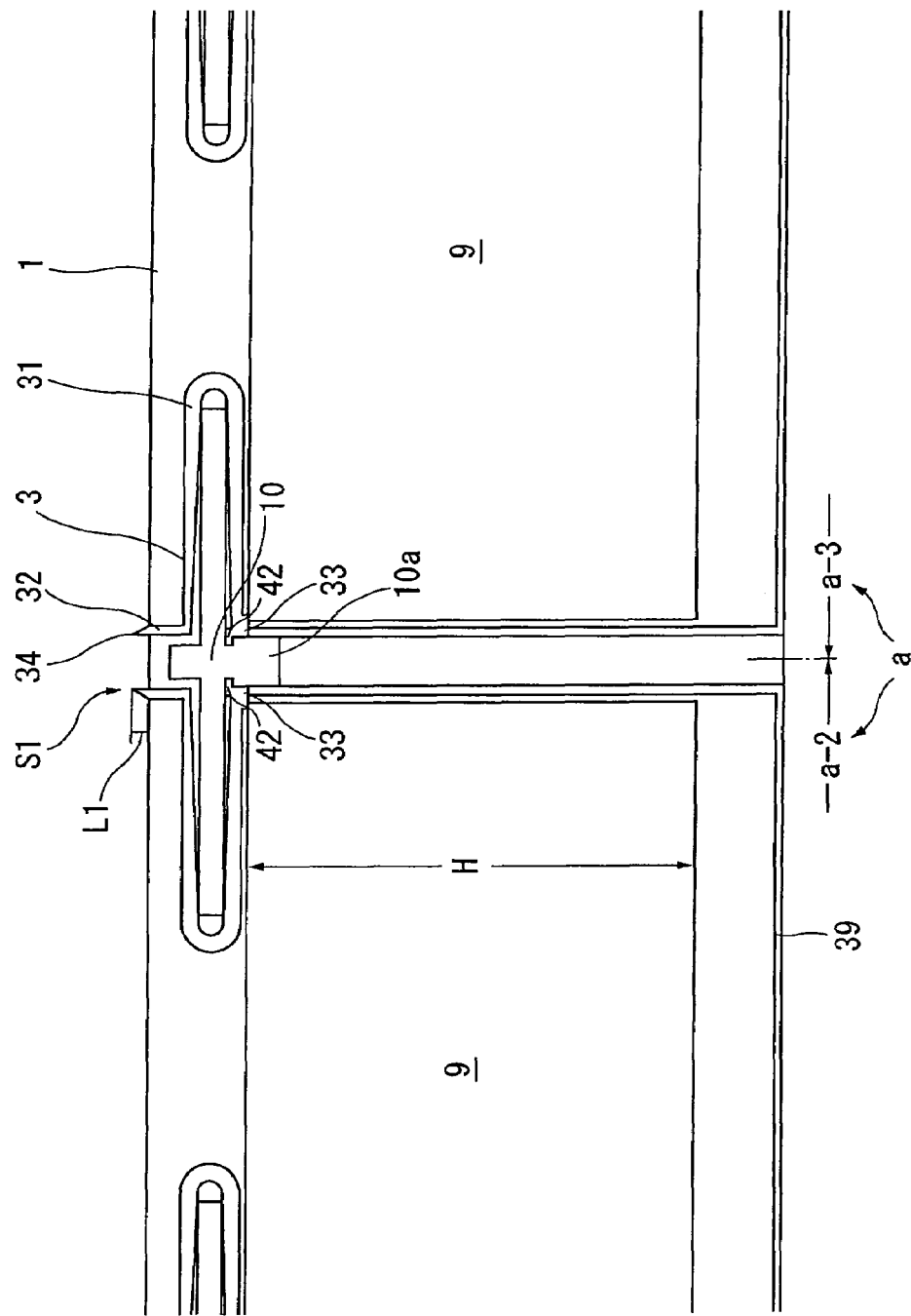
FIG. 8 is an enlarged front view of the section A of FIG. 7.

The following is the description in concrete terms on each component of the multiple array vertical probe assembly described above. FIG. 7 is a perspective view of the ribbon-shaped film in the X direction 1 wherein vertical probes 3 are patterned. FIG. 8 is a partially enlarged front view of the ribbon-shaped film in the X direction 1. To begin with, prepare a belt-shaped film made of a polyimide resin or other nonconductive film laminated with beryllium copper foil and other conductive materials and form a ribbon-shaped film in the X direction 1 wherein vertical probes 3 are patterned by etching. The vertical probe 3 has a curved part 31 formed to the U letter in the longitudinal direction on the surface of the ribbon-shaped film in the X direction 1, upper supporting legs 32 and lower supporting legs 33 extending outward nearly at the right angle at the end of the opening of the curved part 31, and the contact points 34 provided at the top of the upper supporting legs 32. In the ribbon-shaped film in the X direction 1, two vertical probes 3 with the back of their curved part 31 arranged to face each other are taken as one unit a, and a plurality of units a are patterned in the longitudinal direction of the ribbon-shaped film in the X direction 1 in the order of a-1, a-2, a-3 . . . . The number of units a is determined according to the number of chips to be formed on a wafer. At this time, the longitudinal section of the resin film should be removed so that the top part (part where the contact points 34 are formed) of the upper supporting legs 32 of vertical probes 3 protrudes by a length L1 from the edge of the upper long side of the ribbon-shaped film in the X direction 1. The contact point 34 of the vertical probe 3 serves as a probe for contacting the chip pad of the semiconductor chip at the time of probing test, and therefore the top should be as sharp as an edge.

And, the ribbon-shaped film in the X direction 1 has a plurality of first openings 9. The first openings 9 are rectangular punched holes created at the lower part of the vertical probe 3 corresponding to each unit a, and serve to allow the passage of the units in the Y direction 6 as shown in FIG. 6. The opening 10 is, as shown in FIG. 8 (enlarged front view of the section A of FIG. 7), a nearly T-shaped opening created in the boundary part between the adjacent units a (for example a-1 and a-2), and is created by cutting out the inner part of the curved parts 31 facing each other of the vertical probes 3. As a result, the force applied in the arrow S1 direction to the contact point 34 of the vertical probe 3 acts on the whole curved parts 31 of the vertical probes 3 by the creation of this opening 10 without being subjected to forces in complicated directions from the resin film, and resiliently deform the vertical probes 3. In other words, when viewed from another angle, the ribbon-shaped film in the X direction 1 whose basic form in its entirety is belt-shaped freely deforms in response to outside forces applied at the right angle to its surface, but does not deform against outside forces applied in the direction along its surface (whether in the longitudinal direction or in the width direction of the belt). However, in the present invention, due to the plantation of vertical probes 3 on the surface of the ribbon-shaped film in the X direction 1 and the creation of an opening 10 by cutting through the inner part of the curved parts 31 of these vertical probes 3, the ribbon-shaped film in the X direction 1 can deform in the surface direction (in the width direction of the surface) in the section of the curved parts 31 of the vertical probes 3. Incidentally, the ribbon-shaped film in the X direction does not deform in the surface direction in sections other than the curved part 31 of the vertical probe 3. The vertical probe 3 deforms (shown by broken line) by the contact pressure (arrow S . . . 1) applied to the contact point 34 part at the time of test, and this deformation generates restoring force, which acts as contact force that enables electric conduction with the contact point 34 between the chip pads on the wafer and the vertical probes 3. And the ribbon-shaped film in the X direction 1 itself functions as a means of maintaining precisely the positional relationship of a plurality of vertical probes 3 arranged in a straight line in the longitudinal direction on its surface rather than contributing to the promotion of dynamic property such as generating the contact pressure of the vertical probes 3. It also plays an important role as a means of positioning in the surface direction of the film of the vertical probes 3 when a plurality of ribbon-shaped films in the X direction 1 are arranged to constitute a unit in the X direction 5. It also functions as an insulating means between adjacent probes or between adjacent wiring lines.

And in the ribbon-shaped film in the X direction 1, as shown in FIG. 8, wiring patterns 39 are formed at the same time as the vertical probes 3 are formed. These wiring patterns 39, totaling two lines respectively from each unit a, specifically one line from two vertical probes 3 included in one unit, extend downward from the vertical probes 3 passing through the range of height of the opening 9, bend downward at the right angle at the lower end of the ribbon-shaped film in the X direction 1 and head in the horizontal direction, forms wiring lines in the area between the lower long side and the opening 9 and extend in the longitudinal direction of the ribbon-shaped film in the X direction 1. The square hole 10a near the center of the opening 10 is a hole for allowing the passage of square bars for positioning when the ribbon-shaped films in the X direction 1 are laid out together as described later on.

The following is a description of the ribbon-shaped film in the Y direction 2 with reference to the front view in FIG. 9. The ribbon-shaped film in the Y direction 2 has a different structure from the ribbon-shaped film in the X direction 1 described above. This is because the ribbon-shaped film in the X direction 1 and the ribbon-shaped film in the Y direction 2 are assembled crosscutting each other in the grid form in such a way that the height of the contact points provided at the top of the vertical probes 3 and 4 may be reconciled. In the first place, the width of the ribbon-shaped film 2 is narrower than that of the ribbon-shaped film 1 because there is no need for a rectangular opening. And the curved part 35 of the vertical probe 4 of the ribbon-shaped film in the Y direction 2 is formed at a position lowered by a fixed distance so that, after the assembly, the curved part 35 of the vertical probes 4 of the ribbon-shaped film in the Y direction 2 may not interfere with the curved part 31 of the vertical probes 3 of the ribbon-shaped film in the X direction 1. For this reason, the longer side part of the ribbon-shaped film 2 is removed so that the contact point 38 may protrude by a length L2 (>L1) from the upper longer side of the ribbon-shaped film in the Y direction 2.

Like the ribbon-shaped film in the X direction 1, as soon as the vertical probe 4 is formed, two wiring patterns 43 respectively from each unit a are formed along the lower longer side of the ribbon-shaped film 2, And the ribbon-shaped film in the Y direction 2 is formed by forming a plurality of this unit a. The cross-shaped opening 10 formed between adjacent units a is formed in the same form as the ribbon-shaped film 1 so that it may have the effect of absorbing the distortions of the vertical probe 4. In any case, width h including the top 42 of the vertical probe 4 of the ribbon-shaped film 2 must be smaller than the dimension of the hole H of the opening 9 of the ribbon-shaped film 1. A square hole 10a is cut out near the center of the opening 10 in the same way as the ribbon-shaped film in the X direction 1.

Figure 10:
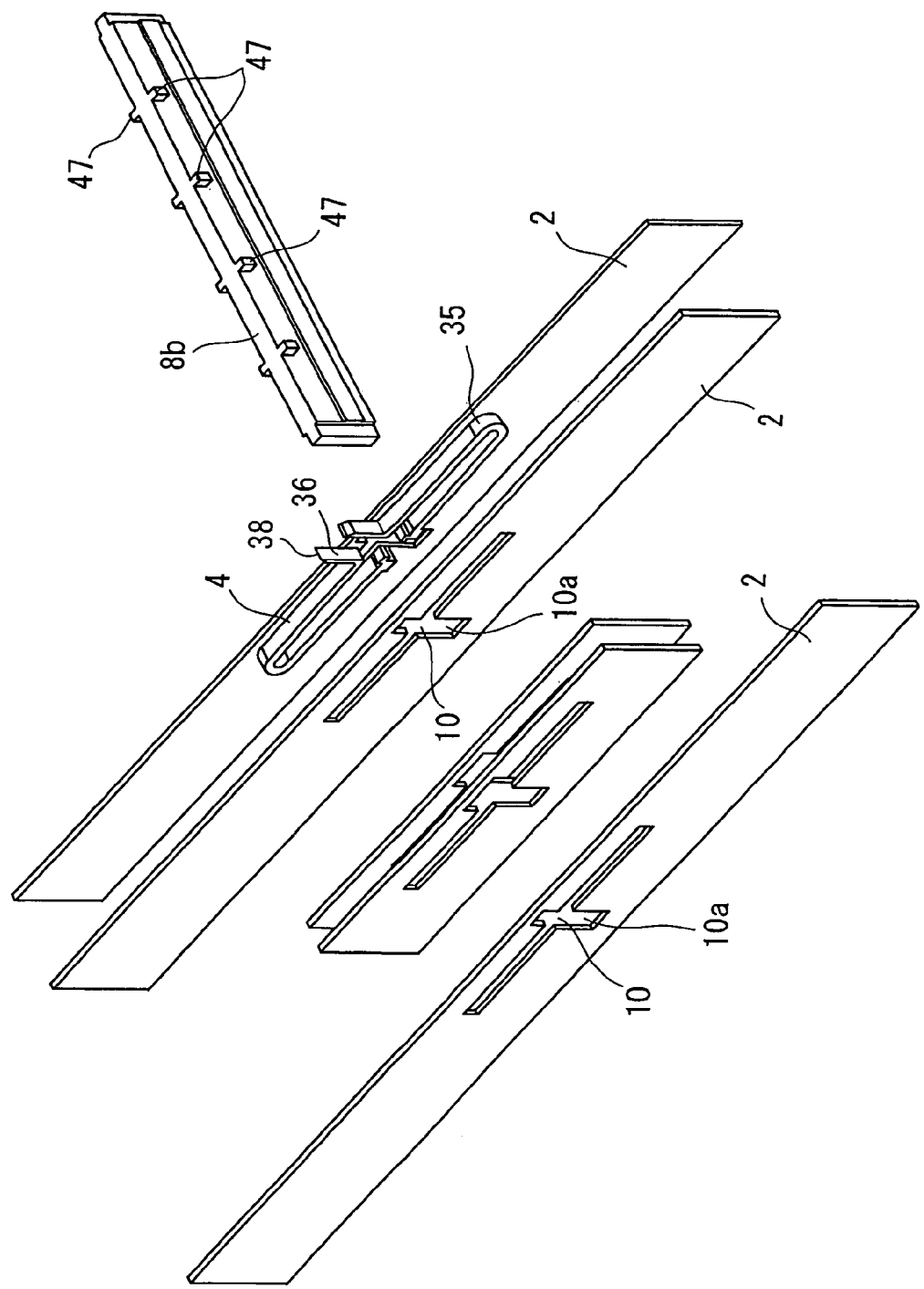
FIG. 10 is a perspective view showing the unit in the Y direction being assembled according to Embodiment 2 ditto.

The following is a description of the structure of a multiple array vertical probe assembly formed by assembling units in the X and Y directions 5 and 6 on the supporting board. FIG. 10 is an exploded perspective view describing a unit in the Y direction 6 being assembled by putting together a plurality of ribbon-shaped films in the Y direction 2. This process consists of inserting a square bar 8b having a U-shaped section shown in FIG. 11 into a square hole 10a of the opening 10 at the right angle to the surface of the ribbon-shaped films in the Y direction 2 and of holding them together in order to prevent the ribbon-shaped films in the Y direction 2 from being dissociated when a plurality of ribbon-shaped films in the Y direction 2 are put together (in other words, put them in order). Each vertical probe 4 has protrusions 44 formed in advance and these protrusions 44 and the square bar 8b are joined together by rendering these protrusions 44 slidable with the square bar 8b and by making the top of the protrusions bump against the side surface of the square bar 8b and each ribbon-shaped film in the Y direction 2 is positioned in the longitudinal direction. Each square bar 8b has a plurality of protrusions 47 at predetermined intervals on its side surface. These protrusions 47 serve to determine the interval of arrangement of a plurality of ribbon-shaped films in the Y direction 2 composing a unit in the Y direction 6. And the arrangement of a plurality of (or it may be one) ribbon-shaped film or films in the Y direction at equal intervals between a protrusion 47 and the following protrusion 47 enables to determine the pitch of contact points 38 in the X direction. A shelf part 49 extending in the longitudinal direction of the square bar 8b by protruding outward from the protruding surface of the protrusion 47 is provided at a position below the protrusion 47 on the side surface of the square bar 8b. This shelf part 49 plays the role of hooking a protrusion 44 formed on the vertical probe 4 of the ribbon-shaped film in the Y direction 2 and supporting the vertical probe 4 from below when the square bar 8b is inserted into the opening 10a of the ribbon-shaped film in the Y direction 2.

Figure 11:
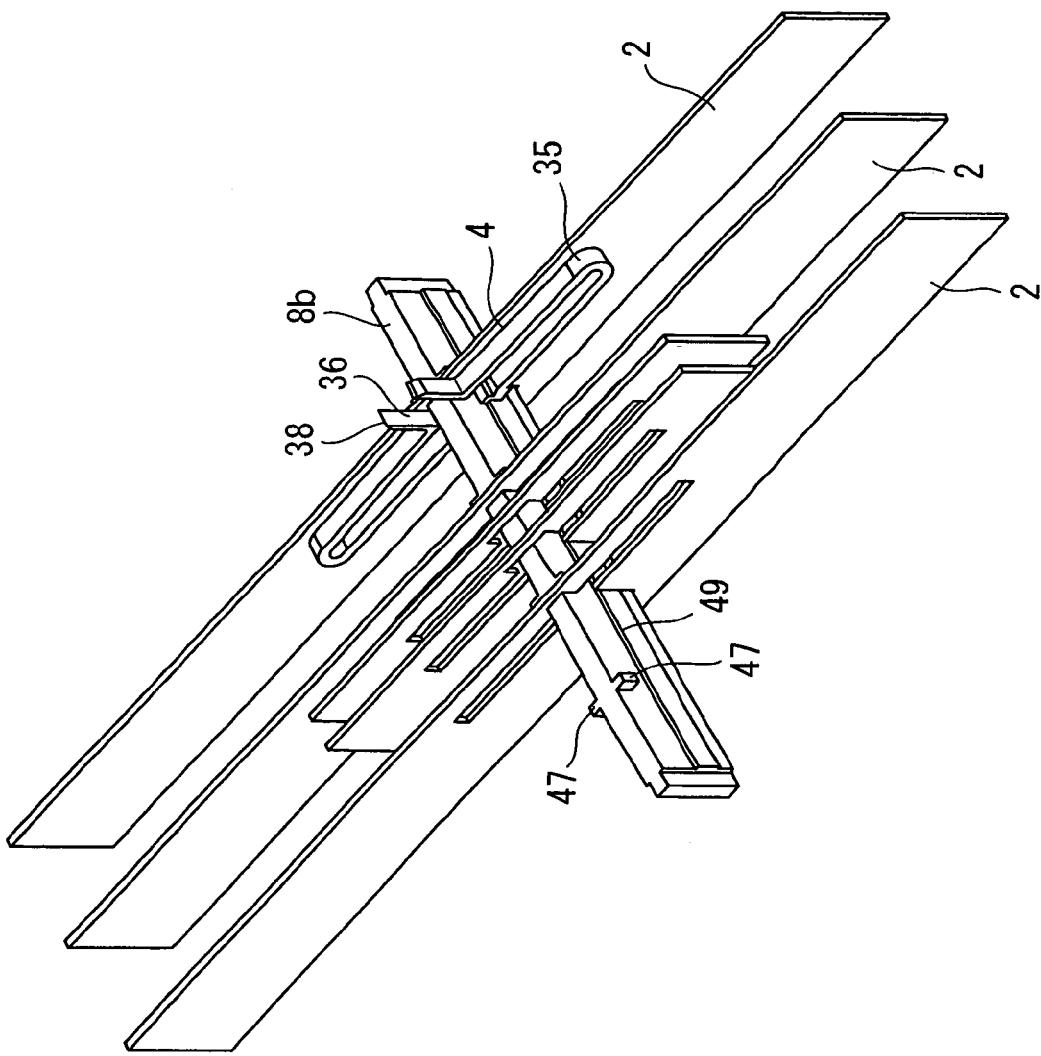
FIG. 11 is a perspective view of the square bar according to Embodiment 2 ditto.

Likewise, for the unit in the X direction 5, in order to prevent ribbon-shaped films 1 from dissociating themselves (in other words, to put them in order) as shown in FIG. 6, a square bar 8a with a U-shaped section shown in FIG. 11 is inserted into a square hole 10a of the opening 10 at the right angle of the ribbon-shaped films 1 to hold them together. And as shown in FIG. 8, each vertical probe 3 has a protrusion 42 formed in advance, and these protrusions and the square bar 8a are joined together by rendering these protrusions 42 slidable with the square bar 8a and by bringing the top of the protrusions into contact with the side surface of the square bar 8a by bumping against the latter and thus each ribbon-shaped film in the X direction 1 is positioned in the longitudinal direction. In this way, units in the X and Y directions 5 and 6 are respectively formed as slender blocks. Incidentally, props 8a and 8b are made of non-conductive materials or materials coated with an insulating material. Each square bar 8a has a plurality of protrusions 46 at predetermined intervals on its side surface. These protrusions 46 serve to determine the arrangement interval between a plurality of ribbon-shaped films in the X direction 1 constituting a unit in the X direction 5. And the arrangement of a plurality of (may be one) ribbon-shaped film or films in the X direction 1 at equal intervals between a protrusion 46 and the following protrusion 46 enables to determine the pitch of contact points 34 in the Y direction. A shelf part 48 extending in the longitudinal direction of the square bar 8a by protruding outward further than the protruding surface of the protrusion 46 is provided at a position below the protrusion 46 on the side surface of the square bar 8a. This shelf part 48 plays the role of hooking a protrusion 42 formed on the vertical probe 3 of the ribbon-shaped film in the X direction 1 and supporting the vertical probe 3 from below when the square bar 8a is inserted into the opening 10a of the ribbon-shaped film in the X direction 1.

Figure 12:
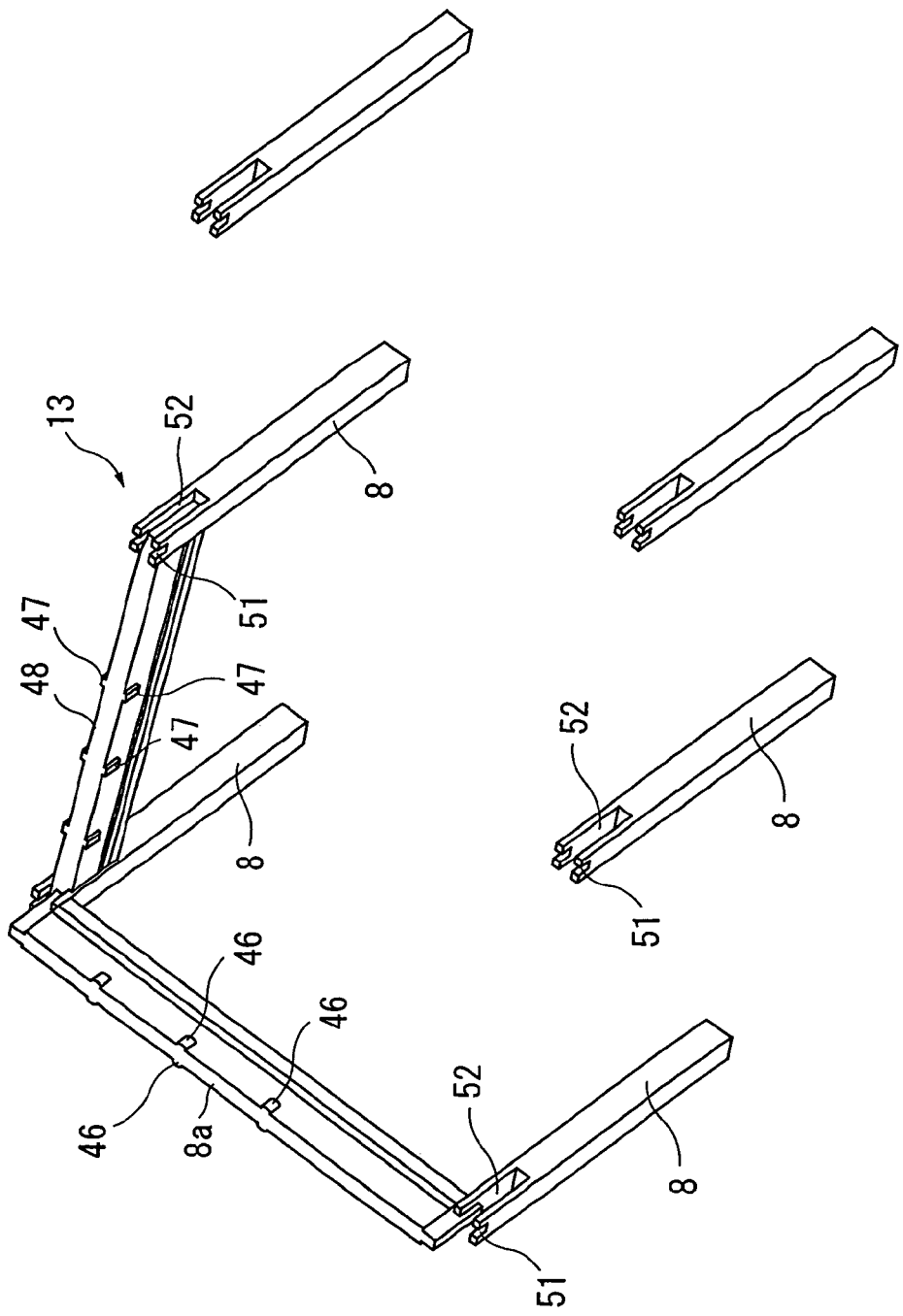
FIG. 12 is a partial perspective view showing the structure of a mounting stand according to Embodiment 2 ditto.
Figure 13:
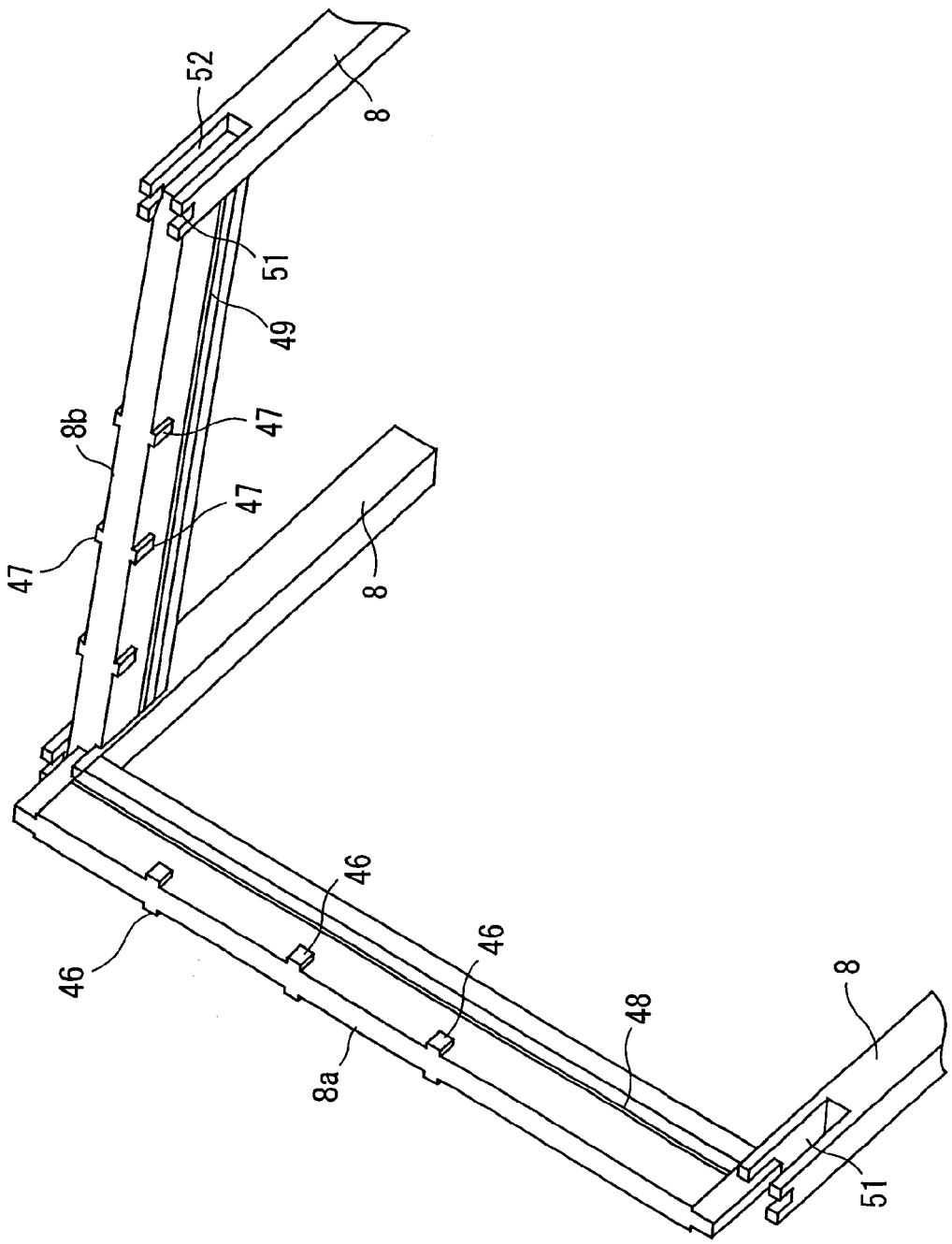
FIG. 13 is a partial perspective view showing the structure of a mounting stand according to Embodiment 2 ditto.
Figure 14:
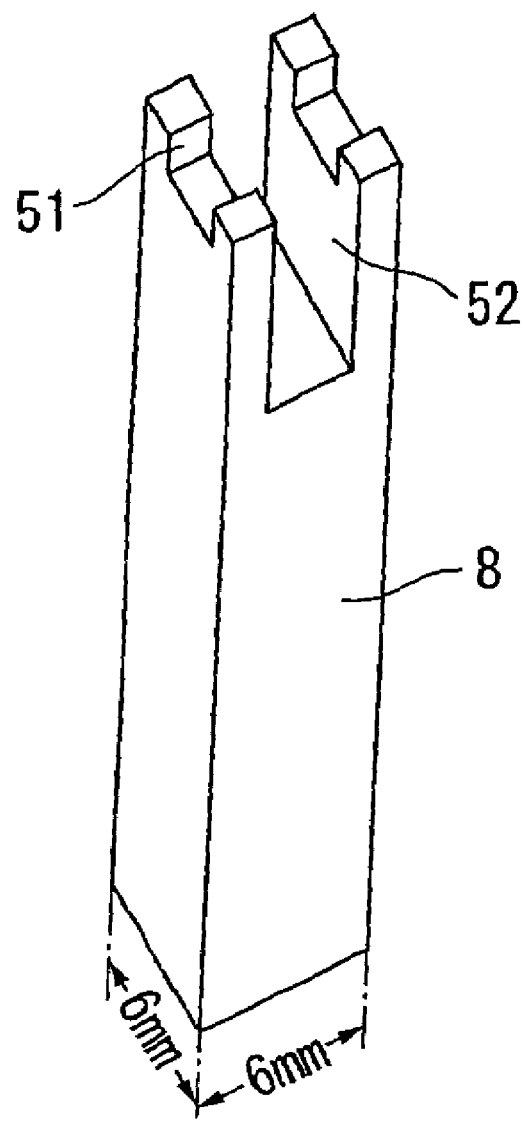
FIG. 14 is a perspective view of a prop according to Embodiment 2 ditto.

The following is a description of the structure of a multiple array vertical probe assembly formed by assembling units in the X and Y directions on the supporting board. FIG. 12 is a partial perspective view showing a mounting stand serving as the supporting stand 13 of a multiple array vertical probe assembly (showing only the framework part actually in the process of construction). As this figure shows, the mounting stand 13 on which the units in the X and Y directions 5 and 6 will be mounted consists of a supporting board (not shown. This is a board laid out below the props 8.) and a plurality of props 8 erected on this supporting board. The props 8 are erected separately at four corners of the crossing area 100 of the unit in the X direction 5 with the unit in the Y direction 6, and each of the props 8 is arranged in such a way as to be able to support the unit in the X direction 5 and the unit in the Y direction 6 for the adjacent crossing area 100. The prop 8 is made up of a rod with a rectangular section of a predetermined dimension as shown in FIG. 13 and FIG. 14, and its upper part is notched from the top surface downward and has a first groove 51 and a second groove 52 mutually crossing at the right angle as shown in details in FIG. 14. The first groove 51 is a groove cut relatively shallowly, and the second groove 52 is a groove hollowed out more deeply than the first groove 51. With regard to the first groove 51, the props 8 are erected at a predetermined interval so that the first groove 51 may itself extend in the Y direction. And the first groove 51 is fitted with a square bar 8a (see FIG. 12 and FIG. 13). And with regard to the second groove 52, the props 8 are erected at a predetermined interval so that the second groove 52 may itself extend in the X direction. The second groove 52 is fitted with a square bar 8b (see FIG. 12 and FIG. 13). The supporting board and the prop 8 are, like the square bars 8a and 8b described above, made up of a non-conductive material or a material coated with an insulating material. In particular, the supporting board is preferably made of silicon or a material having a thermal expansion rate similar to that of silicon so that the supporting board may be able to cope with burn-in tests.

The plurality of props 8 are erected in the matrix form on the supporting board so that the pitch of erecting the props 8 in the X direction may be p1 and the pitch in the Y direction may be p2.

So far, the structure of the multiple array vertical probe assembly has been described for each block constituting the same, and the following is the description of the process of assembling these blocks.

To begin with, examples of dimensions of various components will be shown so that they may serve as the yardstick of evaluating the size of the whole multiple array vertical probe assembly. The ribbon-shaped films 1 and 2 as described above consist of, for example, a polyimide film approximately 12 $\mu$m thick coated with a beryllium copper foil 20-30 $\mu$m thick and on this film the vertical probes 3 and 4 and wiring lines 39 and 43 are patterned. Now, supposing that 10 mm square semiconductor chips are arranged in the X-Y directions on a wafer to be tested, it will be understood that the width of the units in the X and Y directions 5 and 6 respectively consisting of a plurality of ribbon-shaped films 1 and 2 can be approximately 9 mm wide at the maximum. And supposing that each prop 8 erected on the ribbon-shaped film in the X direction 1 adapted to a 10 mm pitch is 0.6 mm square (as shown in FIG. 14), and that the width in the vertical direction for letting a wiring line pass in the longitudinal direction of the ribbon-shaped film in the X direction 1 (dimension of gap between a wiring line and another wiring line) is 0.2 mm, the opening 9 can be 9 mm wide at the maximum. This means that, supposing that a ribbon-shaped film in the X direction 1 is 40 $\mu$m thick, 225 ribbon-shaped films in the Y direction can be mathematically arranged within 9 mm and made to pass through the opening 9. However, actually their number will be determined according to the number of pads in a line on a chip.

Regarding the mounting stand 13 shown in FIG. 12, the dimensions of the supporting board are set at nearly the same values as those of the wafer to be tested, and the props 8 are erected according to the number of chips in such a way that four props 8 may represent the area of a chip. And as an example, their pitch is set at p1=p2=10 mm, and the height of the prop 8 is set at a level that removes the possibility of the lower side of the ribbon-shaped film in the X direction 1 touching the supporting board when the units in the X and Y directions 5 and 6 are mounted.

To begin with, a plurality of sets of units in the X direction 5 assembled in advance by inserting successively square bars 8a in the square hole 10a of a plurality of ribbon-shaped films in the X direction 1 are arranged in parallel by adjusting their pitch, and both ends of a square bar 8a are fitted into the first groove 51 of two props 8 erected at intervals in the Y direction, and are mounted between the two props 8. Then, a ribbon-shaped film or films in the Y direction 2 is or are inserted from the Y direction at the right angle into the opening 9 of each film 1 of a unit in the X direction 5. This insertion may be made by a ribbon-shaped film or films in the Y direction 2 one by one at a time, or by a plurality of them corresponding to a unit. When the insertion of ribbon-shaped films 2 is completed, a square bar 8b is inserted successively into the square holes 10a of ribbon-shaped films 2. Both ends of the square bar 8b are fitted into the second groove 52 of two props 8 erected at sparse intervals in the X direction, and are mounted between the two props 8. As the second groove 52 of the prop 8 is cut deeper than the first groove 51, the height of erecting the square bar 8b is set at a lower position than the height of erecting the square bar 8a. This creates a difference in level between the unit in the X direction 5 and the unit in the Y direction 6 (see FIG. 12 and FIG. 13). In this way, a block of units in the X and Y directions 5 and 6 is assembled in the grid form.

The following is a description of the method of correctly positioning the top of probes at the target positions even if there is a variation in the thickness direction of lamination of the ribbon-shaped film in the Y direction 2 to be laminated with reference to FIG. 10 and FIG. 11. For assembling the unit in the Y direction 6 described in FIG. 10, the ribbon-shaped films in the Y direction 2 are inserted into the opening 9 of a ribbon-shaped film in the X direction 1 to be fixed there, and a square bar 8b is inserted into the opening 10a of the ribbon-shaped films in the Y direction 2. Each square bar 8b has protrusions 47, and when the width dimension of the opening 10a is small, the protrusions 47 serve as stoppers of inserting movement between the ribbon-shaped film in the Y direction 2 and the square bar 8b and cause the square bar 8b to come to a full stop. The positions of the protrusions 47 correspond with the positions for the probe contact point 38 to be positioned, and the presence of a plurality of protrusions 47 in a square bar 8b enables to prevent important positional displacement by correcting the accumulated positional displacement (positional shift in the direction of putting together) resulting from variations in the thickness of the ribbon-shaped film in the Y direction 2 within the range of pitch of the protrusions 47 and to bring the top of probes to positions correctly corresponding to those of the pads in the wafer.

Apart from the problem of preventing the positional shifts described above, when a square bar 8b is inserted into the opening 10a of the ribbon-shaped film 2 in the Y direction 2, a shelf part 49 provided and extending in the longitudinal direction of the square bar 8b comes into contact with a protrusion 44 formed on the vertical probe 4 of the ribbon-shaped film in the Y direction 2 and plays the role of supporting from below the vertical probe 4. And the top of the protrusion 44 and the square bar 8b are joined together when the top of the protrusion 44 strikes against the side surface of the square bar 8b, resulting in the positioning of each ribbon-shaped film in the Y direction 2 in the longitudinal direction. This action of the top of the protrusion 44 coming into contact with the side surface of the square bar 8b has the effect of not only positioning in the longitudinal direction as mentioned above but also of preventing any positional shifts of the vertical probe 4 due to the thermal expansion of the ribbon-shaped film in the Y direction 2 during a burn-in test.

The above points are similar with regards to the ribbon-shaped film in the X direction 1 and the unit in the X direction 5 constituted by the same.

Then, the block of these units in the X and Y directions 5 and 6 assembled in the grid form is placed on the supporting board. In this way, the units in the X and Y directions are fixed with the supporting board, completing a multiple array vertical probe assembly. In addition, as the units in the X and Y directions 5 and 6 are vertically positioned by the first groove 51 and the second groove 52 formed in the prop 8, it is possible to level the height of the top 32 and 42 of the vertical probes 3 and 4.

According to the present Embodiment 2, as the units in the X and Y directions are fixed on the props in the grid form, even if ribbon-shaped films expand due to differences in temperature, the thermal expansion is absorbed within the unit corresponding to a chip and does not affect the adjacent units, and thus the whole expansion can be contained. As a result, any shift in pitch between the chip pads and the vertical probes is eliminated and it will be possible to measure property by using a multiple array vertical probe assembly.

Figure 15:
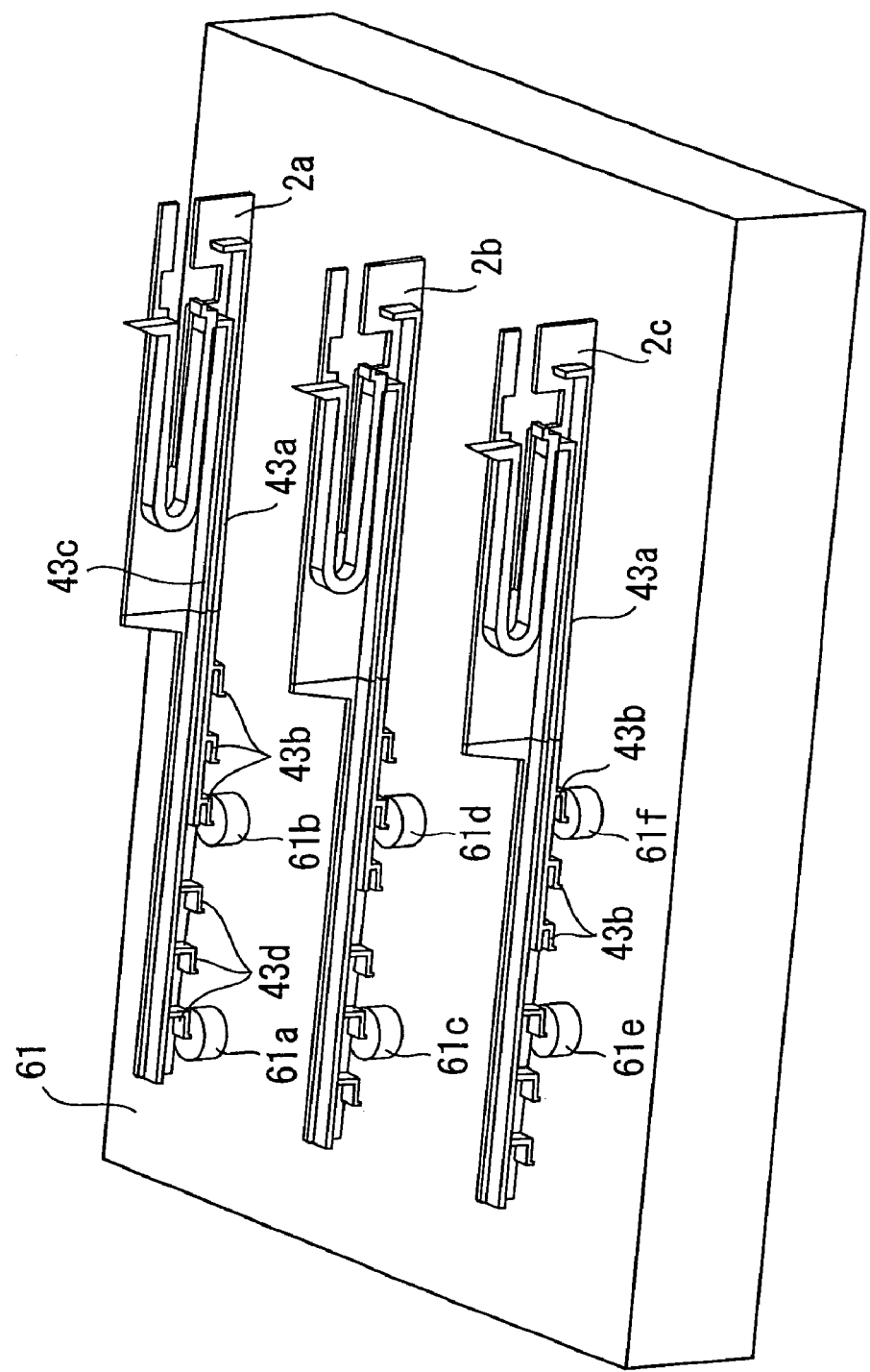
FIG. 15 is a perspective view showing the wiring structure of the ribbon-shaped films in the X and Y directions according to Embodiment 1 and 2 ditto.

FIG. 15 is a view showing the wiring structure at a film end of the wiring lines 39 and 43 formed on the ribbon-shaped films in the X and Y directions 2. The wiring structure shown in FIG. 15 enables the terminals 61a, 61b, 61c, 61d, 61e and 61f created on the printed wiring board 61 and the terminals for the ribbon-shaped films in the Y direction 2 to arrange the ribbon-shaped films in the Y direction 2 at fine intervals. However, due to coarse intervals between terminals on the printed board 61, the establishment of correspondence one against another between the ribbon-shaped film in the Y direction 2 and the terminals 61a, 61b, 61c, 61d, 61e and 61f of a printed board 61 enables to avoid the necessity of making a large variety of ribbon-shaped films in the Y direction 2. In this case, spring deforming terminals not requiring electric conduction should be insulated. The wiring structure of the present invention provides a means of conducting by contact between the terminals on the printed board 61 and the terminals of the ribbon-shaped films in the Y direction 2 without soldering. The wiring 43a includes a plurality of spring deformable terminals 43b (three terminals in the example of FIG. 15). The wiring 43c also includes a plurality of spring deformable terminals 43d. Even if the intervals among the terminals 61a, 61b, 61c, 61d, 61e and 61f on the printed board 61 are coarse, resilient terminals of a plurality of terminals 43b to 43d of the ribbon-shaped films in the Y direction 2 arranged by a fine pitch are used for electric conduction. Since they are resilient terminals, a pressure applied from above (not shown) on the ribbon-shaped films in the Y direction brings the resilient terminals into contact with the terminals on the printed board with a nearly uniform contact pressure.

Embodiment 3

Figure 16:
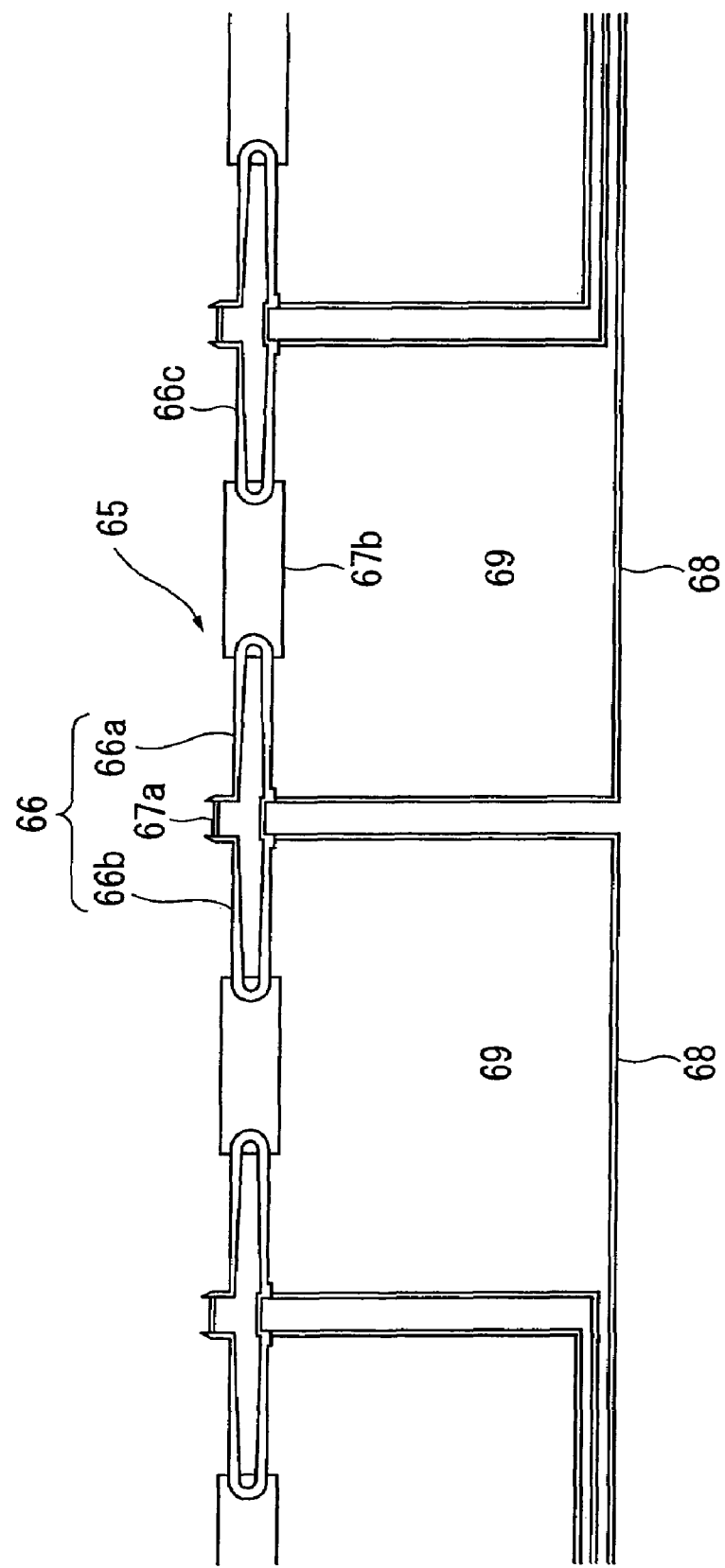
FIG. 16 is a front view showing the structure of a ribbon-shaped film according to Embodiment 3 of the present invention.

The following is a detailed description of the Embodiment 3 of the present invention with reference to drawings. FIG. 16 is a front view showing an example of the ribbon-shaped film according to the Embodiment 3 of the present invention. The Embodiment 3 of the present invention takes care to drastically simplify the structure of the ribbon-shaped film in the X direction or the ribbon-shaped film in the Y direction. Specifically, in the present Embodiment 3, the film material of the ribbon-shaped film 65 is curtailed to the limit and the ribbon-shaped film 65 consists of a first connecting member 67a connecting a vertical probe pair 66 consisting of a pair of vertical probes mutually facing each other 66a and 66b, a second connecting member 67b connecting another vertical probe 66c positioned behind a vertical probe (for example 66a) and wiring lines 68 extending downward from the vertical probes 66a, 66b and 66c. The wiring lines 68 form openings 69 by bending at a predetermined position below the vertical probes 661, 66b and 66c, and have the general structure similar to the ribbon-shaped film in the X direction 1 in the Embodiment 2 described above.

The adoption of such a structure enables to realize a probing device of a simpler structure.

As described above, as the present invention provides a structure of fixing the whole after arranging the units in the X and Y directions in the grid form and positioning the same, it is possible to contain the expansion of the whole structure even if the ribbon-shaped film may expand due to differences in temperature. As a result, any shift in pitch between the chip pads and the vertical probes will be eliminated and it will be possible to measure characteristics by means of a multiple array vertical probe assembly.

Embodiment 4

Figure 17:
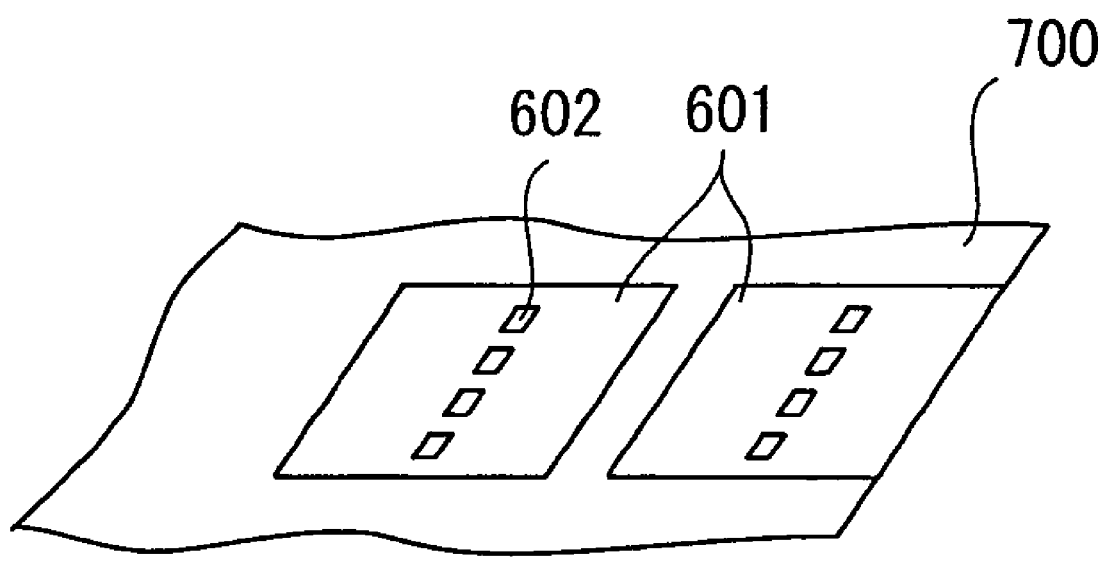
FIG. 17 is a perspective view of a test piece according to Embodiment 4 of the present invention.
Figure 18:
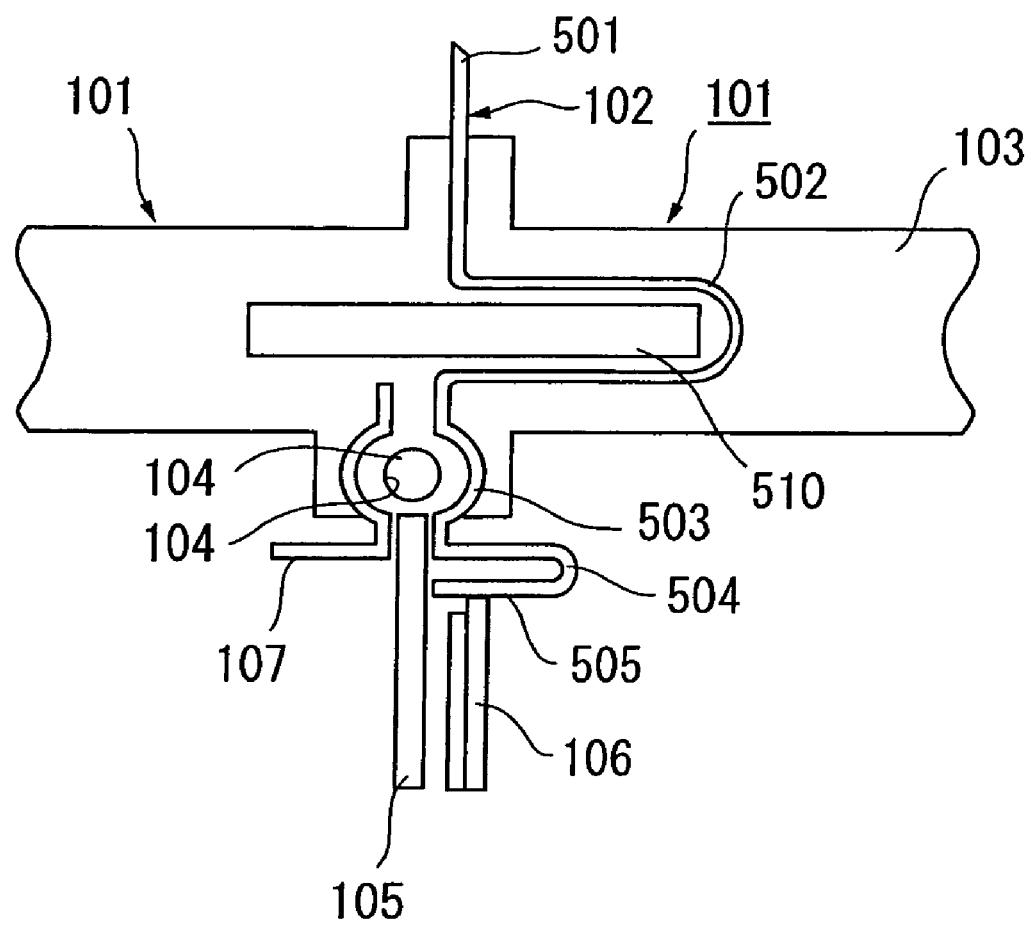
FIG. 18 is a side view of a probe according to Embodiment 4 ditto.

The following is a description in details of the Embodiment 4 of the present invention with reference to drawings. FIG. 17 is a perspective view of a test piece according to the Embodiment 4 of the present invention, and FIG. 18 is a side view of a probe in Embodiment 4. FIG. 17 and FIG. 18 show the case of a probing device wherein the elements of the probe 101 consist of an electric conducting part 102 and a film part 103. By arranging the elements of this probe 101 in various directions, it is possible to make a memory-related chip or the like correspond to the pad of a line or a plurality of lines. In other words, by arranging a plurality of layers of probe 101 at an appropriate pitch horizontally facing the paper surface and by arranging a plurality of layers in the direction of depth facing the paper surface, it is possible to correspond to the arrangement of pads of a plurality of lines. The term "probe" used here means a contact by which electric contact provides contact force accompanied by resilient deformation, and is not limited to probes used only in the probing device for testing LSI circuits generally referred to. Similarly, the term "probing device" means devices providing electric contacts. This definition applies likewise hereafter.

In FIG. 17, the code 600 represents a wafer. The code 601 represents a chip arranged on a wafer, and the code 602 represents a pad arranged within a chip. The contact 1 described below is particularly effective when it is applied to the tests of semiconductor wafer on which the chip 601 contains the pads 602 arranged in a line. The probe 101 of the present invention is effective when the test of similar arrangement is necessary not only for testing semiconductor wafers but also for testing liquid crystal.

FIG. 18 shows the arrangement relationship of component parts related to the electric conductive part 102 and the film part 103. The electric conductive part 102 is made up of conductive materials and includes an input part 501 to be brought into contact with the electrode pads of chips to be tested, a deforming part 502, a fixing part 503, an output deforming part 504 and an output part 505. The deforming part 502 contains an arc in its outline, and the presence of an arc far from the input part 501 and the fixing part 503 results in an important amount of deformation. When a round bar 104 coated with insulating material is inserted into the arc of the fixing part 504 and the pad 602 is brought into contact with the input part 501, the fixing part 503 is fixed causing the deforming part 502 to deform, and its restoring force becomes the contact force between the pad 602 and the input part 501.

The electric conductive part 102 in the present invention is characterized in its fixing part 502 and output deforming part 504. The round bar 104 is inserted into the fixing part 503 and the inserted round bar 104 is supported by a fixing plate 105. A wiring assembly 106 is stuck on the fixing plate 105, and one end of the line extending vertically of the wiring terminal 106 enters into contact with the output part 505 resulting in the conduction of current. The output deforming part 504 also contains an arc, and when it enters into contact with a wiring terminal, it deforms and the restoring force of the output deforming part generates contact force.

When the wiring terminal 106 and the output part 505 are brought into contact while the output deforming part 504 is deformed to an appropriate extent, stable electric connection can be achieved. In Embodiment 4 of the present invention, the output deforming part 504 includes an arc. However, the form of means of generating resilient deformation is not particularly limited to arcs.

An auxiliary pattern 107, subject to the action of symmetrical force, serves to facilitate the insertion of pressure of the round bar 104 and also to increase at the same time the effect of fixing the fixing part 503.

The electric conductive part 102 and the auxiliary pattern 107 adhere on the surface of the film part 103. Various holes 510 are cut out inside the deforming part 502 so that the deforming action of the deforming part 502 in the electric conductive part 102 may not be obstructed. Holes 510 cut out in the film part 103 decrease wrinkles that may develop in the film part 103 when the deforming part 502 has deformed. Holes 108 of a diameter similar to that of the round bar 104 are cut out in the position of inserting the round bar 104 of the fixing part 503.

In the process of testing LSI circuits, when the pads 602 have shifted downward facing the paper surface until an appropriate contact force acts between the pad 602 and the input part 501 and at the same time the input part 501 also shifts downward. At this time, the deforming part 502 has deformed. When contact force acts and the restoring force of the deforming part 502 acts, the force of pushing down the round bar 104 from the fixing part 503 acts upon the upper main body of the round bar 104. As the lower end of the round bar 104 is in contact with the fixing plate 105, the length of the fixing plate 105 in the vertical direction is as short as any flexion resulting from any contact force to which it may be subjected is negligible, and the round bar 104 does not bend. When contact force acts, in the fixing part 503 there is a vector of force acting in the right and left directions due to contact force. However, no particular problem arises as the electric conductive part 102 adheres to the film part 103.

Therefore, as described above, the pads 602 and the input part 502 are in contact accompanied by contact force while the fixing part 503 is fixed, and the pads 602 and the wiring terminals 106 can obtain good electric conductivity.

Embodiment 5

Figure 19:
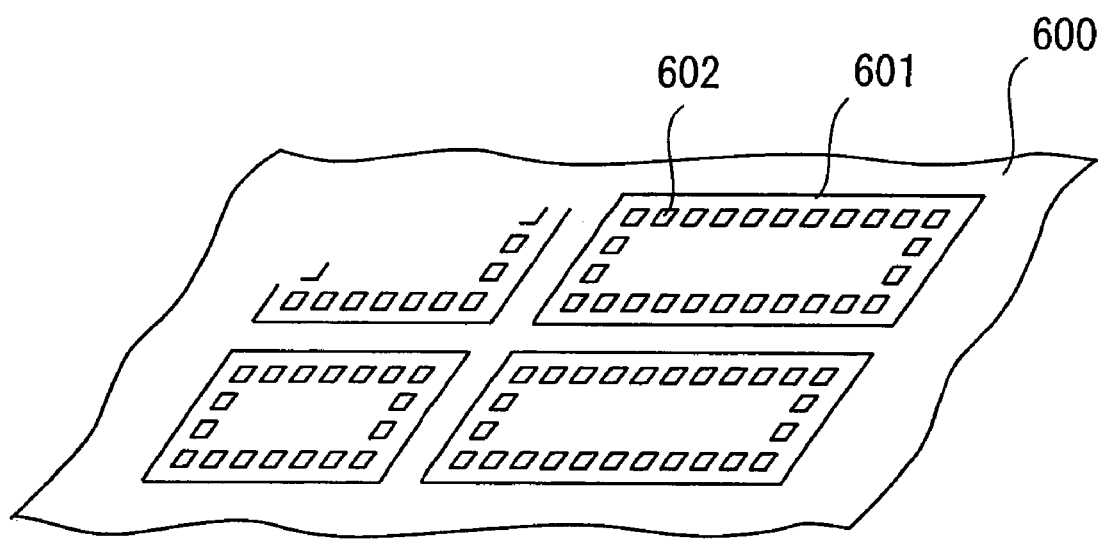
FIG. 19 is a perspective view of a test piece according to Embodiment 5 of the present invention.
Figure 20:
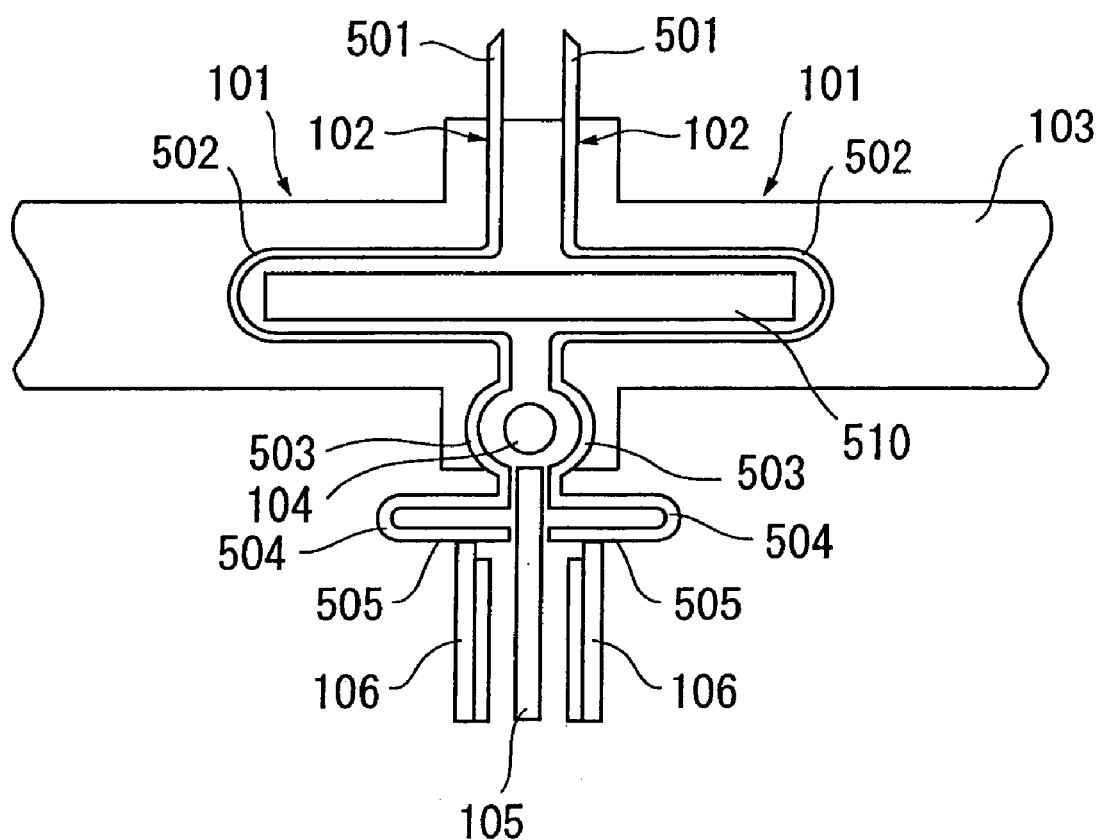
FIG. 20 is a side view of a probe according to Embodiment 5 ditto.

The following is a detailed description on Embodiment 5 of the present invention with reference to drawings. FIG. 19 is a perspective view of test pieces related to Embodiment 5 of the present invention, and FIG. 20 is a side elevation of a probe according to Embodiment 5. Embodiment 5 relates to the case where the elements of the basic vertical probe 101 consist of two electric conductive parts 102 and the film part 103. The arrangement in various directions of the elements of this probe 101 enables to cope with the chips 601 with adjacent two-line arrangement, opposite two-line arrangement of pads 702, ASIC or logic, or arrangement in rectangular form of the pads 702.

FIG. 20 shows the structure in case where two probe parts are arranged facing each other. The left-side probe part is arranged in a state of replacing the auxiliary pattern 107 described in Embodiment 4, and two input parts 501 and 501 face against the pads 602 on the left side and the right side of two adjacent chips.

The arrangement of the elements of this probe 101 in various directions enables to correspond with a line or a plurality of lines of pads for a memory-related chip or the like. In other words, the horizontal arrangement of a plurality of layers of probes 101 at an appropriate pitch facing the paper surface, and the arrangement of a plurality of layers in the depth direction facing the paper surface allow correspondence to the arrangement of a plurality of lines of pads. In addition, the arrangement at the right angle of approximately similar arrangements allows correspondence to the chips 601 with the rectangular arrangement facing the pads 602 of ASIC or logic described above in order to face the remaining pads with rectangular arrangement on the two side.

There are the wiring terminals 106 on both sides of the fixing plates 105, which enable two probes 101 to establish electric conductivity between them.

The functions of the input part 501, the deforming part 502, the fixing part 503, the output deforming part 504, and the output part 505 of the electric conductive part 102 in the present Embodiment 5 are nearly the same as Embodiment 4.

Therefore, the arrangement of Embodiment 5 and two wiring terminals sandwiching the fixing plate 105 correspond to the adjacent chip 601, and constitute an effective arrangement enabling the rectangular arrangement-type pad arrangement to obtain electric conductivity.

Embodiment 6

Figure 21:
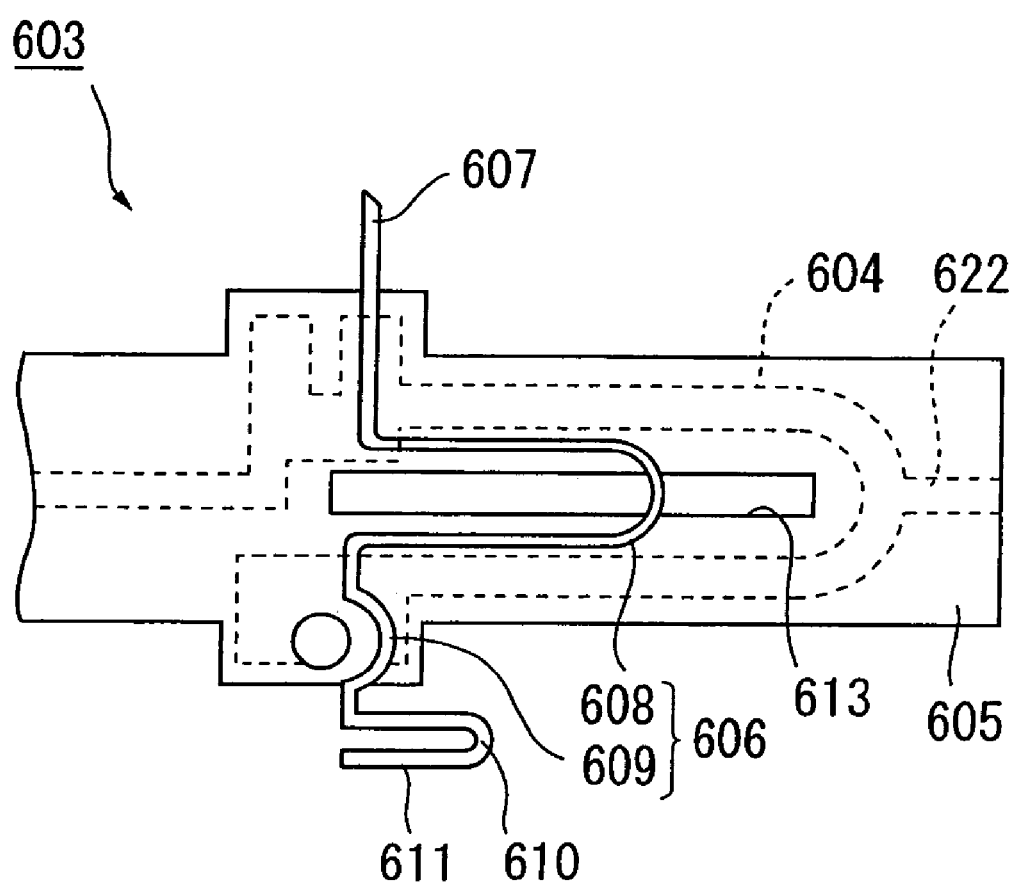
FIG. 21 is a front view of a probe according to Embodiment 6 of the present invention.
Figure 22:
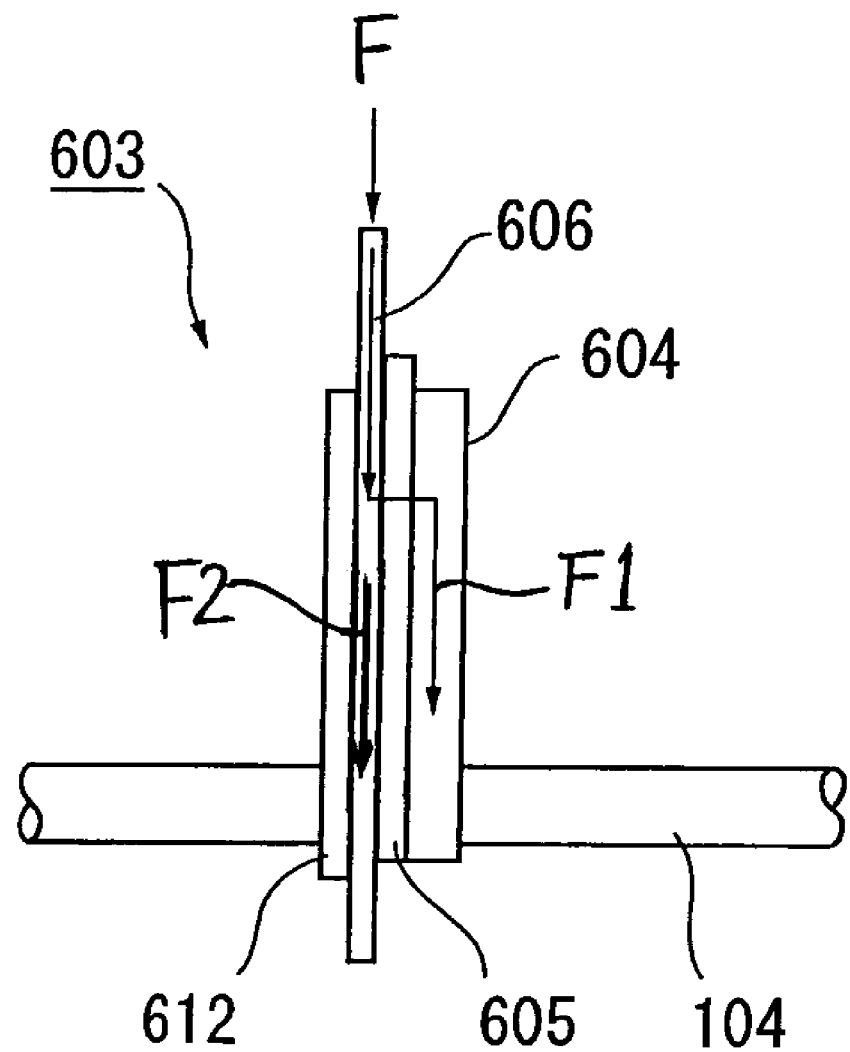
FIG. 22 is a schematic illustration of the probe part shown in FIG. 21 as seen from the side and shows the path of transmitting contact force and the path of electric signals.
Figure 23:
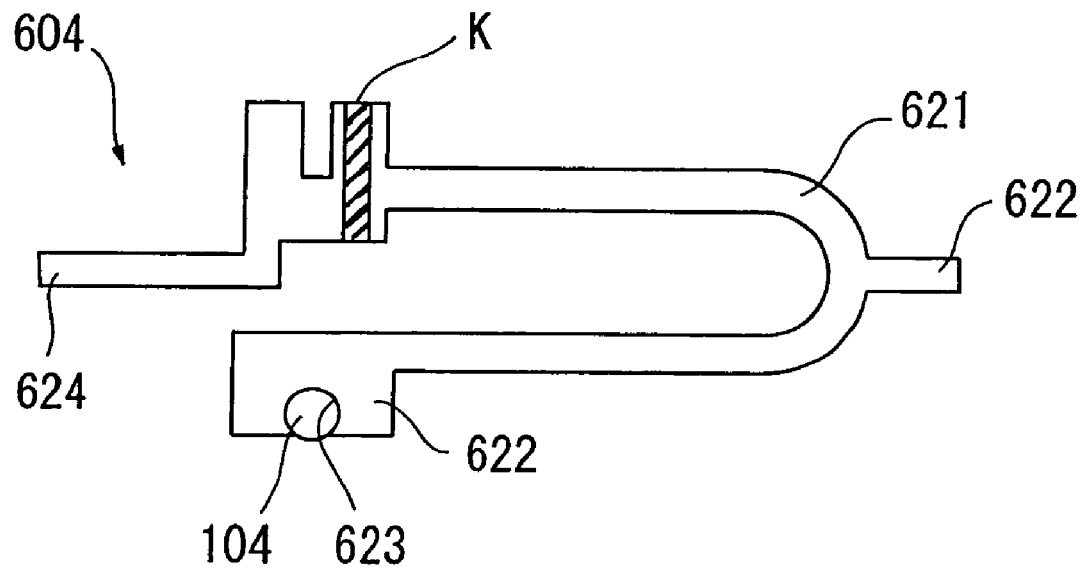
FIG. 23 is a front view of the ground line pattern according to Embodiment 6 ditto.
Figure 24:
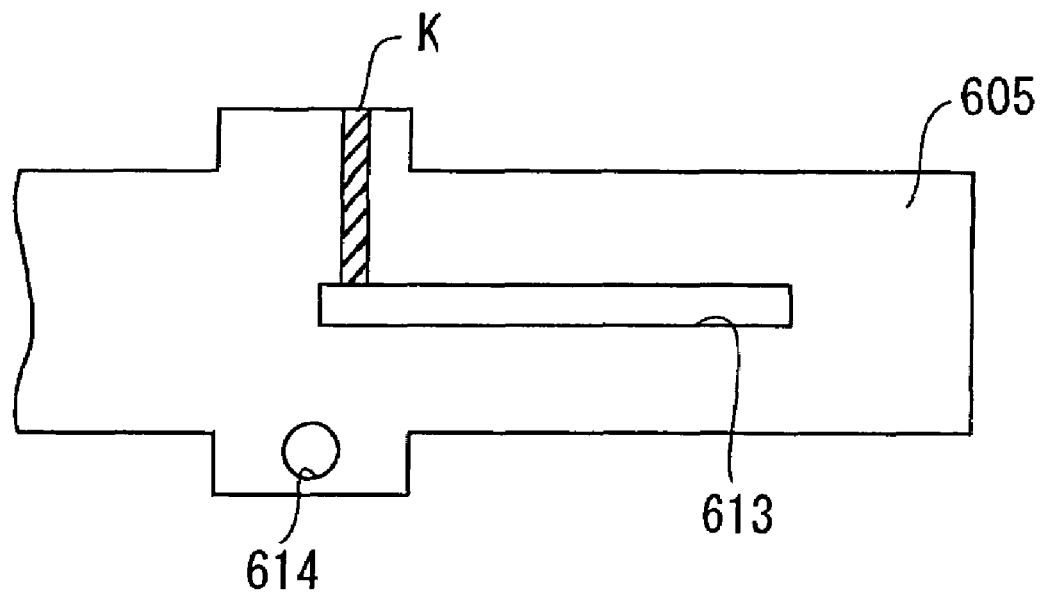
FIG. 24 is a front view of a film according to Embodiment 6 ditto.

The following is a detailed description of Embodiment 6 of the present invention with reference to drawings. FIG. 21 is a front view of a probe 603 according to the present Embodiment 6, FIG. 22 is a side elevation of the probe 603, FIG. 23 is a front view of a ground line pattern 604, FIG. 24 is a front view of a film 605. The present Embodiment 6 is designed to cope with the requirement for higher speed. Incidentally, as for the corresponding chips, like Embodiment 4, the arrangement of the elements of this probe 603 in various directions enables a memory-related chip or the like to correspond to a chip arrangement having a line or a plurality of lines of pads. Since the wiring terminals and the fixing plate according to the present Embodiment 6 can be applied according to the nearly same principles and functions as those of the wiring terminals 106 and the fixing plate 105 described in Embodiment 4, their description in the present Embodiment is omitted.

Generally, attempts to secure contact force by taking advantage of the form of materials having a large sectional secondary moment of a rectangular section results in an expansion of the width of the material (vertical dimension on the paper surface). This runs counter to the requirement for higher speed, since any attempt to accumulate contacts in the direction of multiple layers (in the vertical direction on the paper surface) increases electric capacity. On the other hand, contacts require an adequate contact force. The present Embodiment provides a method for securing contact force while reducing the width of material of the electric conductive part, a method involving the ground line pattern 604 related to force wherein an electric conductive part 606 plays a part relating to electric conductivity. Incidentally, the electric conductive part 606 and the ground line pattern 604 are linked by the film 605, and the two members, the electric conductive part 606 and the ground line pattern 604, enable to maintain electric insulation while being linked by a part K where the force of FIG. 23 is transmitted mechanically.

FIG. 21 describes the electric conductive part 606 by a solid line. In this electric conductive part 606, the code 607 represents an input part, 608 represents a deforming part, 609 represents a fixing part, 610 represents an output deforming part and 611 represents an output part. The main functions of the electric conductive part 606, having a nearly same structure as that of the electric conductive part 102 described in Embodiment 4, are nearly the same. However, it is different in that the line width of each part and the distance from the round bar 104 are smaller. In the middle of the input part 607, the electric conductive part 606 is mechanically connected with the ground line pattern 604 through the film 605. In other words, the surface of the ground line pattern 604 is mechanically connected with the film 605, and the electric conductive part 606 is mechanically connected with the input part 607 in the vicinity of the fixing part 609.

Upon having moved below the pads (not shown) and having pushed down the input part 607, in the oblique line part K shown in FIG. 23, the electric conductive part 606 and the film 605 integrate and move in the same way. The force acting as contact force is nearly the sum of the restoring force generated by the respective deformation of the deforming part 621 of the ground line pattern 604 and the deforming part 608 of the electric conductive part 606. However, in the present Embodiment, as described above, due to the possibility of coping with a small stress with the deforming part 608 of the electric conductive part 606 having a small sectional secondary moment, the impact of the width of material playing a part in the sectional secondary moment is significant, and even if the deforming part 621 of the ground line pattern 604 is outside of the deforming part 608 of the electric conductive part 606, contact force is generated mostly by the restoring force of the ground line pattern 604. This enables to miniaturize the electric conductive part 606 and at the same time to obtain a large vertical movement of the input part 607 and the optimum contact force.

As it is possible to widen and narrow only the part getting into contact with the top of pads of the input part 607 by using a partial etching technique or a partial plating technique, it is possible to achieve the technical purpose by choosing these techniques as required depending on the usage required.

FIG. 22 is the right-side view of FIG. 21, showing the electric conductive part 606 on which the film 605 and the insulating film 612 are pasted. The film 605 is pasted on the surface of the ground line pattern 604. As described above, the contact force applied on the input part 607 results in the transmission of force shown by the arrow F in FIG. 22, and the round bar 104 supports the contact force. In other words, the contact force applied to the input part 607 of the electric conductive part 606 is transmitted from the electric conductive part 606 to the film 605 and the ground line pattern 604 (as shown by the arrow F2 in FIG. 22), and is supported by the resilient deformation of the deforming part 608 of the electric conductive part 606 and the deforming part of the ground line pattern 604 together with the film 605. As for the conduction of electric signals, the electric signals inputted into the inputting part 607 of the electric conductive part 606 pass through the electric conductive part 606 for their transmission (as shown by the arrow F2 in FIG. 22).

In FIG. 23, the round bar 104 is pressure fitted into an arc part 623 of a fixing part 622 of the ground line pattern 604. The protruding part 622 of a deforming part 621 and a protruding part 624 on the left side are connected respectively when they are arranged in a plural number horizontally at a predetermined pitch. Therefore, even if the ground line pattern 604 is not connected with the wiring ground, it is possible to connect it with the ground at suitable points. For example, the arrangement of terminals similar to the deforming part 609 at points where ground connection is required enables to connect with the ground. In FIG. 23, this is omitted because it is within a range of easy assumption.

FIG. 24 shows the film 605. This film 605 has nearly the same functions as that of Embodiment 4, and is respectively mechanically connected with the electric conductive part 606 and the ground line pattern 604. In the meanwhile, the film 605 includes a hole 613 corresponding to the hole 510 of Embodiment 4 and a hole 614 for inserting the round bar 104.

Figure 25:
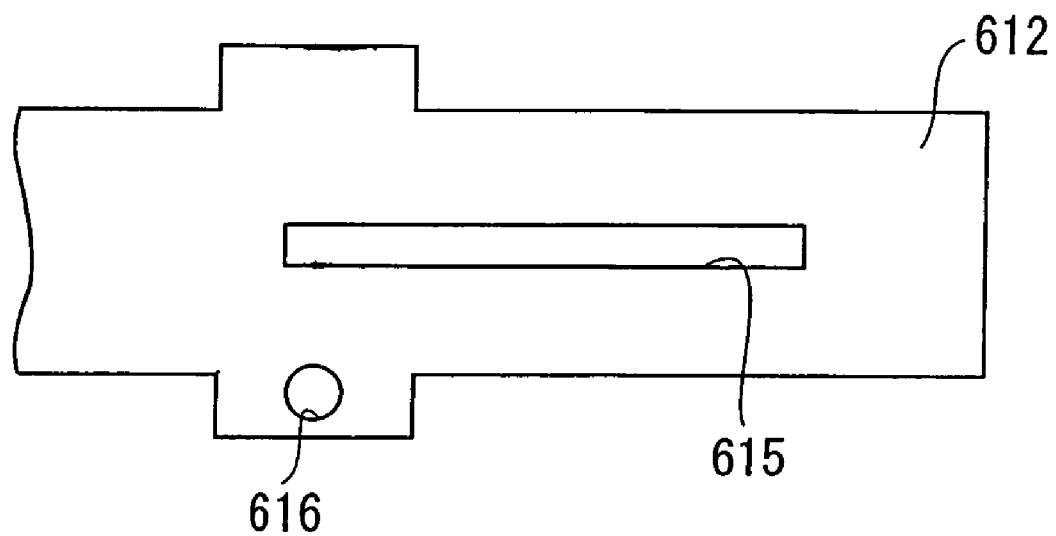
FIG. 25 is a front view of an insulating film according to Embodiment 6 ditto.

FIG. 25 shows an insulating film 612 pasted on the electric conductive part 606. This insulating film 612 must be respectively in an insulated state when the probes 603 are arranged in the thickness direction. By pasting this insulating film 612 in such a way that they may encircle the electric conductive part 606 except in the vicinity of the positions where the inputting part 607 is in contact with the pads and in the vicinity of the positions where the output part 611 is in contact with the wiring terminals 106, the respective electric conductive part 606 will have an electrically independent structure. Incidentally, the insulating film 612 includes a hole 615 corresponding to the hole 613 of the film 605 and a hole 616 for inserting the round bar 104.

Embodiment 7

Figure 26:
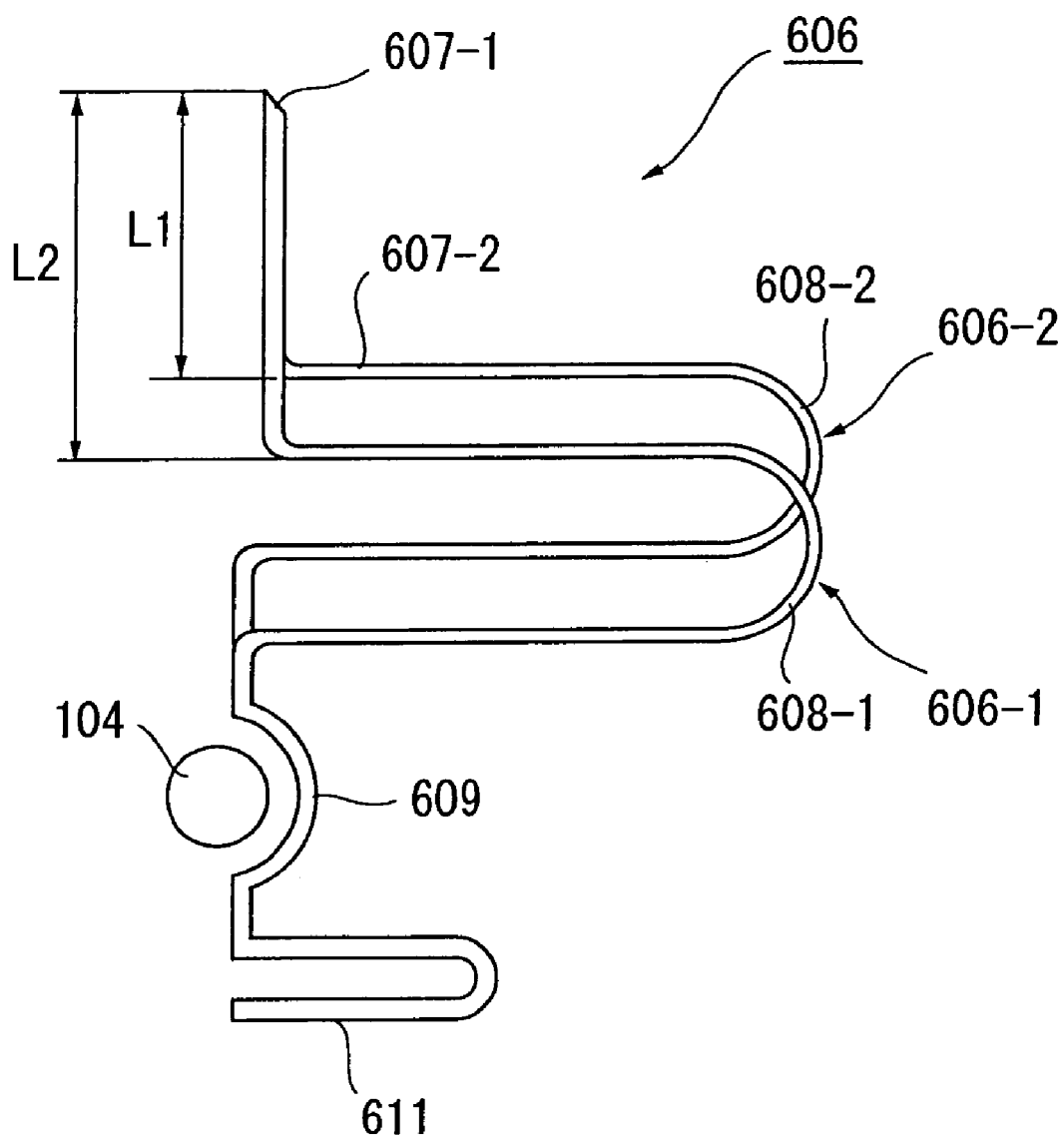
FIG. 26 is a front view of the current conductive part of a probe according to Embodiment 7 of the present invention.
Figure 27:
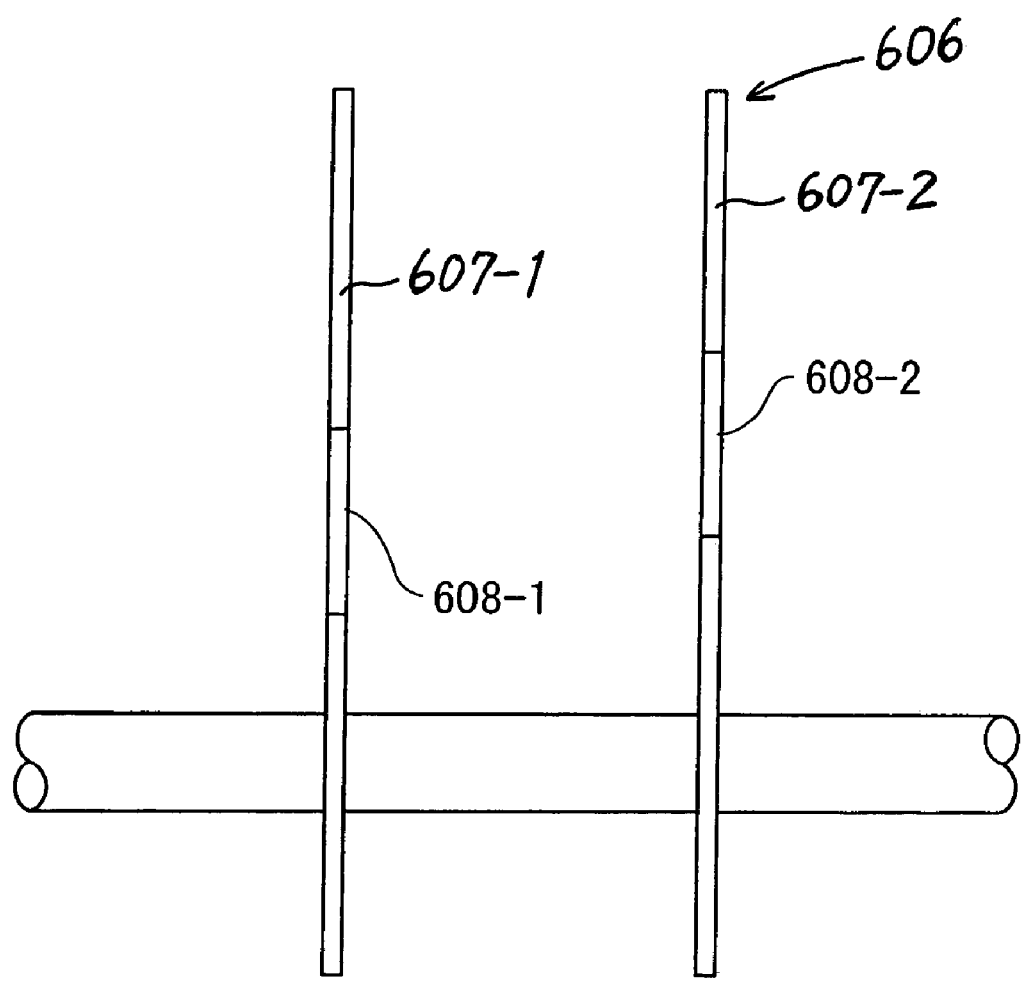
FIG. 27 is a side view of the current conductive part of a probe according to Embodiment 7 ditto.

FIG. 26 is a front elevation of the electric conductive part 606 in the probe 603 representing Embodiment 7. FIG. 27 is a side elevation of the electric conductive part 606 in the probe 603. The present Embodiment 7 increases the distance of standing opposite of the electric conductive part and reduces electric capacity in order to cope with the efforts towards higher speed of the probes 603. FIG. 26 describes only electric conductive parts 606-1 and 606-2 adjacent to the contacts 300 piled up in the thickness direction in the form of a front view, and shows the state where no contact force is in action.

When the respective input parts of the electric conductive part 606-1 and the electric conductive part 606-2 are represented by 607-1 and 607-2, the length in a vertical direction L1 of this input part 607-1 and the length in a vertical direction L2 of the input part 607-2 are different, and if a deforming part 608-1 and a deforming part 608-2 have approximately the same form, the opposite overlapping as seen in the front view will be small, and therefore as shown in FIG. 26 the opposite area in the electric conductive part 606-1 and the electric conductive part 606-2 will be small. As a result, according to the present Embodiment 7, it will be possible to assemble contacts having a small electric capacity and corresponding to the requirement for higher speed. In the meanwhile, the method of the present Embodiment 7 may be applied to Embodiment 4, Embodiment 5, and Embodiment 6.

Embodiment 8

Figure 28:
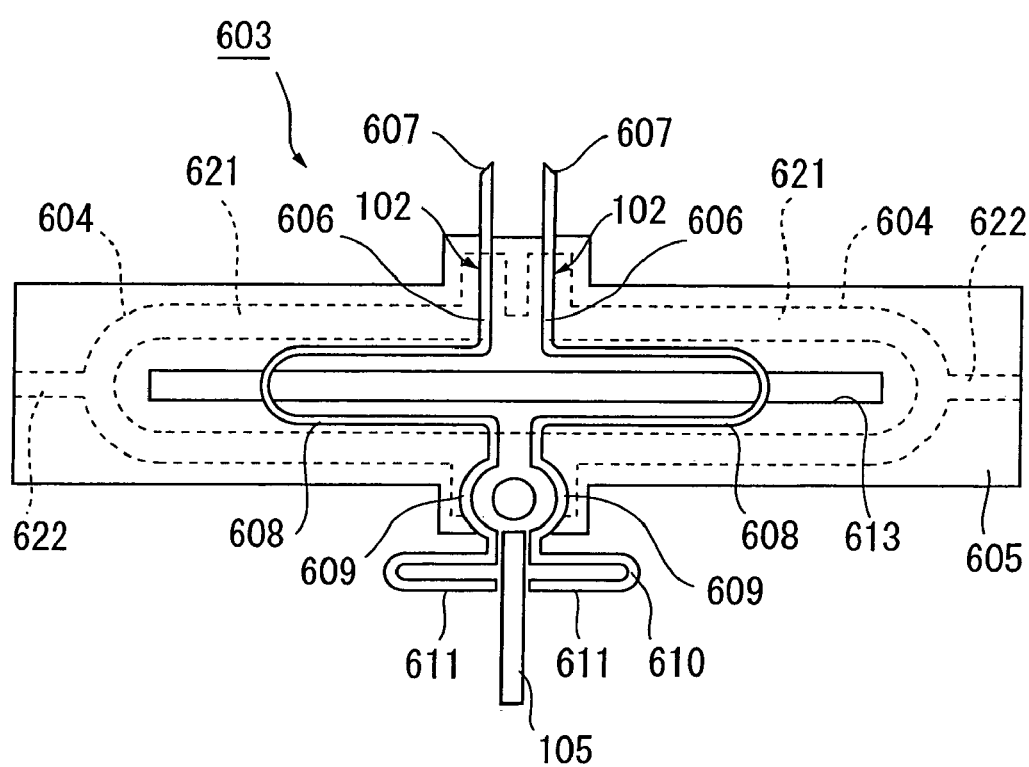
FIG. 28 is a front view of a probe according to Embodiment 8 of the present invention.
Figure 29:
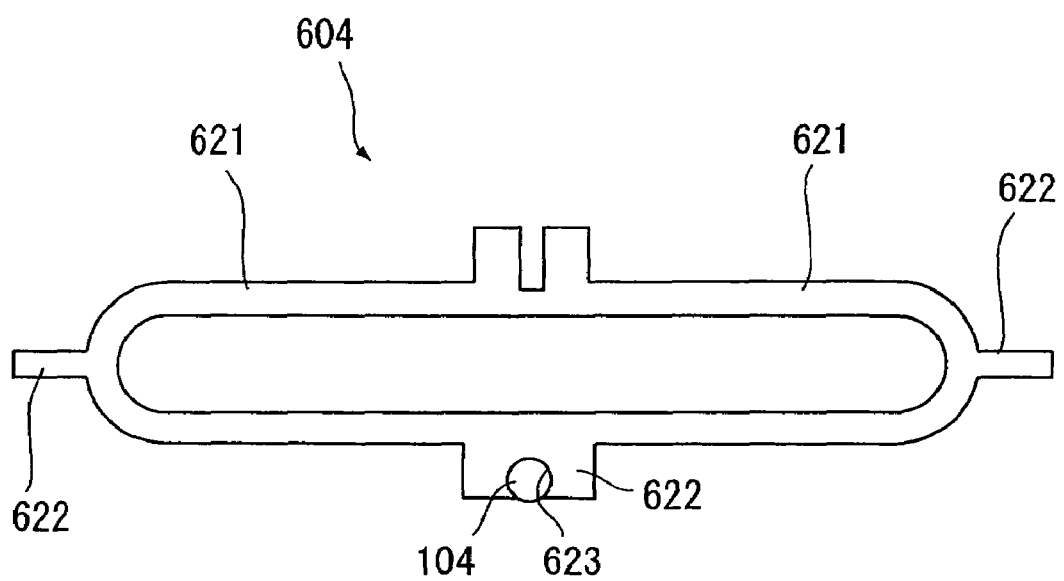
FIG. 29 is a front view of the ground line pattern according to Embodiment 8 ditto.

FIG. 28 is a front elevation of probe 603 representing Embodiment 8 of the present invention. FIG. 29 is a front view of its ground line pattern 604. Embodiment 8 shown in FIG. 28 and FIG. 29 represent the case wherein the electric conductive part 606-1 and the electric conductive part 606-2 are arranged symmetrically horizontally. The arrangement of these elements in various directions enables to correspond to the chips 601 having adjacent two-line arrangement, opposite two-line arrangement and having the pads 602 being arranged in the rectangular form such as ASIC, logic and the like as shown in FIG. 19.

FIG. 28 is an illustration of the case wherein two electric conductive parts 606 are symmetrically arranged horizontally and of having the common ground line pattern 604, the common film 605 and the insulating film 612. The two input parts are facing the pads 602 on the left side and the right side of two adjacent chips.

By arranging horizontally at a suitable pitch and arranging multiple layers in the depth direction facing the paper surface, it will be possible to correspond to the arrangement of a plurality of chips having two lines facing each other of a rectangular pad pattern. Moreover, by arranging approximately same arrangement crossing at the right angle to correspond to the remaining rectangular arrangement of pads on two sides, it will be possible to correspond to a rectangular arrangement of the chips 601 facing the pads 602 such as ASIC, logic and the same described above.

There are the wiring terminals 106 on both sides of the fixing plate 105, and they enable two probes 102 and 102 to gain electric conductivity.

Figure 30:
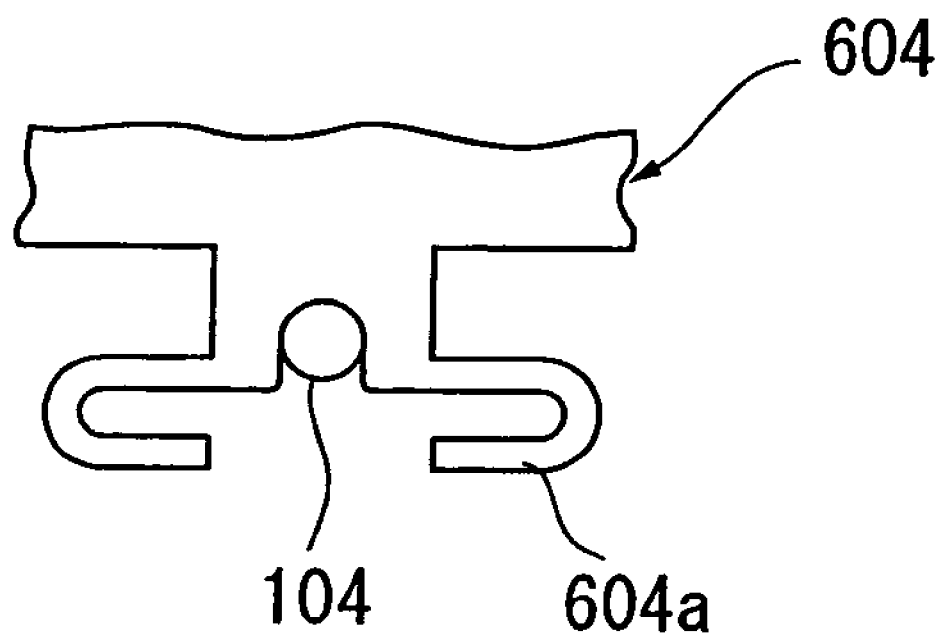
FIG. 30 is a front view showing the output transforming part of the ground line pattern according to Embodiment 8 ditto.

The function of the input part 607, the deforming part 608, the fixing part 607, the output deforming part 610, and the output part 611 of the electric conductive part 606 in the present Embodiment 8 are nearly the same as Embodiment 4. In addition, FIG. 30 shows an output deforming part 604a of the ground line pattern 604 in case where the ground line pattern 604 is connected with the ground line of wiring. Furthermore, the film and the insulating film in the present Embodiment are identical in form on the right side and the left side of FIG. 24 and FIG. 25, and seem to be assumable. Therefore, their drawings and description are omitted.

Therefore, the arrangement of the present Embodiment 8 and the two wiring terminals 106 sandwiching the fixing plate 105 correspond to the adjacent chips 601 shown in Embodiment 5, and are effective arrangements for enabling the rectangular arrangement type pad arrangement to gain electric conductivity at a high speed.

The adherence to the descriptions made on the ground line pattern, film and insulating film in the present Embodiment 8 enables anyone to obtain electric conductivity by high-speed contact with pads arranged in the rectangular form.

Embodiment 9

Figure 31:
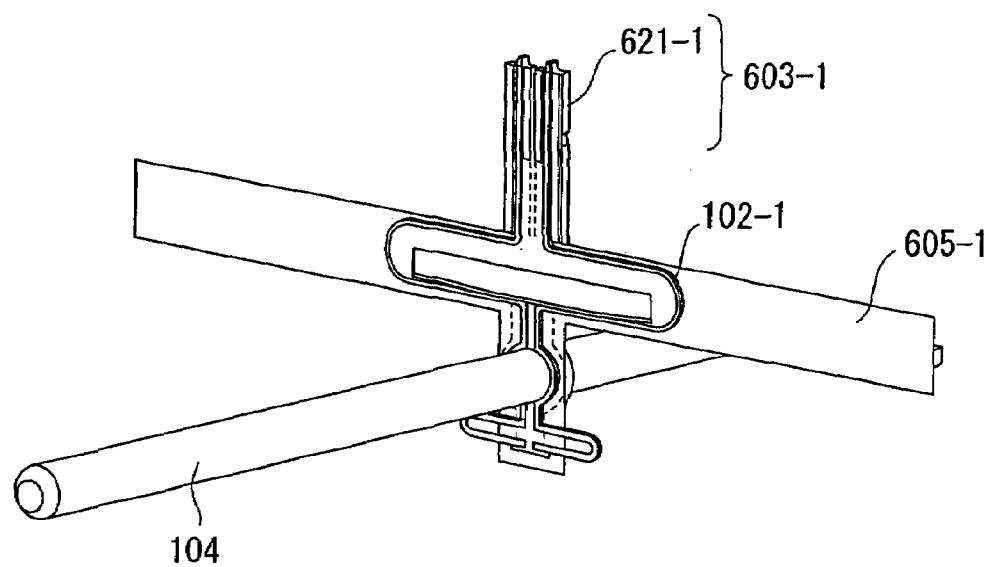
FIG. 31 is a perspective view showing the probe part of a probe assembly according to Embodiment 9 of the present invention.
Figure 32:
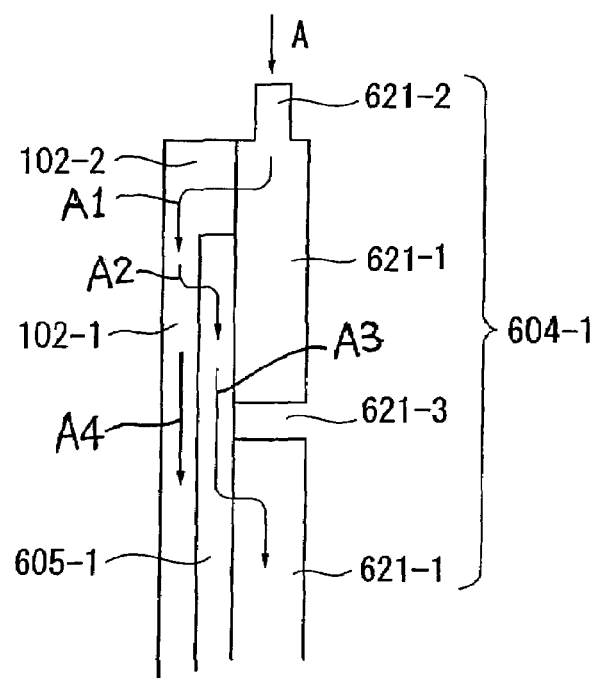
FIG. 32 is schematic illustration of the probe part shown in FIG. 31 as seen from the side and shows the path of transmitting contact force and the conductive path of electric signals.
Figure 33:
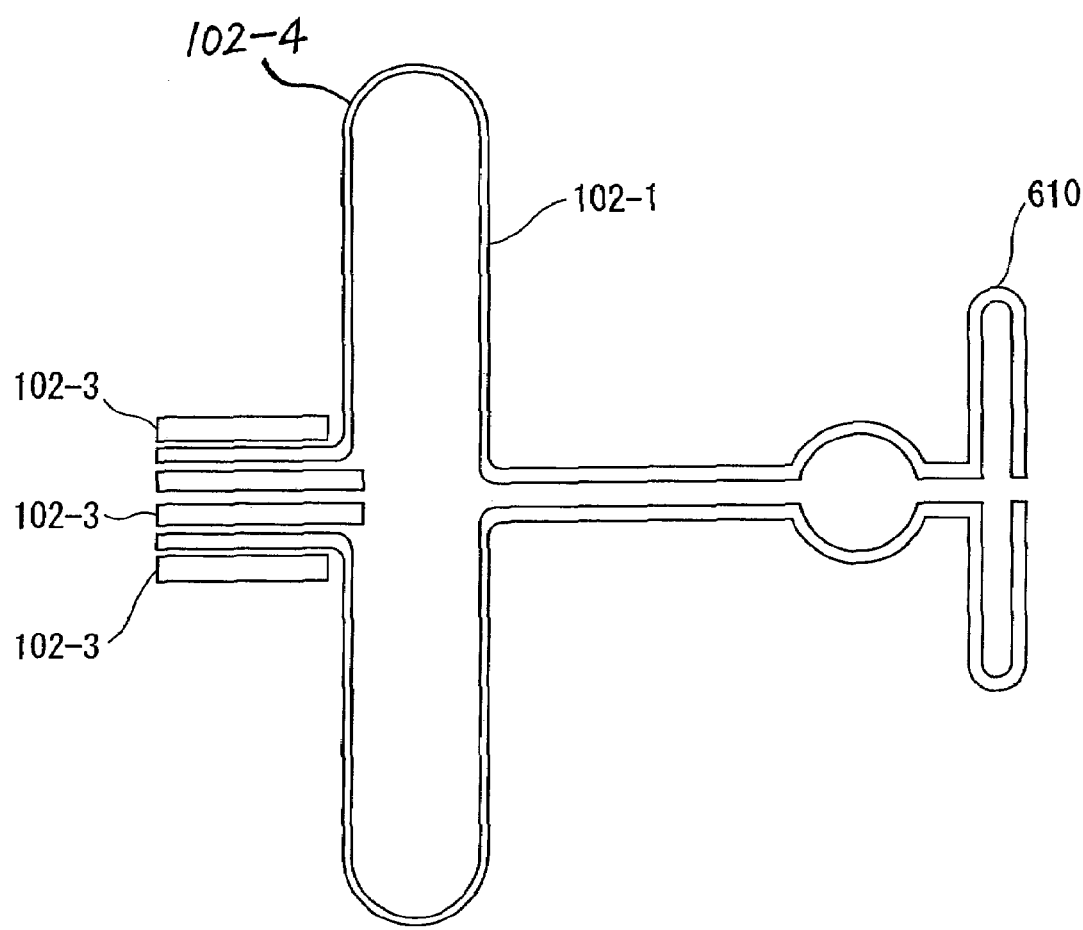
FIG. 33 is a front view of a probe according to Embodiment 9 of the present invention.
Figure 34:
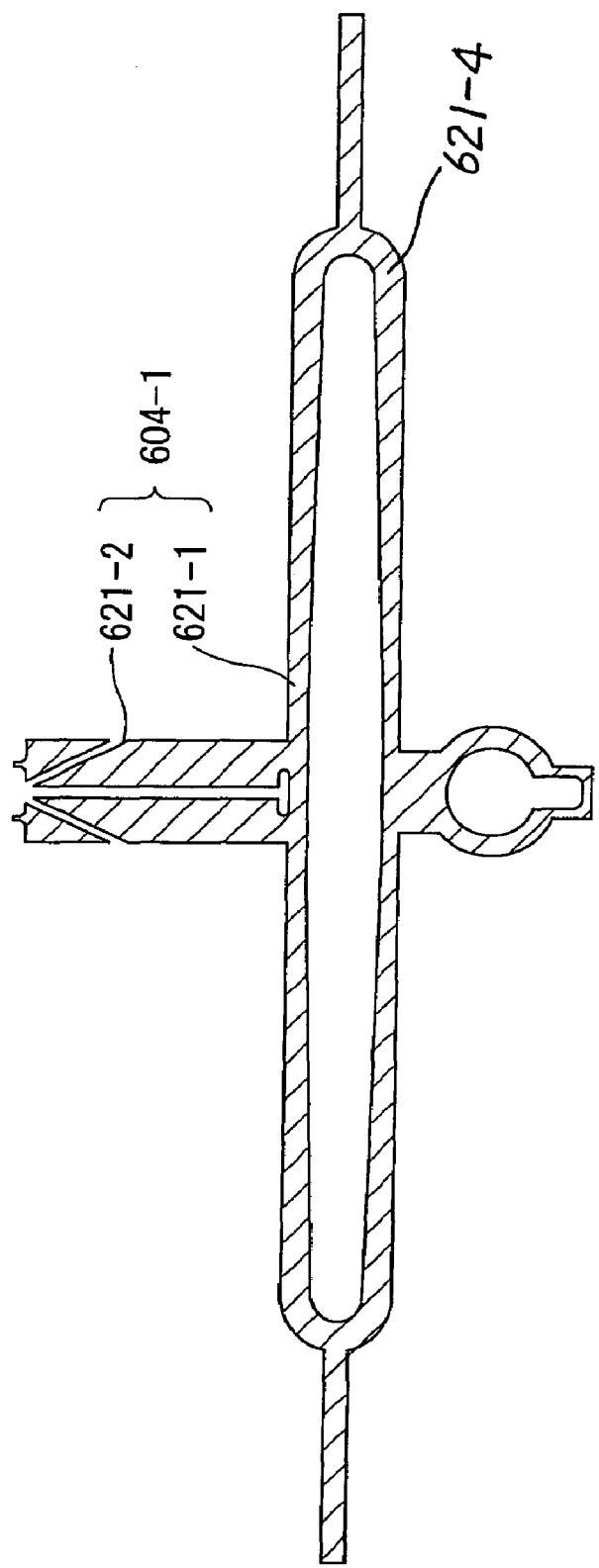
FIG. 34 is a front view of the ground line pattern thereof.
Figure 35:
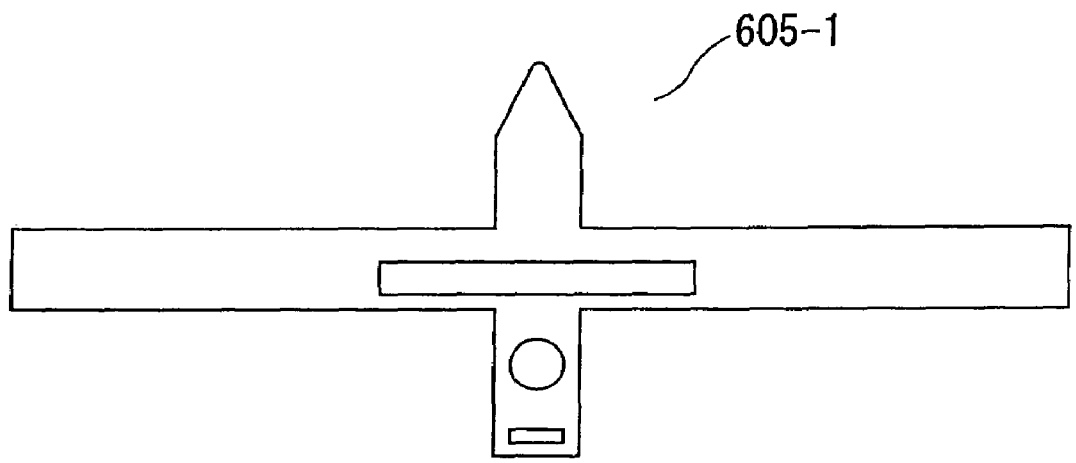
FIG. 35 is a front view of a film according to Embodiment 9 of the present invention.

Embodiment 9 of the present invention will be described with reference to FIGS. 31 to 35. FIG. 31 is a perspective view showing the probe part of a probe assembly in Embodiment 9 of the present invention. FIG. 32 is a schematic representation of the probe part shown in FIG. 31 as seen from the side and indicates the path of electric signals. FIG. 33 is a front view of a probe representing Embodiment 9 of the present invention. FIG. 34 is a front view of its ground line pattern. FIG. 35 is a front view of the film representing Embodiment 9 of the present invention.

The method of electric connection adopted in Embodiment 9 is different from the method of electric connection adopted in Embodiment 6 or Embodiment 8. In other words, in Embodiment 6 and the like, the top (607 in FIG. 22) of the electric conductive part 606 enters into contact with pads to be subjected to a contact force (F) and is electrically connected (see FIG. 22). Embodiment 9, on the other hand, adopts the method of the electric conductive part not touching pads and of receiving contact force by the contact between a ground line pattern 604-1 and the pads and connecting electrically. This method of Embodiment 9 is superior because, when the thickness of pattern of a electric conductive part 102-1 has become extremely thin to the level of several μm and its resiliency has become small, accepting contact force through connection with the pads does not lead to the deformation and destruction on the side of the ground line pattern.

As shown in FIG. 31, a probe 603-1 according to the present Embodiment 9 is composed of an electric conductive part 102-1, a film 605-1, and a ground line pattern 604-1. The ground line pattern 604-1 is made up of metals and other conductive materials and includes a contact part 621-1, a top part 621-2, a notch 621-3. The electric conductive part 102-1 is obviously made up of metals and other conductive materials, and includes a reinforcing pattern 102-3 and a top part 102-2. The top part 102-2 of this electric conductive part 102-1 is jointed metallically with the top part 621-2 of the ground line pattern 604-1. The reinforcing pattern 102-3 serves as a means of reinforcing the metallic junction by increasing the connecting area.

The electric conductive part 102-1, the film 605-1, and the contact part 621-1 of the ground line pattern 604-1 are solidly jointed by a depositing means, a plating means and the like. When a contact force is generated by the connection between the pads and the top part 621-2 of the ground line pattern 604-1, this contact force is inputted as shown by the arrow A in FIG. 32, and is then transmitted as shown by the arrows A1, A2 and A3. In other words, the inputted contact force (arrow A) is transmitted from the top 621-2 of the ground line pattern 604-1 to the top part 102-2 of the electric conductive part 102-1 (arrow A1), then it is transmitted from the electric conductive part 102-1 to the film 605-1 (arrow A2), and further transmitted from the film 605-1 to the ground line pattern 604-1 (arrow A3). By this, the deforming part (code 621-4 in FIG. 34) of the ground line pattern 604-1 is resiliently deformed. The contact force shown by the arrow A3 is transmitted to the base going beyond the notch 621-3 as seen from the top part 621-2 of the ground line pattern 604-1. For this reason, while contact force is transmitted as described above, electric signals are interrupted by the notch 621-3 and the film 605-1 (made of an insulating material) and does not pass through the ground line pattern 604-1.

The following is a description on the conduction of electric signals in the present Embodiment 9. As shown in FIG. 32, electric signals are inputted as shown by the arrow A and are then transmitted by the arrows A1 and A4. In other words, the electric signals inputted (arrow A) are transmitted from the top part 621-2 of the ground line pattern 604-1 to the top 102-2 of the electric conductive part 102-1 (arrow A1), and pass through the electric conductive part 102-1 to be sent to the output deforming part (code 102-4 in FIG. 33). As described already, as the ground line pattern 604-1 includes a notch 621-3, electric signals do not arrive at the deforming part of the ground line pattern 604-1.

According to the present Embodiment, it is possible to input from the ground line pattern the electric signals coming from the pads, and transmit them to the electric conductive part 102-1 for electric tests.

Embodiment 10

Figure 36:
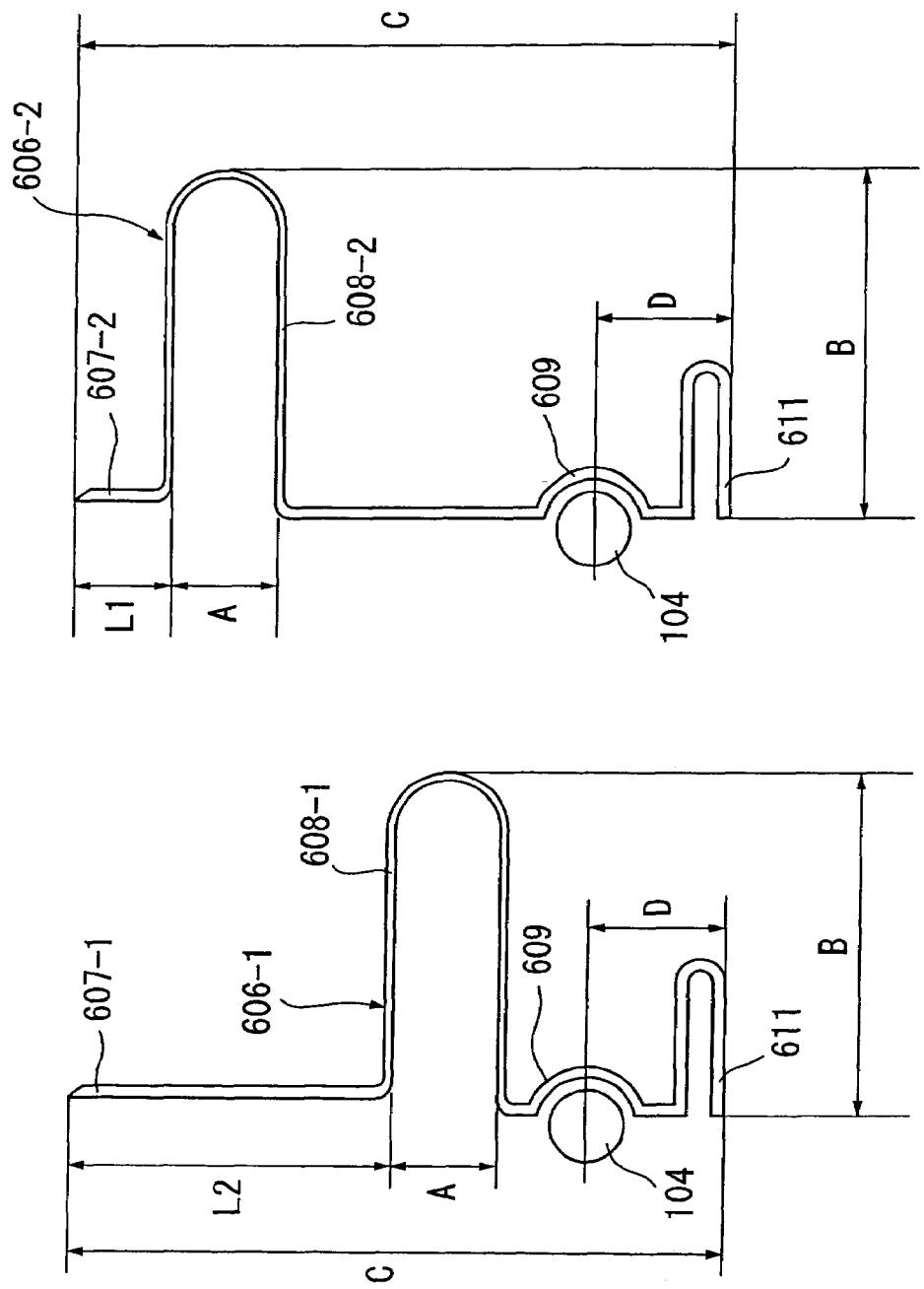
FIG. 36 is a descriptive illustration of avoiding interference of probes according to Embodiment 10 of the present invention.

FIG. 36 is a descriptive illustration of the method of avoiding interference in the probes 603 as described in Embodiment 10. When probes are arranged in a rectangular form as in ASIC or logic, probes cross or cross at the right angle in the present invention. Interference is avoided in this case under the condition that A, B, C and D of the two electric conductive parts 606 in FIG. 36 are respectively same. This enables to adopt the same fixing method because of the same distance between the fixing plate 105 to the upper surface of the round bar 104. The electric characteristics of the electric conductive part are nearly the same.

The following is a description on the electric wiring structure of the multiple array probe assembly according to the present invention thus constituted with reference to FIGS. 37 to 45.

Figure 37:
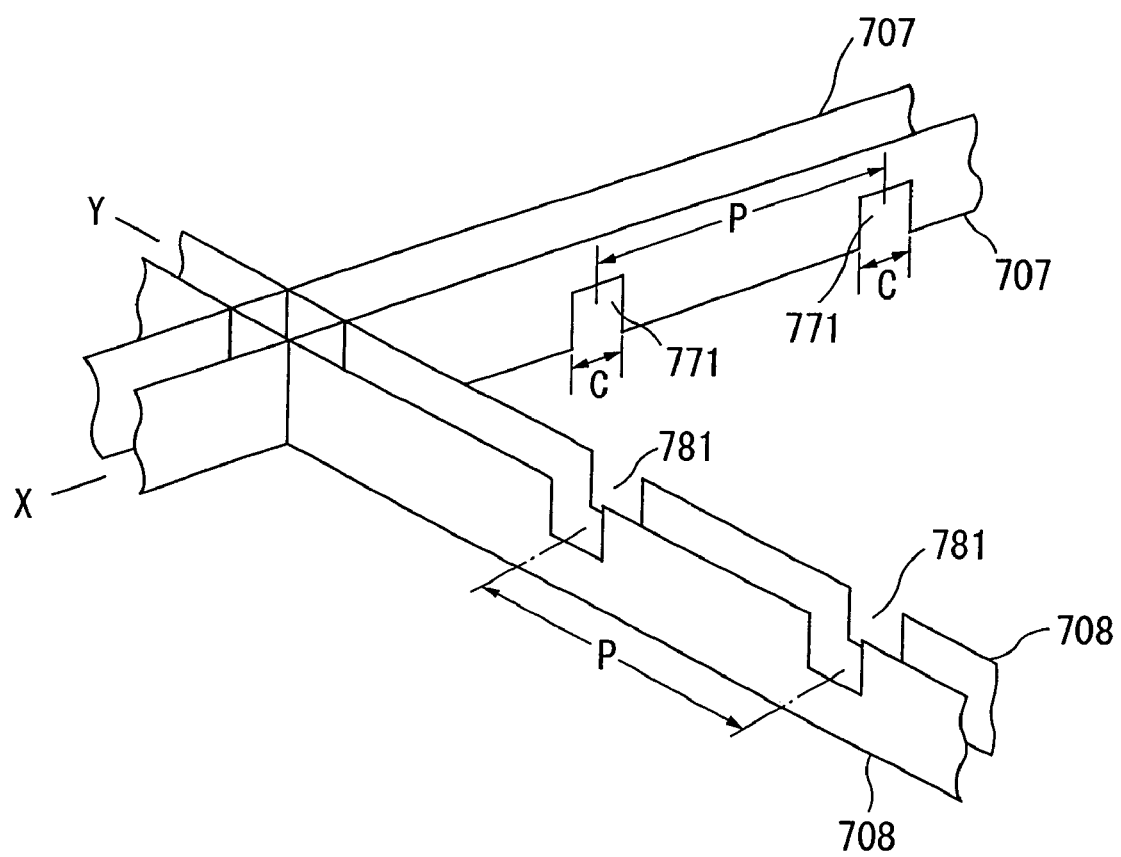
FIG. 37 is a perspective view of the electric wiring connector in the multiple array probe assembly according to the present invention.

FIG. 37 is a perspective view showing a part of the related electric wiring structure. This electric wiring structure has important functions for receiving and transmitting electric signals by connecting semiconductor chips to be tested and the main body of the probing device.

As shown in FIG. 37, this electric wiring structure consists of ribbon-shaped films 707 and 708 having wiring patterns formed by beryllium copper or the like on both sides of polyimide resin or other insulating films, and is constituted by assembling in the X and Y directions two sheets respectively of these ribbon-shaped films 707 and 708. The ribbon-shaped film 707 includes notches 771 at a plurality of positions at a pitch P, and the ribbon-shaped film 708 includes notches 781 in the same way. The width of each notch 771 and 781 is equal to the interval between pedestals. These notches enable the ribbon-shaped films 707 and 708 to be combined in the X and Y directions in the grid form, and these ribbon-shaped films 707 and 708 are arranged in the intervals between pedestals to enable electric connections among separate probe assemblies. Incidentally, the ribbon-shaped films 707 and 708 both in the X and Y directions are arranged by groups of two sheets in the intervals between pedestals. The structure of these ribbon-shaped films having wiring patterns will be described in concrete terms with reference to FIGS. 38 and 39.

Figure 38:
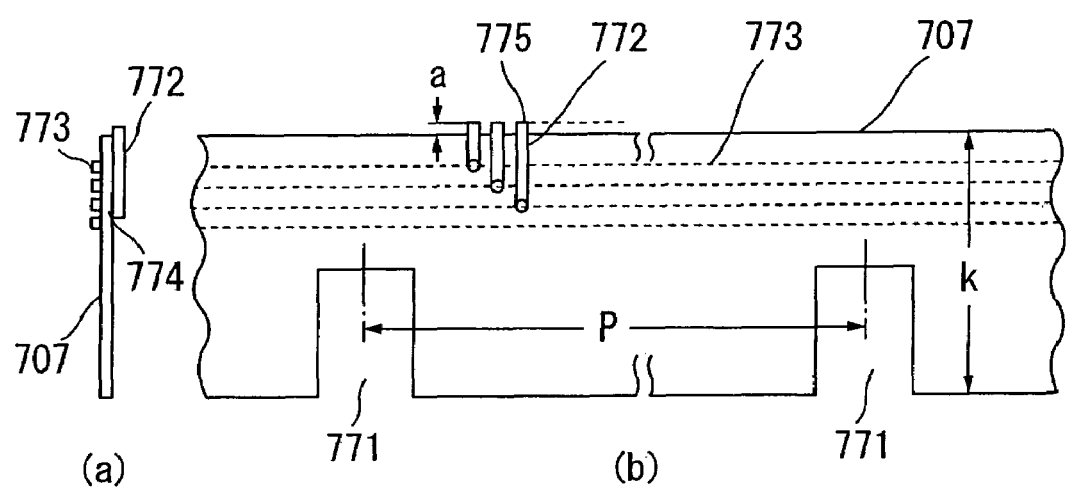
FIGS. 38A and 38B are a side view and a front view of the ribbon-shaped film in the X direction in the multiple array probe assembly according to the present invention.
Figure 39:
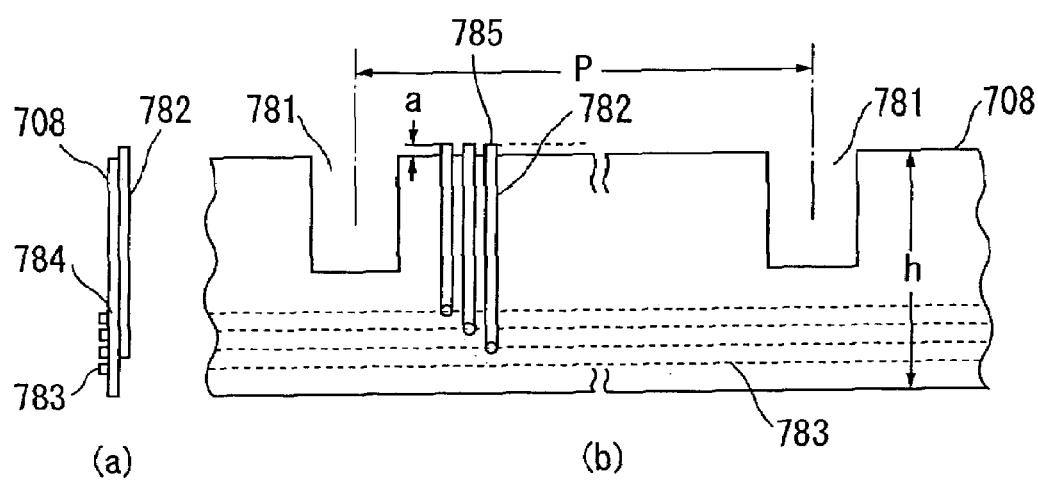
FIGS. 39A and 39B are a side view and a front view of the ribbon-shaped film in the Y direction according to Embodiment 10 ditto.

FIG. 38 is an illustration showing the structure of a ribbon-shaped film in the X direction, and FIG. 39 is an illustration showing the structure of a ribbon-shaped film in the Y direction. In each figure, A is a side elevation and B is a front elevation. As shown in FIG. 37, the ribbon-shaped film 707 includes a plurality of notches 771 in the shorter side direction of the film matching the arrangement pitch P of props, and similarly the ribbon-shaped film 708 includes notches 781 from the opposite direction of the ribbon-shaped film 707. Notches are made to a depth equivalent to the approximate center of the film, and the width of each notch is equal to the interval between pedestals. And the length of each of the films 707 and 708 is a length that can cover the length of maximum arrangement in the X or Y direction of chips formed on a wafer. The ribbon-shaped film in the X direction 707 and the ribbon-shaped film in the Y direction 708 have somewhat different structure of wiring pattern.

In the first place, the ribbon-shaped film in the X direction 707 shown in FIG. 38A includes a plurality of copper wiring lines 772 formed in parallel vertically at a narrow pitch (for example 45 µm) on the upper half (h/2) side without notches 771 on the surface side. This narrow pitch interval coincides with the pitch of vertical probes of individual array probe assembly. On the other hand, on the back side of this film 707, a plurality of common copper wiring lines 773 crossing at the right angle with the copper wiring lines 773 are formed on the upper half (h/2) side without notches 771 in parallel with the longitudinal direction of the film, and the copper wiring lines 772 and the common copper wiring line 773 are electrically connected between both sides of the film 707 through the through-holes 774 cut out in the film 707. The common copper wiring line 773 is, like the copper wiring lines 772, made by the etching method or the plating method using the photolithography technique. Since the copper wiring line 772 and the common copper wiring line 773 are separately made on both sides of the film, the through-holes 774 for connection need to be cut out only at crossing positions required for connection, and there is no need for shield at other crossing points. Thus, the wiring patterns consisting of the copper wiring line 772 and the common copper wiring lines 773 formed on the ribbon-shaped film in the X direction 707 take the form of the copper wiring lines 772 branching out for each section constituted by the interval P between the adjacent notches 771 and 771 from the common copper wiring line 773 serving as the common line.

On the other hand, the ribbon-shaped film in the Y direction 708 has, as shown in FIGS. 39A and 39B, copper wiring lines 782 formed over the length reaching the lower half (h/2) of the surface side of the film having a width h and common copper wiring line 783 formed in the lower half (h/2) of the back side, and the respective wiring lines are connected through through-holes 784 between the both sides of the film like the ribbon-shaped film in the X direction 707. However, due to the position of the notches 781 cut out facing upward, the common copper wiring line 783 is arranged in the lower half of the film free of notches, and the length of the copper wiring lines 782 is extended to that extent. The ribbon-shaped film thus formed covers the whole film including the copper wiring lines and the common wiring line with a thin insulating coating and protects the surface to prevent the copper wiring lines from pealing off and shorting. However, if the pedestals and the positioning bars in the X and Y directions described below (FIG. 41 and FIG. 42) are made of resin, it is needless to use insulating film.

Figure 45:
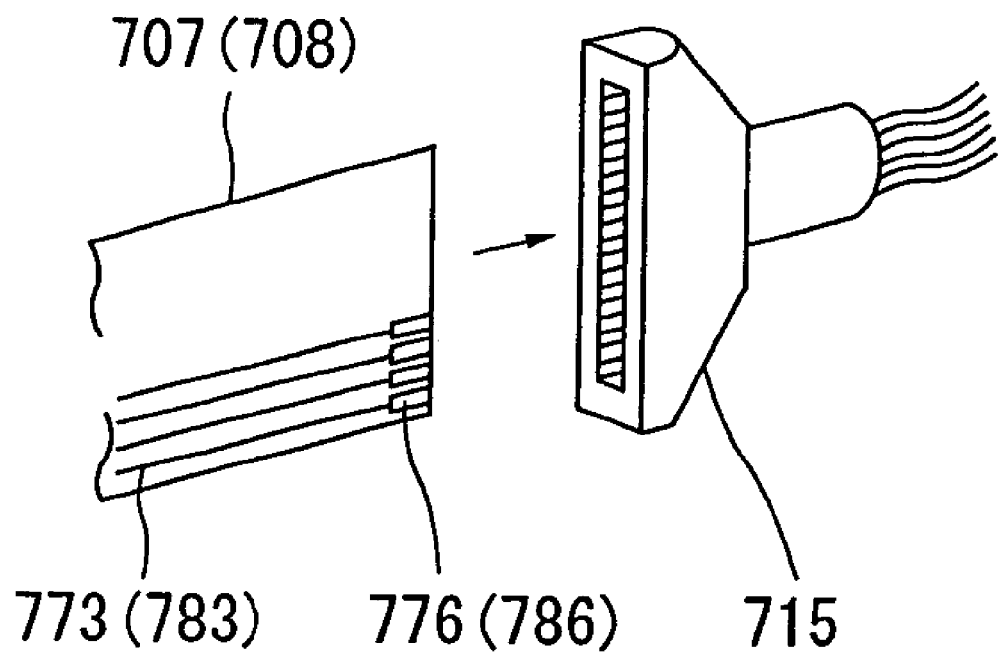
FIG. 45 is a perspective view showing the structure of socket of the ribbon-shaped film according to Embodiment 10 ditto.

The top part of the copper wiring lines 772 and 782 protrudes slightly from the upper side in the longitudinal direction of the film (shown by the dimension a in FIG. 38 and FIG. 39), and these protruding tops constitute contact terminals 775 and 785 for entering into contact with the top of vertical probes when the multiple array probe assembly is assembled by exposing the copper surface. As the common copper wiring lines 773 and 783 can be connected with outside testing devices through a socket 715 because, as the perspective view of FIG. 45 shows, the end of the ribbon-shaped films 707 and 708 can be inserted into the socket 715.

Figure 47:
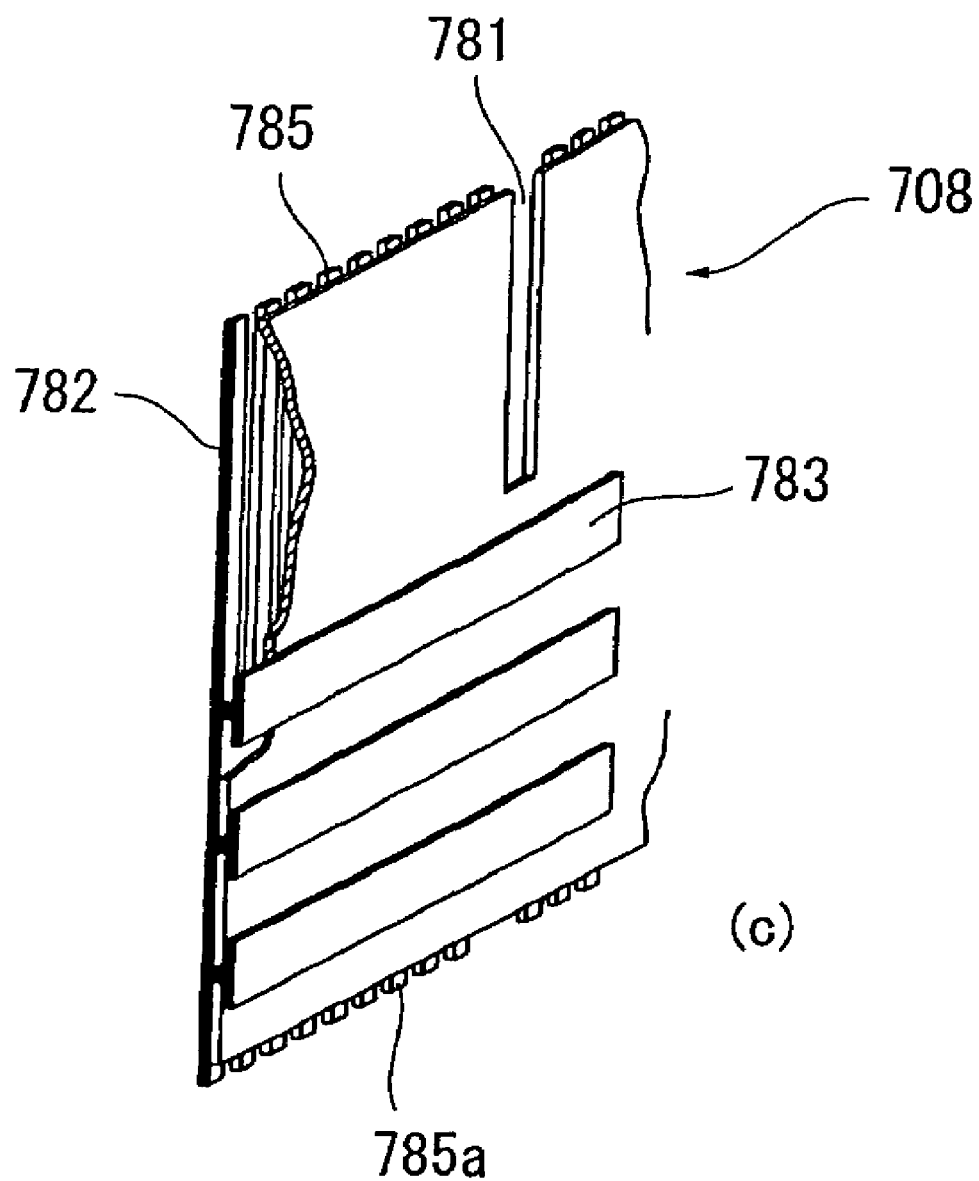
FIG. 47 is a perspective view showing an example of application of the ribbon-shaped film according to Embodiment 10 ditto.
Figure 48:
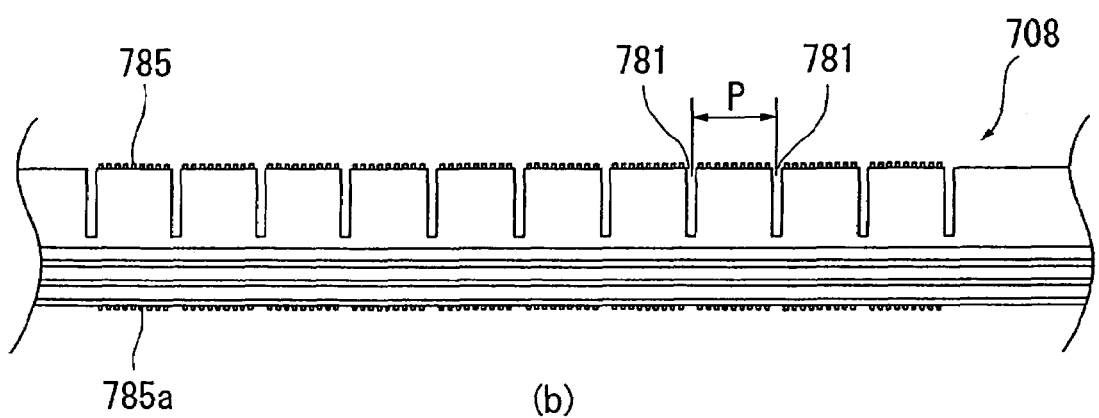
FIG. 48 is a front view showing an example of application of the same ribbon-shaped film as the one shown in FIG. 47 in the case where chips are arranged in two lines at equal intervals.
Figure 49:
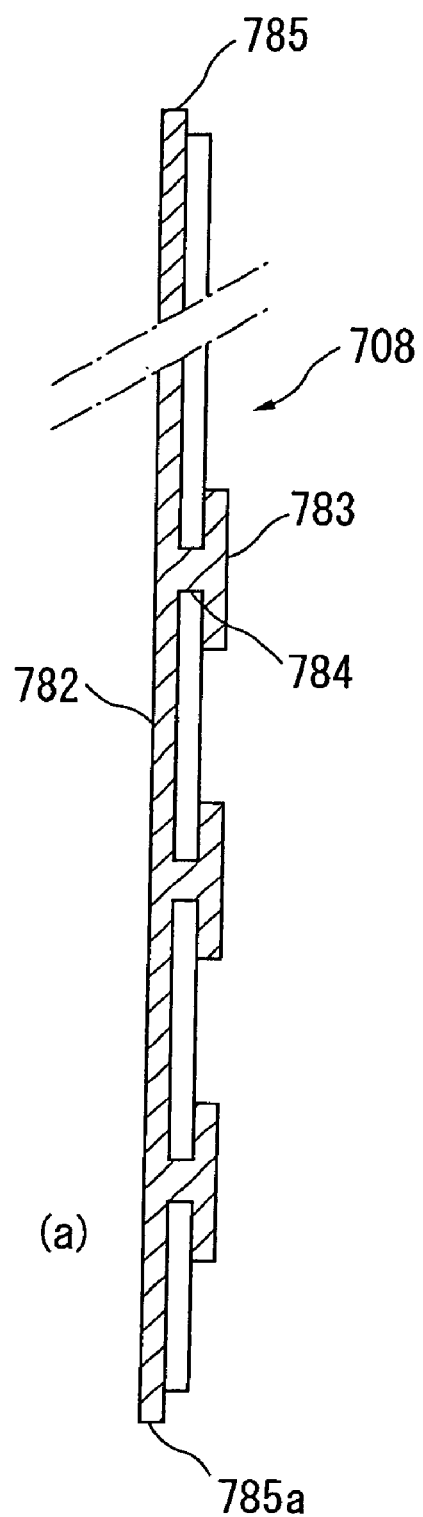
FIG. 49 is a sectional view showing an example of application of the same ribbon-shaped film as the one shown in FIG. 47.

FIGS. 47 to 49 are illustrations showing an example of application of the ribbon-shaped film in the Y direction 708 shown in FIG. 39, and FIG. 47 is a perspective view, FIG. 48 is a front view and FIG. 49 is a sectional view. This is different from FIG. 39 in that the vertical copper wiring lines 782 extend to the lower side of the ribbon-shaped film by going over the crossing point with the horizontal common copper wiring line 783, and protrude slightly from the lower side to serve as connecting terminals 785c on the lower side. As this arrangement results in the formation of connecting terminals on the upper and lower sides of the ribbon-shaped film, it is possible to use the connecting terminals even if the upper and lower sides are reversed. Similarly, it is possible to expand the scope of application of the ribbon-shaped film by providing connecting terminals on the lower side of the ribbon-shaped film in the X direction.

Figure 46:
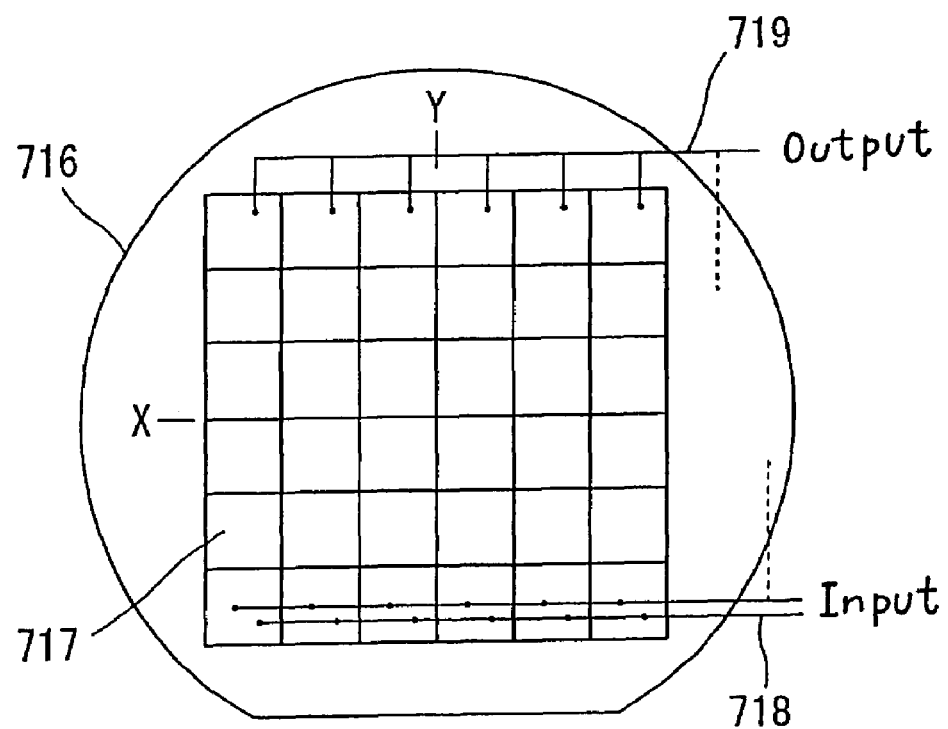
FIG. 46 is an illustration describing the electric wiring connection to a semiconductor wafer according to Embodiment 10 ditto.

FIG. 46 is an illustration showing an example of connection between the wiring lines of the ribbon-shaped film and a wafer. In other words, two input signal lines 863 and 864 and an output signal line 865 are provided as the common copper wiring lines. As these signal lines are connected, for example, in common with a plurality of chips 862 arranged in the X direction on a wafer 861, it is possible to test each line at the same time. The type and number of these signal lines may be set freely, and it is easy to exchange ribbon-shaped films as required.

Figure 40:
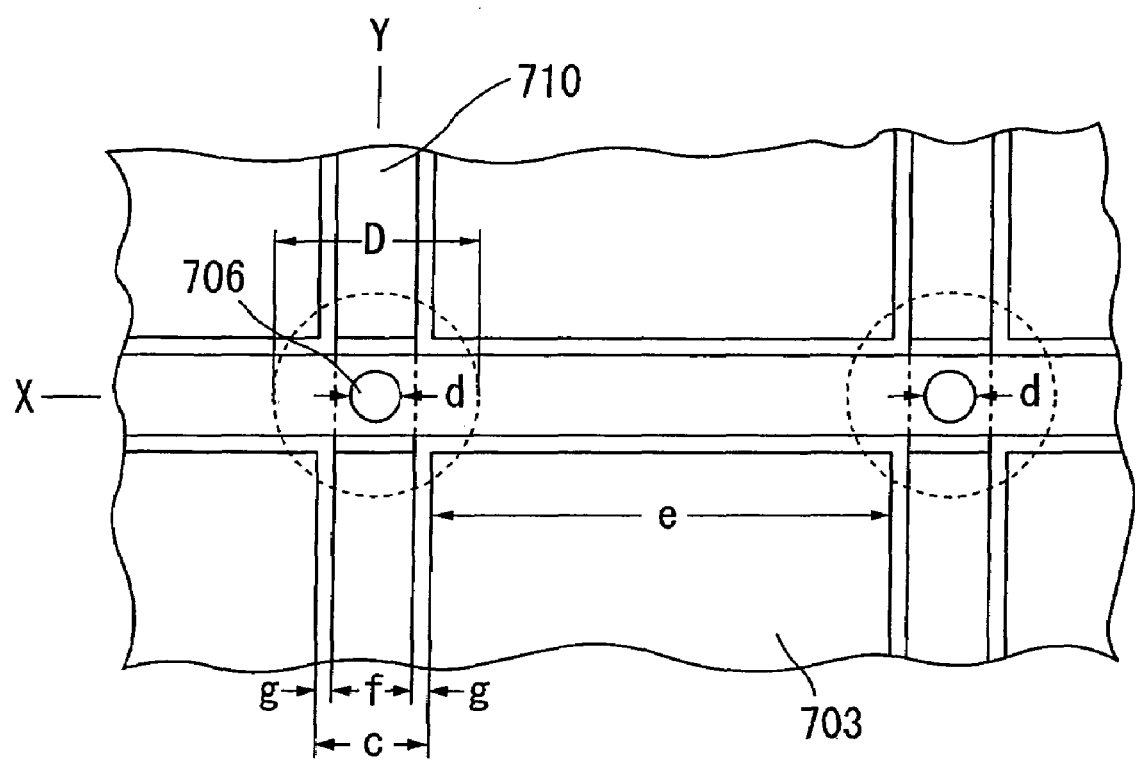
FIG. 40 is a top plan view showing a positioning bar in the X-Y direction being assembled according to Embodiment 10 ditto.

The ribbon-shaped films in the X and Y directions thus formed are fixed on a multiple array mounting stand. The component parts required then will be described with reference to FIGS. 34, 35 and 36. FIG. 40 is a top plan view showing a part of the multiple array mounting stand. In other words, the positioning bar in an X direction 709 and the positioning bar in a Y direction 710 are combined in the grid form to be fixed in the interval c between pedestals 703 arranged at a pitch P in the X and Y directions. The positioning bar in the X direction 709 and the positioning bar in the Y direction 710 are positioned and fixed in the X-Y-Z direction by passing props 706 (diameter d) into holes cut out at respective crossing points when they are combined. The thickness f of this positioning bar in the X direction 709 and the positioning bar in the Y direction 710 is f>d because of necessity of passing props 706, and is set in such a way that f=c−2 g by leaving a width g into which the ribbon-shaped film 707 or 708 described above may be inserted on both sides thereof. Their width g is set in such a way that the value of their thickness including the copper wiring lines 772, 773 or 782, 783 formed on both sides of the ribbon-shaped films 707 and 708 may be inserted.

Figure 41:
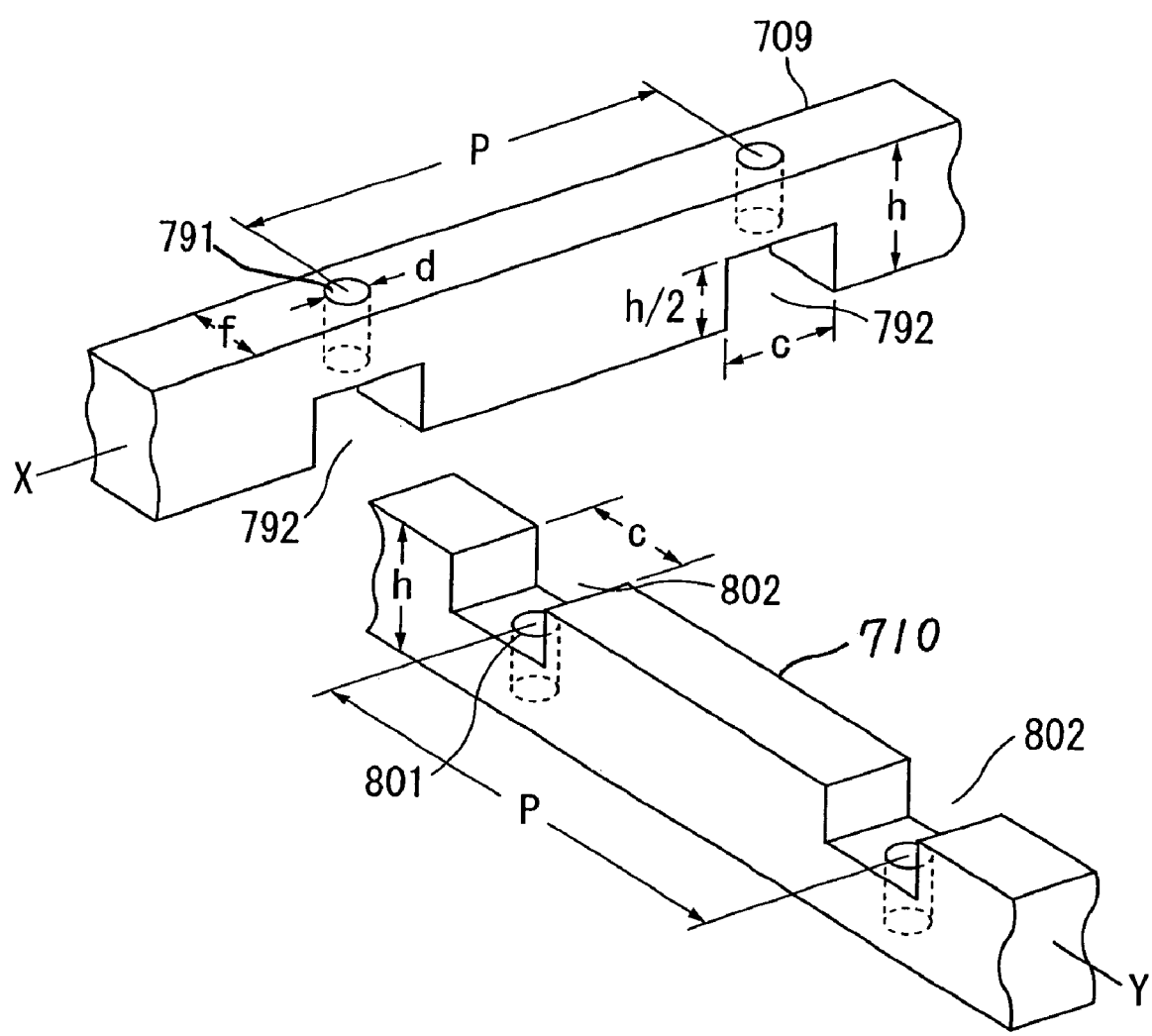
FIG. 41 is a perspective view showing the structure of the positioning bar in the X-Y direction according to Embodiment 10 ditto.

FIG. 41 is a perspective view showing the structure of the positioning bar in the X direction 709 and the positioning bar in the Y direction 710. The positioning bar in the X direction 709 and the positioning bar in the Y direction 710 are long plate-shaped bar made of resin or metal materials having a thickness h and a width f. A plurality of notches 792 having a width c and a depth h/2 are formed on the lower side at a pitch P, and a hole 791 is cut out at the central position of each of the notches 792 for allowing the passage of a prop 706 having a diameter d. On the other hand, the positioning bar in the Y direction 710 is a member fixed in combination at the right angle with the positioning bar in the X direction 709 described above, and include similarly notches 802 and holes 801 at a pitch P. Here, the notches 802 are cut out on the opposite side (upper side). Incidentally, the dimensions of all the notches 792 and 802 formed on the positioning bars 709 and 710 and all the notches 771 and 781 formed on the ribbon-shaped films 707 and 708 are the same.

Figure 42:
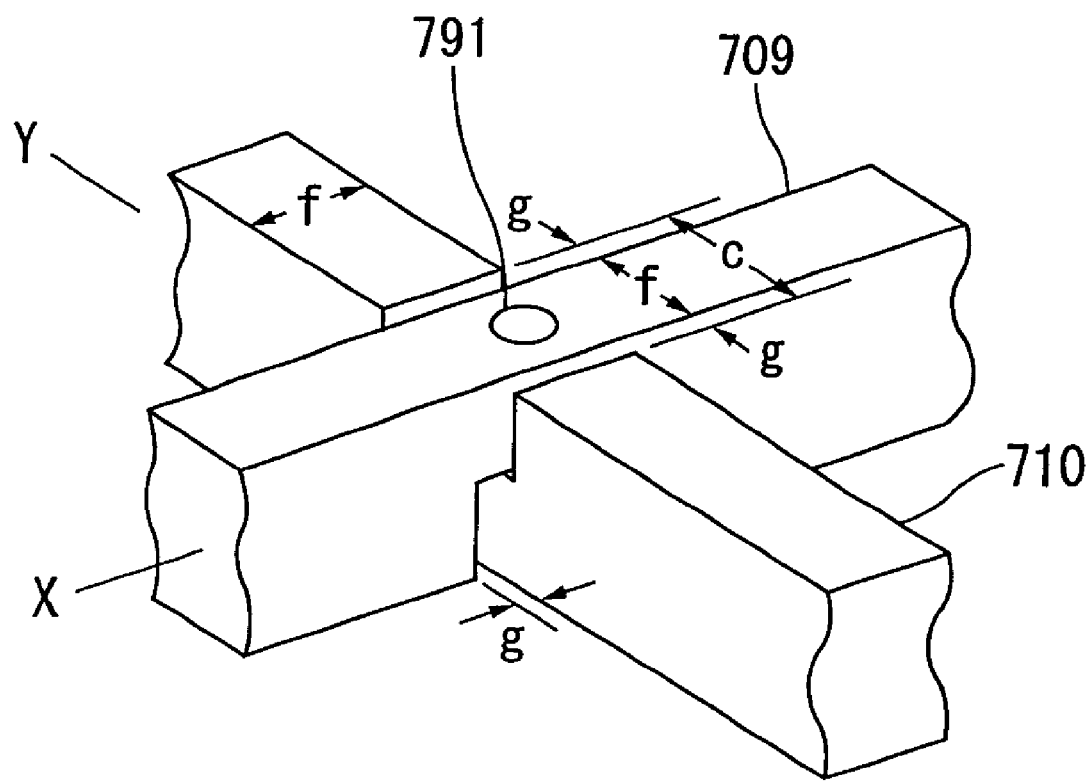
FIG. 42 is a perspective view of the crossing of the positioning bar in the X-Y direction according to Embodiment 10 ditto.

FIG. 42 is a perspective view showing the assembled state of the positioning bar in the X direction 709 and the positioning bar in the Y direction 710 at the crossing point. Both the positioning bar in the X direction 709 and the positioning bar in the Y direction 710 are positioned in the X-Y directions by passing the prop 706 through the holes 791 and 801, and are positioned in the Z direction with the lower ends entering into contact with a stepped part 761 of the prop 706. The interval g formed then is filled with ribbon-shaped films. Incidentally, these positioning bars 709 and 710 play the role of a reinforcing member constituting the multiple array probe assembly together with the prop 706 in addition to their positioning function.

FIG. 37 is a top plan view showing the state of the positioning bar in the X direction 709 and the positioning bar in the Y direction 710 described above as well as the ribbon-shaped films 707 and 708 mounted on a multiple array mounting stand. By the fixation of these components, the ribbon-shaped films 707 and 708 having contact terminals 775 and 785 for entering into contact with the vertical probes of separate probe assemblies are positioned and fixed on the four sides of the pedestal 703, and electric signals can be taken out through the copper wiring lines 772 and 782 of the ribbon-shaped films 707 and 708. Therefore, they can demonstrate fully their functions as a multiple array probe assembly.

Figure 43:
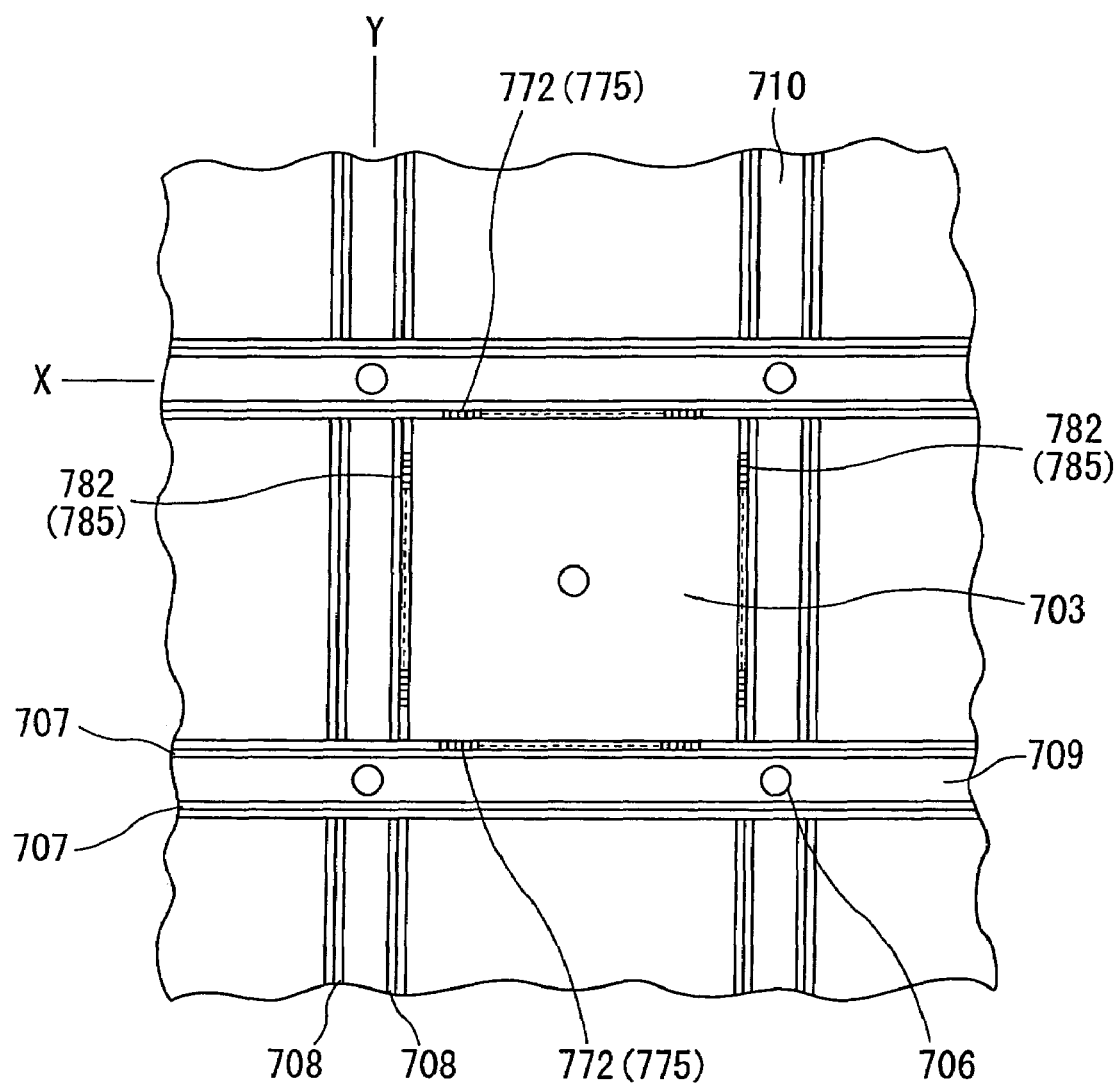
FIG. 43 is a top plan view showing the positioning bar in the X-Y direction and the ribbon-shaped film in the X-Y direction being assembled according to Embodiment 10 ditto.
Figure 44:
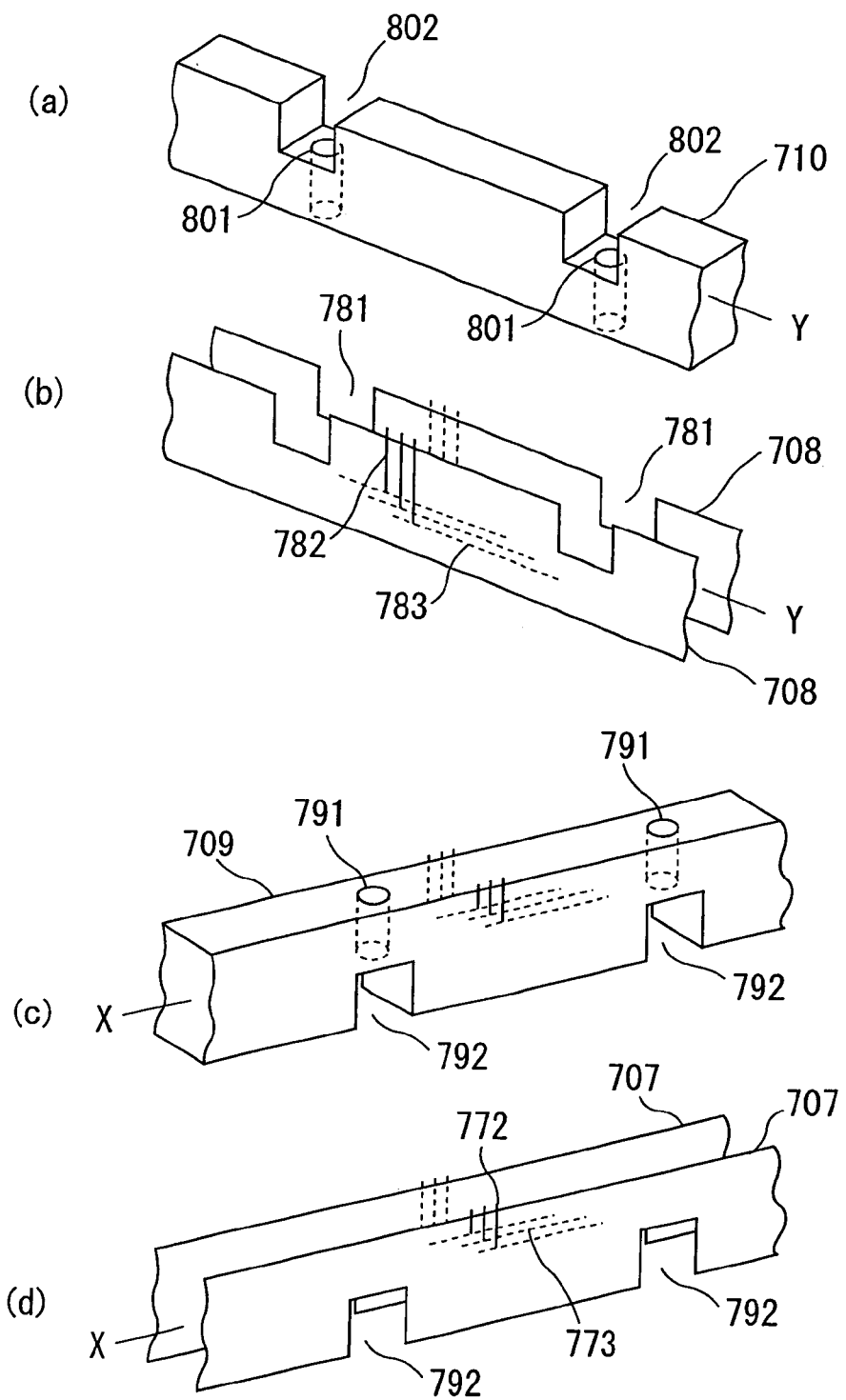
FIGS. 44A to 44D are a process illustration showing the process of assembling the positioning bar in the X-Y direction and the ribbon-shaped film in the X-Y direction according to Embodiment 10 ditto.

The following is a description of the process of fixing the positioning bars 709 and 710 as well as the ribbon-shaped films 707 and 708 shown in FIG. 43 with reference to the illustration of process in FIGS. 44A to 44D. It should be noted that this process is only an example and that the work may be carried out by going through other processes. To begin with, as shown in FIG. 43A, the prop 706 is passed through the hole 801 by keeping the notch 802 of the positioning bar in the Y direction 710 upside, and the positioning bar 710 in the Y direction is fitted between the pedestals 703 and 703. At this moment, the positioning bar in the Y direction 710 is positioned in the Y direction by the prop 706 and at the same time it is positioned in the Z direction with the lower part being in contact with the stepped part 761 of the prop 706. At this moment, a gap g is formed between the pedestal 3 and the positioning bar in the Y direction 710 on both sides thereof.

Then, as shown in FIG. 43B, the ribbon-shaped films in the Y direction 708 are vertically fitted into the gap g on both sides one after another in the longitudinal direction. At the time of insertion, the notches 781 are kept facing upward and the vertical copper wiring lines 782 are inserted towards the side surface of the pedestal 703. At this moment, as the notches 781 of the ribbon-shaped film 708 have the same dimensions as the notches 802 of the positioning bars 710, they are positioned in the Y direction by matching the position of the respective notches. Or the ribbon-shaped films may be positioned and superposed in advance on the positioning bar 710, and at the time of fixing the positioning bar 710 they may be integrated and fitted together. Simultaneously upon the insertion, the lower side of the ribbon-shaped film 708 comes into contact with the stepped part 761 of the prop 706 resulting in their positioning in the Z direction, the position of the upper end of the film 708 matching the position of the upper surface of the pedestal 703. The top of the probe of the probe assembly 701 fixed on the pedestal 703 and the contact terminal 785 of the vertical copper wiring lines 782 of the ribbon-shaped film 708 will match mutually.

After the fixing operation of the positioning bar in the Y direction 710 and the ribbon-shaped film 708 has ended in this way, as shown in FIG. 43C this time, the prop 706 is passed through the hole 791 by keeping the notches 792 of the positioning bar in the X direction 709 downward, and the positioning bar in the X direction 709 is fixed into the pedestal 703 and 703. At this moment, the positioning bar in the X direction 709 is positioned in the X direction by the prop 706 and at the same time it is positioned in the Z direction with its lower part being in contact with the stepped part 761 of the prop 709. As a result, the positioning bars 710 and 709 are fixed between the pedestal 703 and the pedestal 703 with their notches 802 and 792 being combined respectively in a grid form. At this moment, a gap g is formed between the positioning bar in X direction 709 and the pedestal 703 on both sides of the positioning bar 709.

Then, as shown in FIG. 43D, the gaps g on both sides are filled vertically with the ribbon-shaped films in the X direction 707 one after another while being kept in the longitudinal direction. At the time of insertion, the ribbon-shaped films in the X direction 707 are inserted with the notches 771 facing downward and the vertical copper wiring lines 772 directed towards the side surface of the pedestal 703. At this moment, the ribbon-shaped films 707 are combined with the notches 802 of the positioning bar 710 on which notches 771 have already been cut out and with the notches 781 of the ribbon-shaped films 708, and are fixed in the grid form for their positioning in the X direction. At the same time, the lower side of the film is in contact with the stepped part 761 of the prop 706 for their positioning in the Z direction. This causes the position of the upper end of the film 7 to agree with the position of the upper surface of the pedestal 703. This also causes the top of vertical probes of the probe assembly 701 fixed on the pedestal 703 and the contact terminals 775 of the vertical copper wiring lines 772 of the ribbon-shaped films 707 agree respectively.

Thus, the electric wiring structure of the multiple array probe assembly in the present invention can be easily assembled with a high precision by combing the ribbon-shaped films having the common wiring line in the form of a grid pattern. Due to a plurality of connecting terminals for copper wiring lines respectively being brought into contact and fixed at the right position on each side of the pedestal in a stroke, there is no need to adjust the height and parallelism of connecting terminals later on.

Embodiment 11

Figure 50:
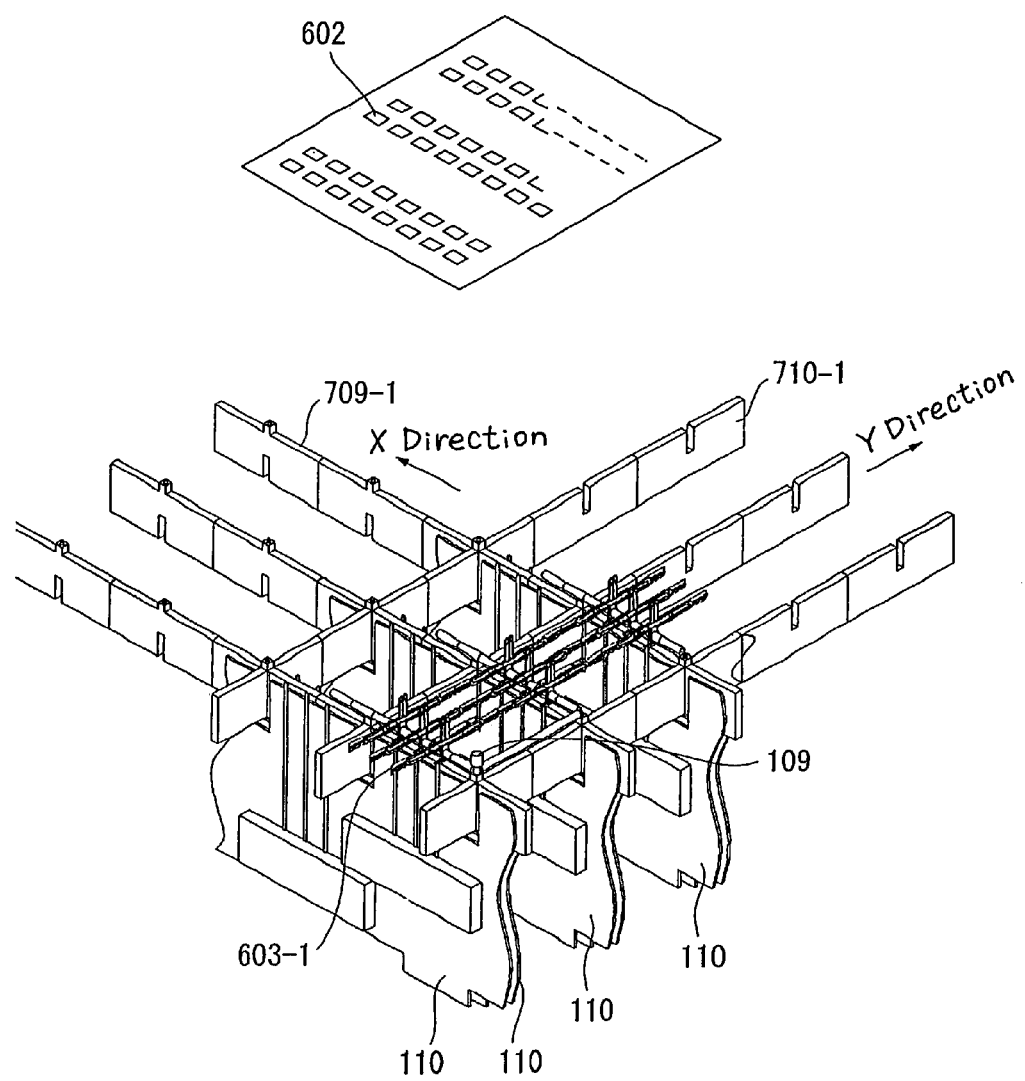
FIG. 50 is a perspective view of Embodiment 11 of the present invention.

The following is a detailed description of Embodiment 11 of the present invention with reference to drawings. The present Embodiment 11 is adapted to multiple wiring lines and to realize higher speed as a part of the system of the present invention already described in FIG. 4. FIG. 50 is a perspective view of the present Embodiment 11. For example, probes are brought into contact en bloc with pads arranged on the memory-related line for high-speed tests.

In FIG. 50, the code 602 represents a pad. There are two adjacent lines and as shown in the figure the pads are arranged in two lines at a fixed interval. The present Embodiment 11 takes an example of two adjacent lines. However, when any one of the opposite probes 603 described above is missing, a linear arrangement of equal interval will remain.

The code 709-1 represents a positioning bar in the X direction, and 710-1 represents a positioning bar in the Y direction. In Embodiment 9, the form and functions of the positioning bar in the X direction 709 and the positioning bar in the Y direction 710 are described, and the positioning bar in the X direction 709-1 and the positioning bar in the Y direction 710-1 in the present Embodiment have nearly same forms and functions. The positioning bar in the X direction 709-1 and the positioning bar in the Y direction 710-1 are mutually acting as a means of securing a precise positioning. A plurality of probes 603-1 are arranged in the Y direction and multiple layers of the same are arranged in the thickness direction (X direction). In reality, however, the ground line pattern 604-1 and the electric conductive part 606-3 are formed and arranged by etching, plating based on the lithography and other processing means on the film 605-1 which is a film-shaped insulating coating as described above. The code 110 is a one-axis test circuit.

Figure 51:
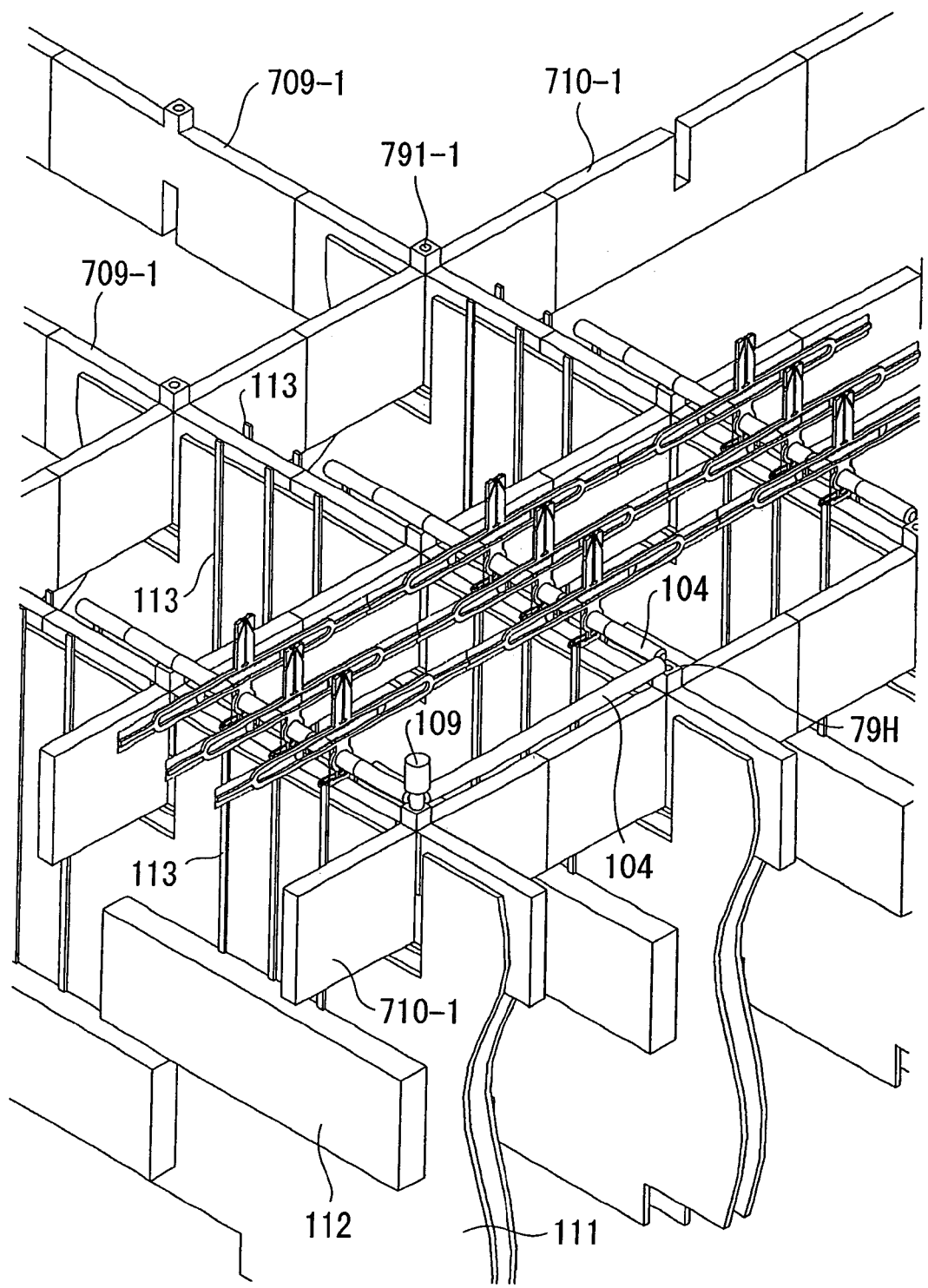
FIG. 51 is a further enlarged perspective view of the main part of FIG. 50.
Figure 52:
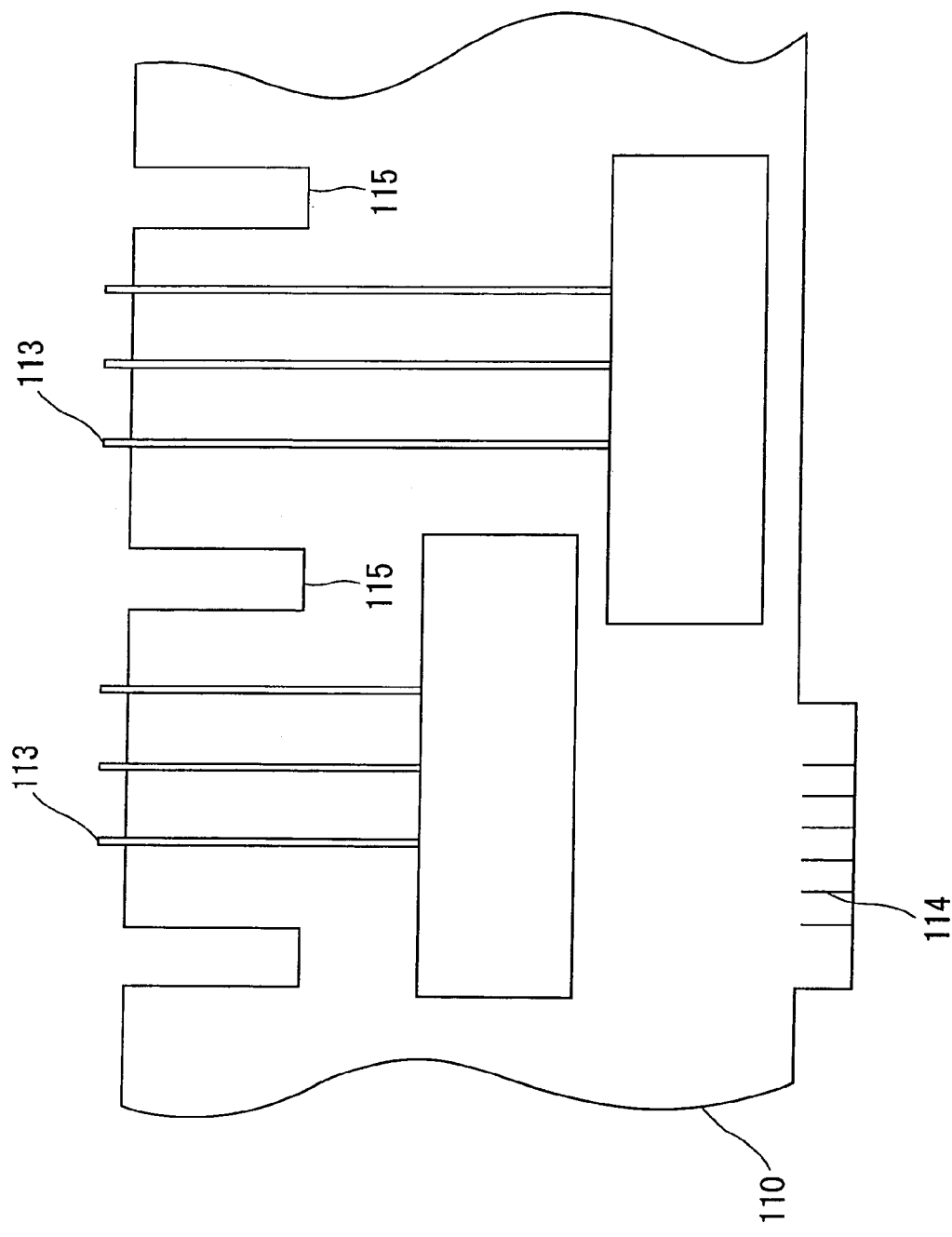
FIG. 52 is an illustration showing the connection of connecting wiring cables from two electronic devices with the pads on chips according to Embodiment 11 ditto.

FIG. 51 is an enlargement of the main part of FIG. 50. Two sets of one-axis testing circuits 110 are solidly pasted on the side surface of the positioning bar in the X direction 709-1. FIG. 52 is a front view of the one-axis test circuit 110. Each one-axis test circuit consists of a flexible film 111, an electronic device 112, a connecting wiring line 113 and an input-output line 114.

The flexible film 111 is made of a material of the same substance as the ribbon-shaped film 707 in Embodiment 8, and connecting wiring lines 113 play nearly the same role of electric connecting with probes as the copper wiring line 772. The electronic device 112 receives the test information coming from the general-purpose computer described in FIG. 4 above from the interface 75 and transmits the same to the connecting line 113. The electronic device 112, capable of securing necessary space in the vertical direction on the paper surface, can be arranged in such a way that a testing circuit may exist for a chip. FIG. 52 describes that two electronic devices 112 are connected with pads 602 on chips through the connecting wiring lines 113. However, actually one of a plurality of electronic devices 112 is connected with pads 602 on a chip substantially through the connecting wiring lines 113 described above.

Figure 53:
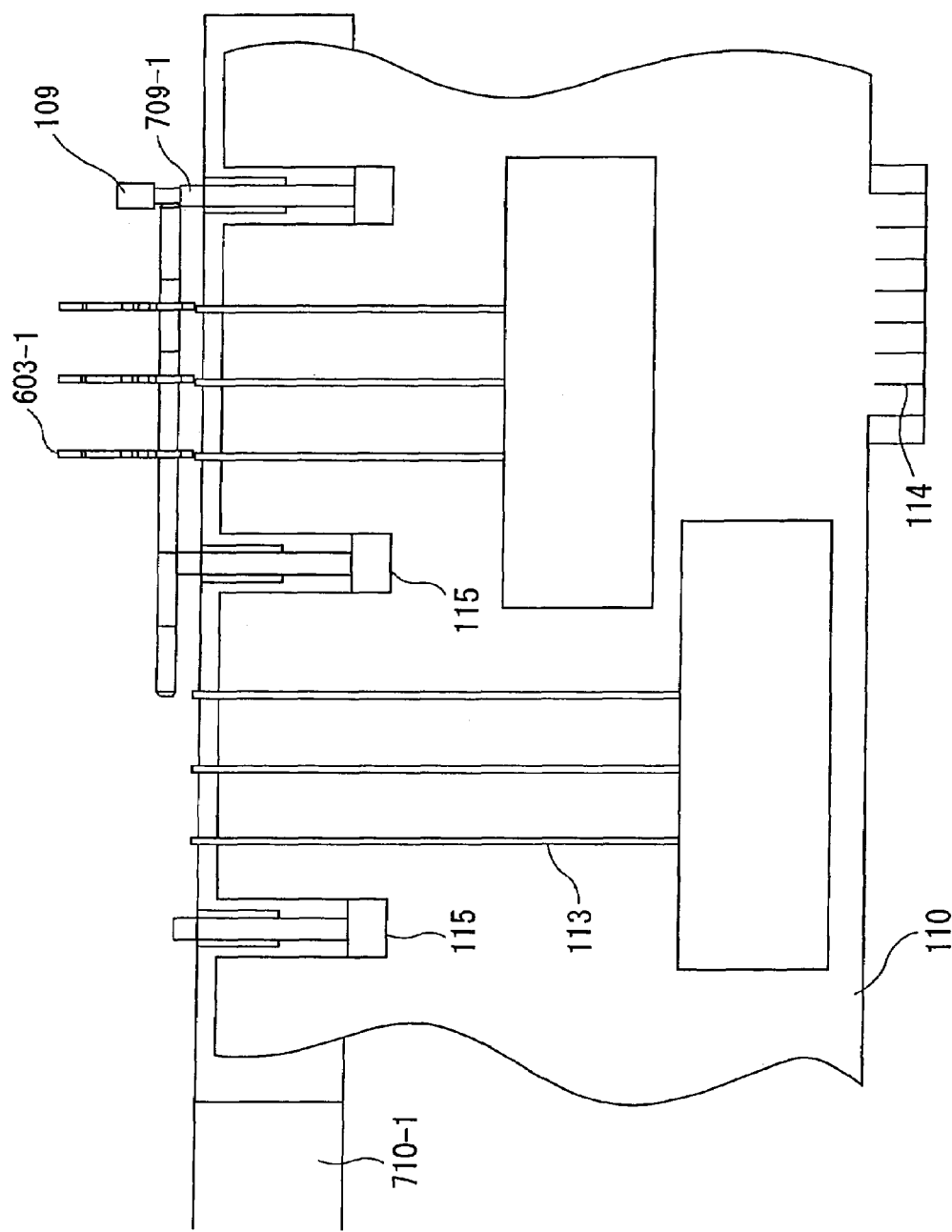
FIG. 53 is a view seen from the arrow X direction in FIG. 50.
Figure 54:
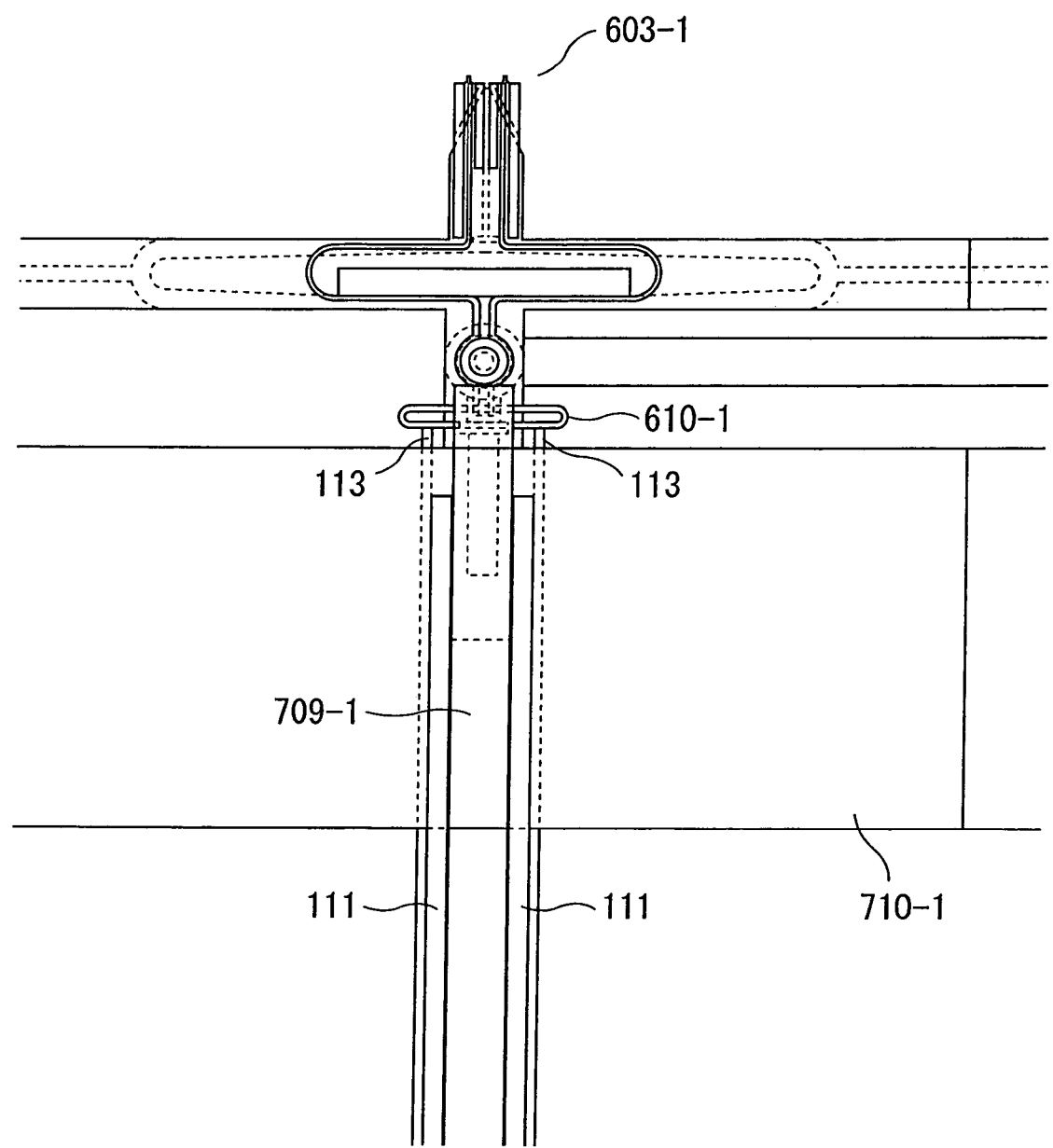
FIG. 54 is a view seen from the arrow Y direction in FIG. 50.

FIG. 53 is a view as seen from the arrow X direction of FIG. 50. FIG. 54 is a view as seen from the arrow Y direction of FIG. 50. In FIG. 51 and FIG. 53, a fixing pin 109 is inserted with pressure in a hole 791-1 cut out in the positioning bar in the X direction 709-1, and a round bar 109 is pinched and fixed between the collar of the fixing pin 109 and an end of the convex part of the positioning bar in the X direction 709-1. In the present Embodiment, the round bar 109 is arranged from one straight line direction (in this case, only from the X direction). In the embodiment described below, it will be arranged from the X and Y directions.

In FIG. 54, the connecting wiring line 113 protrudes slightly from the flexible film 111 and realizes an electric connection with an output deforming part 610-1. Notches 115 are cut out in order to avoid interference with the positioning bar in the X direction 709-1.

As described above, the present Embodiment 11 enables to build up a non-serial testing, simultaneous, en bloc and high-speed wafer testing system capable of transmitting and receiving testing signal directly to and from the testing circuits of all the pads of all the chips arranged on a wafer by maintaining the relationship of correspondence of one chip to one testing circuit.

Embodiment 12

Figure 55:
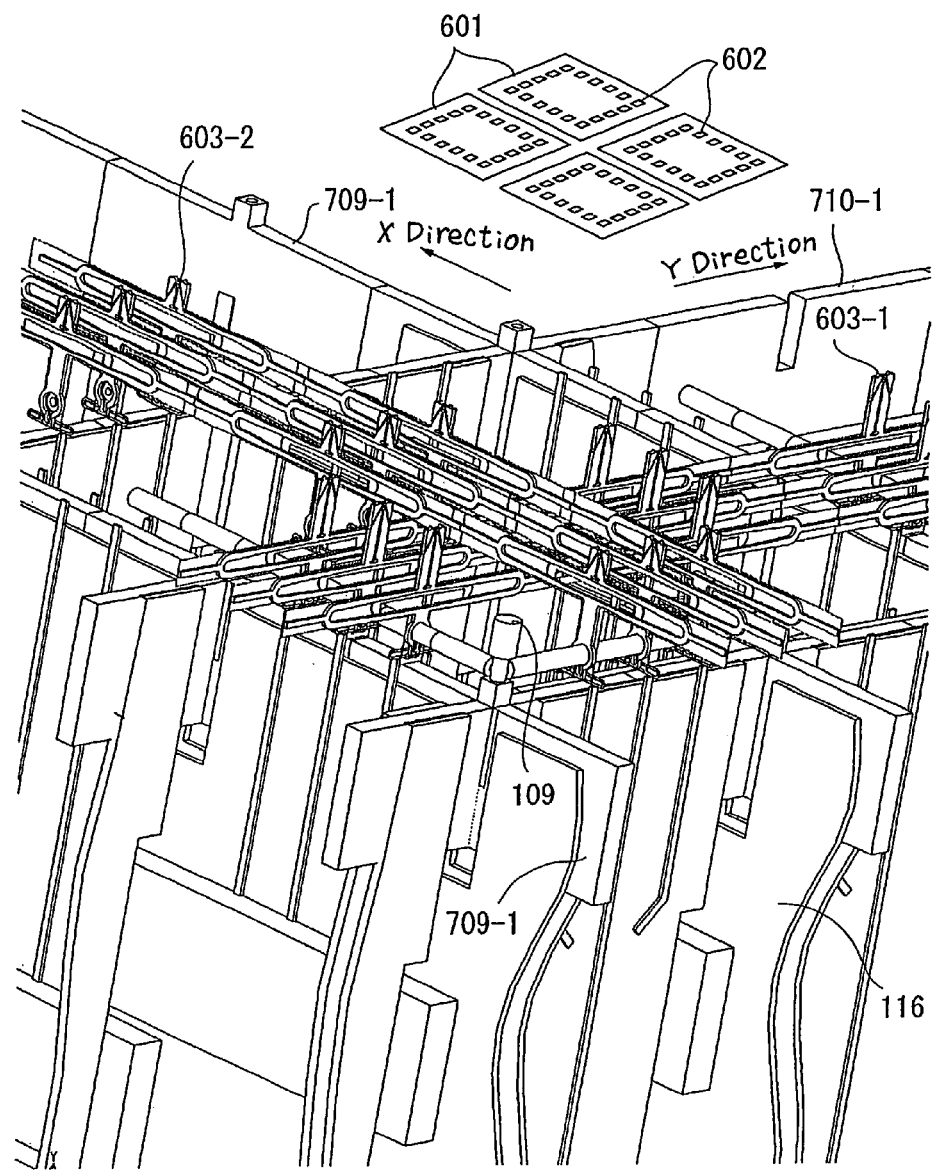
FIG. 55 is a perspective view of Embodiment 12 of the present invention.

The following is a detailed description of Embodiment 12 of the present invention with reference to drawings. The present Embodiment 12 is adapted to multiple wiring lines and to realize higher speed as a part of the system of the present invention already described in FIG. 4. FIG. 55 is a perspective view of the present Embodiment 12. For example, probes are brought into contact en bloc with pads arranged in the rectangular form such as logic-related ACIC and the like for high-speed tests.

In FIG. 55, the code 601 represents chips, 602 represents pads, and the chips 601 are arranged in multiple grid form on a wafer. The code 709-1 represents a positioning bar in the X direction, and 710-1 represents a positioning bar in the Y direction. In Embodiment 9, the form and functions of the positioning bar in the X direction 709 and the positioning bar in the Y direction 710 are described, and the positioning bar in the X direction 709-1 and the positioning bar in the Y direction 710-1 in the present Embodiment 12 have nearly same forms and functions. The positioning bar in the X direction 709-1 and the positioning bar in the Y direction 710-1 are mutually acting as a means of securing a precise positioning. A plurality of probes 603-1 are arranged in the Y direction and multiple layers of the same are arranged in the thickness direction (X direction). In reality, however, the ground line pattern 604-1 and the electric conductive part 606-3 are formed and arranged by etching, plating based on the lithography and other processing means on the film 605-1 which is a film-shaped insulating coating as described above.

The code 110 represents a one-axis testing circuit. Probes 603-2 are arranged in the Y direction and the X direction as shown in the figure like the probes 603-1 so that they may cross at the right angle with the probes 603-1. They are produced according to the method described in FIG. 26 and FIG. 27 on the method for avoiding the interference between the probes 603-1 and the probes 603-2.

Figure 56:
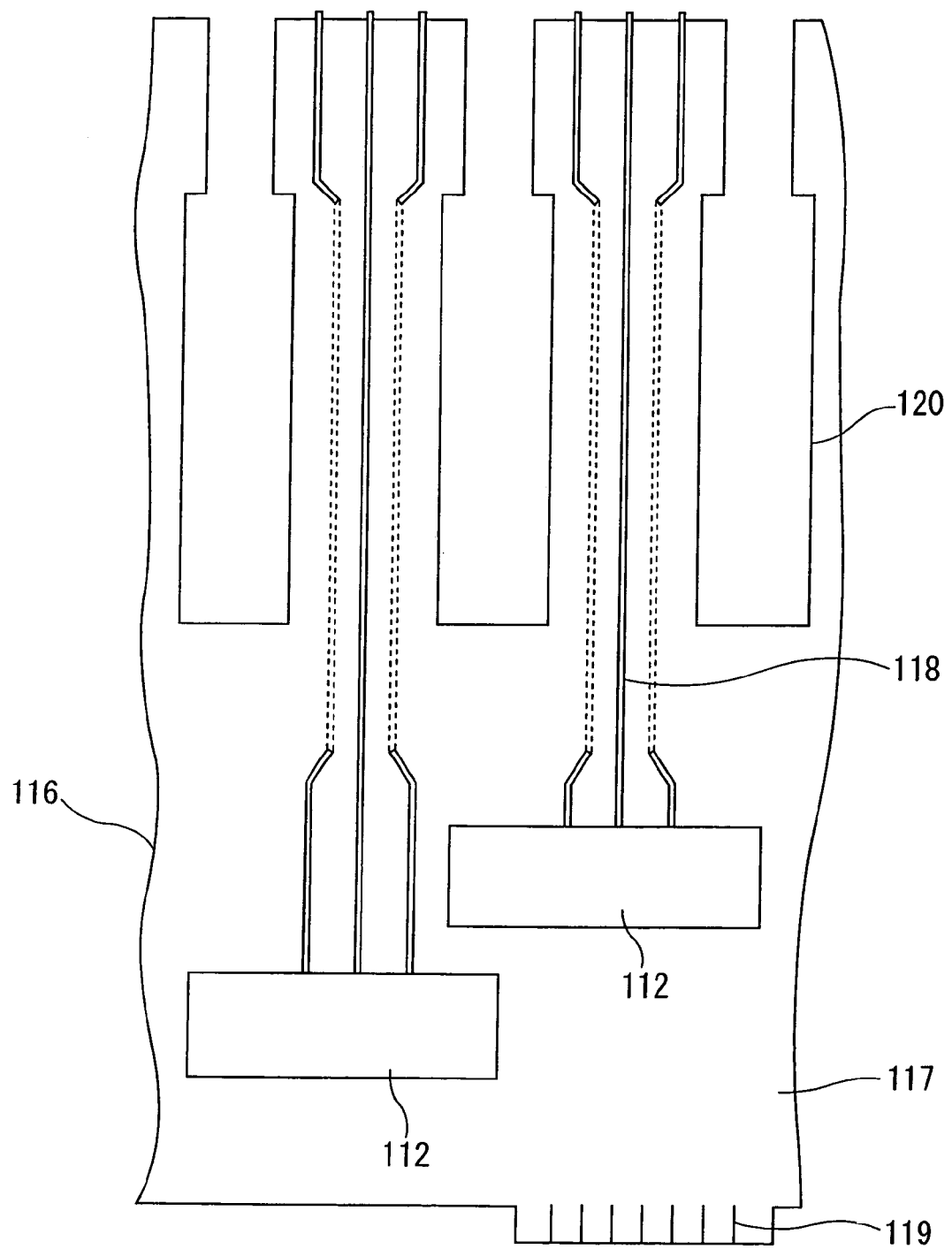
FIG. 56 is a front view of the two axis testing circuit according to Embodiment 12 ditto.

Two sets of one-axis testing circuits 110 are solidly pasted on both sides of the positioning bar in the X direction 709-1. Similarly two sets of two-axis testing circuits 116 are solidly pasted on both sides of the positioning bar in the Y direction 710-1. The two-axis testing circuit 116 is provided with notches 120 in order to avoid interference between the one-axis testing circuit 110 and the two-axis testing circuit. The one-axis testing circuit 110 is fixed by passing through this notch. FIG. 56 is a front view of the two-axis testing circuit 116, As FIG. 56 shows, the two-axis testing circuit consists of two flexible films 117, an electronic device 112, two-connecting wiring lines 118, two input-output lines 119 and notches 120.

The two-flexible films 117 are made of a material of the same substance as the ribbon-shaped film 707 in Embodiment 8, and the two-connecting wiring lines 118 plays nearly the same role of electric connecting with probes as the copper wiring line 772 and the connecting wiring lines 113. The electronic device 112 receives the test information coming from the general-purpose computer described in FIG. 4 from the interface 75 and transmits the same to the connecting line 118. The electronic device 112, capable of securing necessary space in the vertical direction on the paper surface, can be arranged in such a way that a testing circuit may exist for a chip. FIG. 52 describes that two electronic devices 112 are connected with the pads 602 on chips through the connecting wiring lines 113. However, actually one of a plurality of electronic devices 112 is connected with the pads 602 on a chip substantially through the two-connecting wiring lines 118 described above.

The main difference between the one-axis testing circuit 110 and the two-axis testing circuit is that the two-notch 120 is larger than the notch 115 in order to avoid interference with the electronic device 112. It is also that because of the larger notch, the width through which the two-connecting wire lines 118 pass is narrower. In the present Embodiment 12, as shown in FIG. 56, the part that has become narrow is dealt with by wiring on both sides of the two-flexible film so that the total sum of wiring lines on the surface and the wiring lines on the back may be equal to the total sum of the wiring lines outputted from the electronic device 112.

Figure 57:
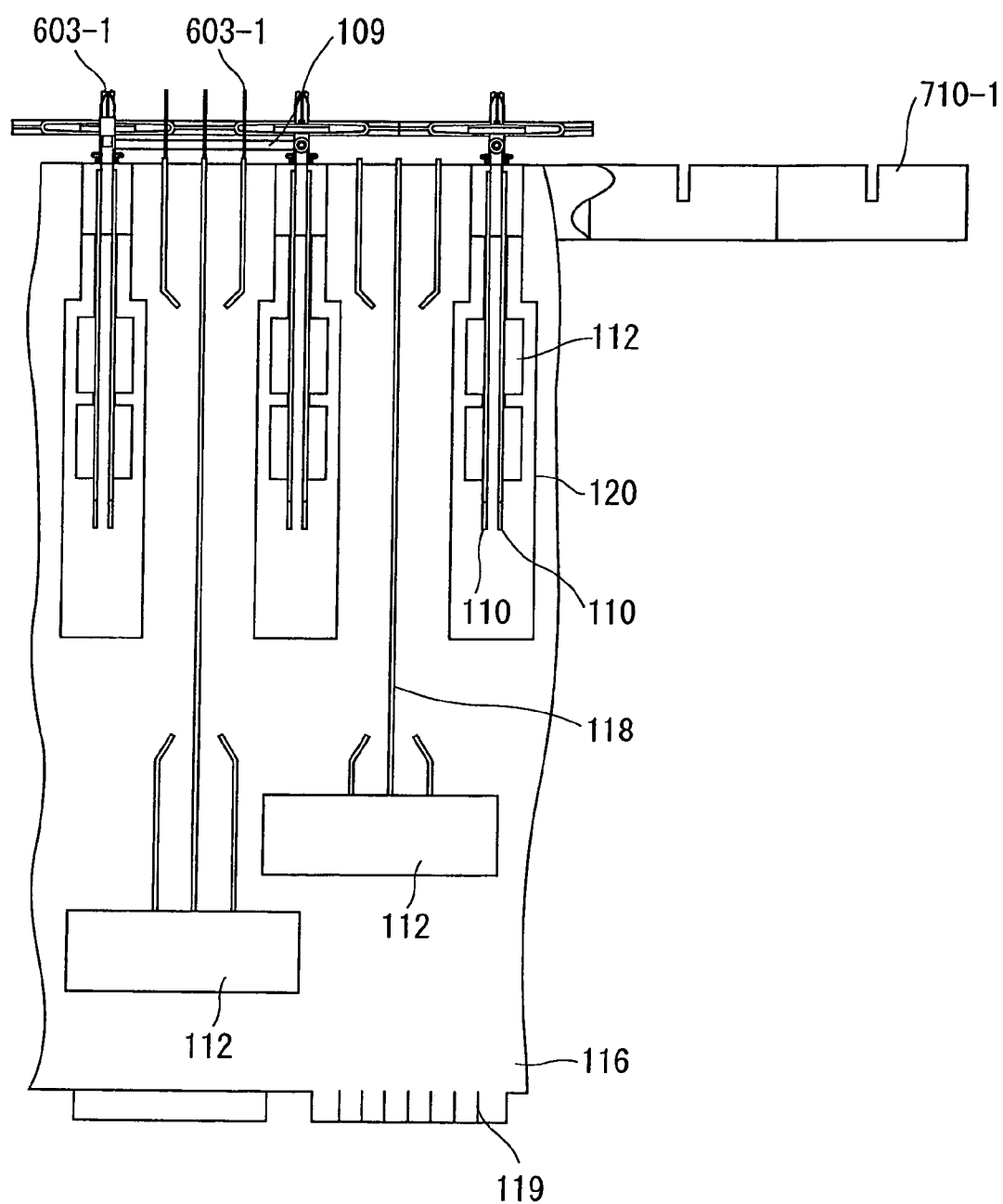
FIG. 57 is a view seen from the arrow X direction in FIG. 50.
Figure 58:
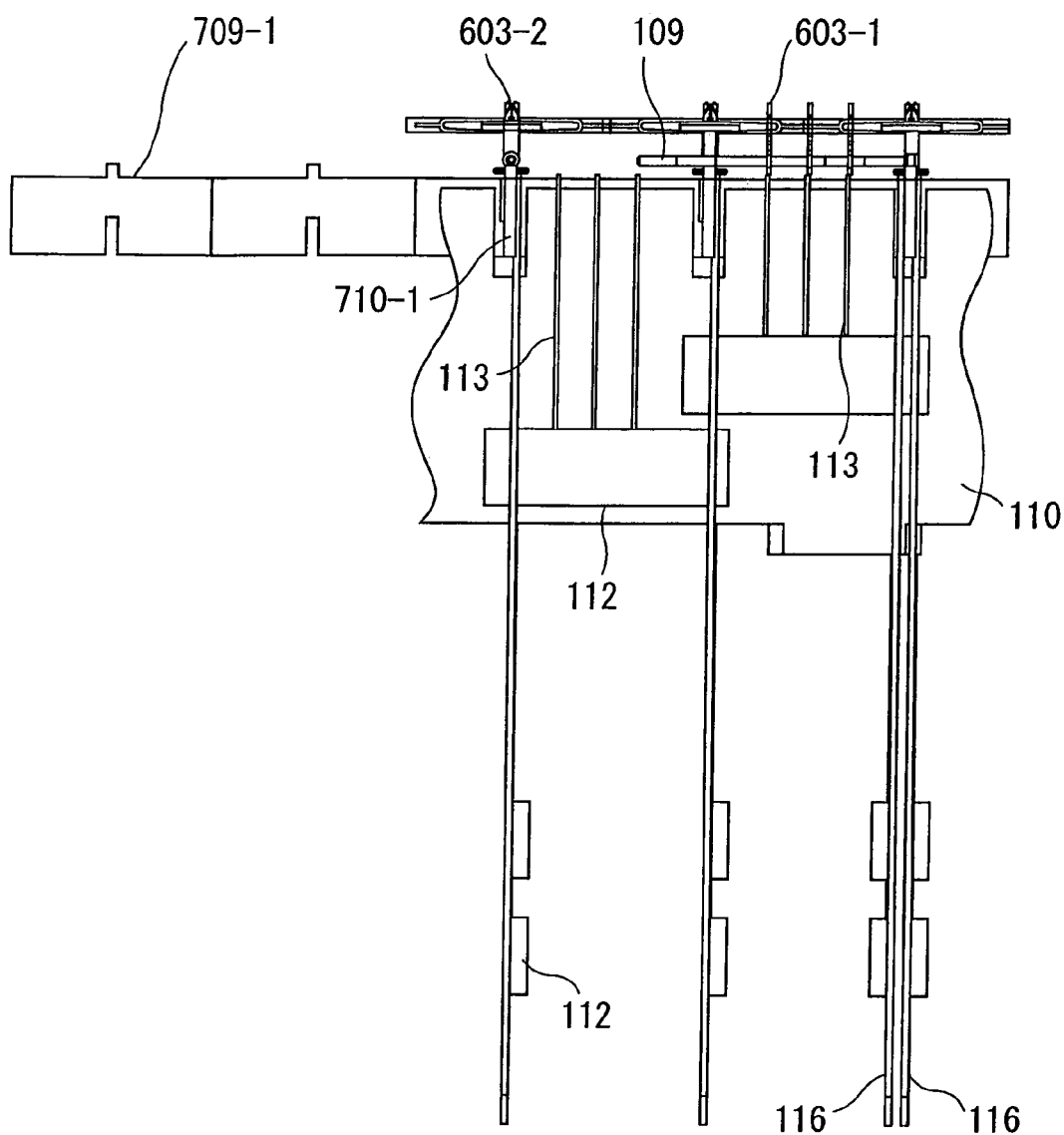
FIG. 58 is a view seen from the arrow Y direction in FIG. 50.

FIG. 57 is a view as seen from the arrow X direction of FIG. 50. FIG. 58 is a view as seen from the arrow Y direction of FIG. 50. In FIGS. 55, 57 and 58, a fixing pin 109 is inserted with pressure into a hole 791-1 cut out in the positioning bar in the X direction 709-1, and the round bar 109 is pinched and fixed between the collar of the fixing pin 109 and an end of the convex part of the positioning bar in the X direction 709-1. In the case of the present Embodiment 12, the round bar 109 is arranged from two straight line direction (in this case, only from the X direction and the Y direction). The two-connecting wiring lines 118 protrude slightly from the two-flexible film 117 and realizes electric connection with the output deforming part 610-1.

As described above, the present Embodiment 12 enables to build up a non-serial testing, simultaneous, en bloc and high-speed wafer testing system capable of transmitting and receiving directly to and from the testing circuits of all the pads of all the chips arranged in a rectangular form on a wafer by maintaining the relationship of correspondence of one chip to one testing circuit.

According to the present invention, fine vertical probes and wiring patterns can be easily processed by etching a generally used copper foil laminated resin film, and a multiple array vertical probe assembly can be easily made by combining in the grid form in the X and Y directions these units made by arranging a plurality of the resin films cut out in the ribbon shape. In this way, it will be possible to measure by probing en bloc multiple chips formed on a semiconductor wafer of a large diameter, and significant contribution can be foreseen in the field of semiconductor field with more emphasis on miniaturization as higher integration of IC chips progresses.

The present invention has been described on the basis of preferable embodiments shown in figures. However, it is obvious that any one skilled in the art can easily change or modify the present invention, and such changed or modified parts are included in the scope of the present invention. In particular, the present invention is effective when it is used for testing the circuit of a plurality of semiconductor chips formed on a semiconductor wafer in the manufacturing process of LSI and other similar electronic devices. In addition, the present invention can be used for testing the function of electronic functional elements including the circuit of a large variety of electronic devices including liquid crystals and the like.

What is claimed is:

1. A probing device for establishing electric connection between a testing device and a plurality of semiconductor chips to be tested formed on a semiconductor wafer through probes by bringing the probes into contact with the semiconductor chips to be tested, each of the chips comprising one or more pads, the device comprising:
   a plurality of sets of units in an X direction and of units in a Y direction comprising a plurality of ribbon-like resin films comprising a plurality of probes laid out together in the probing device, each probe comprising a curved part;
   wherein the plurality of sets of units in the X direction and units in the Y direction are arranged in a grid form on a supporting board to be positioned and fixed there, and the probes positioned at each crossing of the units in the X direction and the units in the Y direction are brought into contact en bloc with all the pads of the chips to be tested formed on a semiconductor wafer to carry out probing tests; and
   wherein said ribbon-shaped film in the Y direction is arranged in such a way that an end of the probe protrude from the upper side of the curved part in the longitudinal direction, the other end tails down from the lower side of the curved part and extends to the end of the ribbon-shaped film to form a wiring line, a length of protrusion of the probe is formed longer than a length of protrusion in said ribbon-shaped film in the X direction, while the resin film part has an opening cut out being encircled by the curved part.

2. The probing device according to claim 1, wherein crossing positions of the plurality of sets of units in the X direction and units in the Y direction where said probes are arranged correspond one to one with all the semiconductor chips to be tested formed on a semiconductor wafer, and the ribbon-shaped film in the X direction and the ribbon-shaped resin film in the Y direction occupy exclusive spaces at the crossing positions and do not interfere among themselves.

3. The probing device according to claim 1, wherein an arrangement of said probes arranged at each crossing position of said units in the X direction and units in the Y direction is supported by fixing means, and a pad arrangement of each semiconductor chip to be tested and the top of the probes agree.

4. The probing device according to claim 1, wherein said ribbon-shaped resin film comprises a ribbon-shaped film in the X direction and a ribbon-shaped film in the Y direction, respectively formed by a probe having a curved part created on a copper foil laminated resin film and a wiring line pattern connected thereto by etching.

5. The probing device according to claim 4, wherein a plurality of resiliently deformable contact terminals are provided for each wiring line.

6. The probing device according to claim 1, wherein said ribbon-shaped resin film is arranged in such a way that curved parts of adjacent probes may face in an opposite direction.

7. The probing device according to claim 1, wherein said ribbon-shaped film in the X direction is arranged in such a way that an end of the probe protrudes from an upper side of the curved part in a longitudinal direction, and another end tails down from the lower side of the curved part and extends to an end of the ribbon-shaped film to form a wiring line, while the resin film part has a second opening cut out being encircled by the curved part and a second opening cut out at equal intervals in the longitudinal direction for allowing the ribbon-shaped film in the Y direction to pass at the right angle.

8. The probing device according to claim 1, further comprising a plurality of square bars for supporting an arrangement of said probes arranged at each crossing position of said units in the X direction and units in the Y direction, at least one square bar comprising a convex protrusion arranged on a surface thereof, and wherein a position at which a surface in a thickness direction of the convex protrusion arranged on the surface of the at least one square bar and the ribbon-shaped films in the X direction or the ribbon-shaped films in the Y direction come into contact in order to precisely determine the position in the thickness direction of the ribbon-shaped film in the X direction and the ribbon-shaped film in the Y direction is a position at a limit of shiftability of the films.

9. A probing device for establishing electric connection between a testing device and a plurality of semiconductor chips to be tested formed on a semiconductor wafer through probes by bringing the probes into contact with the semiconductor chips to be tested, each of the chips comprising one or more pads, the device comprising:
   a plurality of sets of units in an X direction and of units in a Y direction comprising a plurality of ribbon-like resin films comprising a plurality of probes laid out together in the probing device, each probe comprising a curved part;
   wherein the plurality of sets of units in the X direction and units in the Y direction are arranged in a grid form on a supporting board to be positioned and fixed there, and the probes positioned at each crossing of the units in the X direction and the units in the Y direction are brought into contact en bloc with all the pads of the chips to be tested formed on a semiconductor wafer to carry out probing tests;
   wherein said ribbon-shaped film in the X direction is arranged in such a way that an end of the probe protrudes from an upper side of the curved part in a longitudinal direction, and another end tails down from the lower side of the curved part and extends to an end of the ribbon-shaped film to form a wiring line, while the resin film part has a first opening cut out being encircled by the curved part and a second opening cut out at equal intervals in the longitudinal direction for allowing the ribbon-shaped film in the Y direction to pass at the right angle; and
   wherein said ribbon-shaped films in the X and Y directions have spring restoring force in an axis direction of the probes by resilient deformation of a narrow width part of the resin film formed by the opening encircled by said curved part and the upper side of the resin film at the time of a test.

10. The probing device according to claim 9, wherein the unit in the Y direction passes at the right angle through the second opening of the unit in the X direction, the curved part of the unit in the X direction and the curved part of the unit in the Y direction are arranged having a difference in phase without interference in the Z axis direction, and wherein the probing device further comprises square bars for supporting the respective curved parts cross at the right angle having a difference in phase in the Z axis direction, and said respective square bars are at an equal distance from adjacent semiconductor chips to be tested.

11. A probing device for establishing electric connection between a testing device and a plurality of semiconductor chips to be tested formed on a semiconductor wafer through probes by bringing the probes into contact with the semiconductor chips to be tested, each of the chips comprising one or more pads, the device comprising:

a plurality of sets of units in an X direction and of units in a Y direction comprising a plurality of ribbon-like resin films comprising a plurality of probes laid out together in the probing device;

wherein the plurality of sets of units in the X direction and units in the Y direction are arranged in a grid form on a supporting board to be positioned and fixed there, and the probes positioned at each crossing of the units in the X direction and the units in the Y direction are brought into contact en bloc with all the pads of the chips to be tested formed on a semiconductor wafer to carry out probing tests; and wherein said units in the X direction and units in the Y direction are erected being arranged in a matrix form on the supporting board and are arranged on a plurality of props for positioning in the X direction and the Y direction linked with fixing means.

12. The probing device according to claim 11, wherein each of the probes comprises a curved part, and wherein said unit in the X direction and unit in the Y direction are arranged at the right angle having a difference in phase in a Z axis direction without interference, the curved part in the unit in the X direction and the curved part in the unit in the Y direction are arranged having a difference in phase in the Z axis direction without interference, the fixing means comprising a means of supporting the respective curved parts cross at the right angle having a difference in phase in the Z axis direction, and said respective square bars are at an equal distance from adjacent semiconductor chips to be tested.

* * * * *